(12) United States Patent
Eckhoff et al.

(10) Patent No.: US 8,985,002 B2
(45) Date of Patent: Mar. 24, 2015

(54) AIR BLAST WAVE PROTECTION

(71) Applicant: Elwha LLC, Bellevue, WA (US)

(72) Inventors: Philip Andrew Eckhoff, Kirkland, WA (US); Roderick A. Hyde, Redmond, WA (US); Muriel Y. Ishikawa, Livermore, CA (US); Jordin T. Kare, Seattle, WA (US); Lowell L. Wood, Jr., Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 0 days.

(21) Appl. No.: 14/307,396

(22) Filed: Jun. 17, 2014

(65) Prior Publication Data

US 2014/0303763 A1 Oct. 9, 2014

Related U.S. Application Data

(63) Continuation of application No. 13/135,400, filed on Jun. 30, 2011, now Pat. No. 8,725,469.

(51) Int. Cl.

| F41H 5/08 | (2006.01) |
|---|---|
| G06F 17/50 | (2006.01) |
| F41H 5/04 | (2006.01) |
| F42D 5/045 | (2006.01) |

(Continued)

(52) U.S. Cl.
CPC ............. G06F 17/50 (2013.01); B32B 37/12 (2013.01); B32B 37/182 (2013.01); F41H 5/0457 (2013.01); F42D 5/045 (2013.01)
USPC ............................ 89/36.05; 89/36.02; 89/922

(58) Field of Classification Search
USPC ............ 89/36.02, 36.05, 903, 921, 922, 923; 2/2.5, 456, 463–467
See application file for complete search history.

(56) References Cited

U.S. PATENT DOCUMENTS

| 3,771,418 A | 11/1973 | Gulbierz et al. |
| 3,962,976 A | 6/1976 | Kelsey |
| 4,534,068 A | 8/1985 | Mitchell et al. |

(Continued)

FOREIGN PATENT DOCUMENTS

WO   WO 2004/045073 A1   5/2004

OTHER PUBLICATIONS

Restriction Requirement from USPTO for U.S. Appl. No. 13/135,400, mailed Jan. 14, 2013.

(Continued)

*Primary Examiner* — Bret Hayes
*Assistant Examiner* — Joshua Freeman

(57) ABSTRACT

A method of designing a wearable air blast wave energy protection device includes computer modeling at least two candidate reflective materials for a first human-protective and primarily reflective response to a specified incident air blast wave energy. The method includes selecting a layer of a first material from the at least two candidate reflective materials based at least partially on the computer modeling of the at least two candidate reflective materials. The method includes computer modeling at least two candidate attenuative materials for a second human-protective and primarily attenuative response to the specified incident air blast wave energy transmitted through the selected layer of the first material. The method includes selecting a layer of a second material from at least two candidate attenuative materials and electronically maintaining informational data corresponding to the selected layer of the first material and the selected layer of the second material.

9 Claims, 51 Drawing Sheets

(51) Int. Cl.
B32B 37/12 (2006.01)
B32B 37/18 (2006.01)

(56) References Cited

U.S. PATENT DOCUMENTS

| | | | |
|---|---|---|---|
| 4,989,493 | A | 2/1991 | Blommer et al. |
| 5,127,105 | A | 7/1992 | Sacks |
| 6,389,594 | B1 | 5/2002 | Yavin |
| 6,425,141 | B1 | 7/2002 | Ewing et al. |
| 6,698,331 | B1 | 3/2004 | Yu et al. |
| 8,020,220 | B2 | 9/2011 | McElroy et al. |
| 8,046,845 | B1 | 11/2011 | Garcia et al. |
| 8,726,781 | B2 | 5/2014 | Eckhoff et al. |
| 8,746,123 | B2 | 6/2014 | Eckhoff et al. |
| 8,752,467 | B2 | 6/2014 | Eckhoff et al. |
| 8,752,469 | B2 | 6/2014 | Eckhoff et al. |
| 2002/0184699 | A1 | 12/2002 | Ewing et al. |
| 2008/0242984 | A1 | 10/2008 | Oakley et al. |
| 2008/0243001 | A1 | 10/2008 | Oakley et al. |
| 2009/0126557 | A1 | 5/2009 | Hunn |
| 2009/0242030 | A1 | 10/2009 | Kirschner et al. |
| 2010/0107862 | A1 | 5/2010 | Schulte |
| 2010/0269237 | A1 | 10/2010 | Ben-Zicron |
| 2012/0180627 | A1 | 7/2012 | Hunn |

OTHER PUBLICATIONS

Restriction Requirement from USPTO for U.S. Appl. No. 13/135,401, mailed Jan. 14, 2013.
Restriction Requirement from USPTO for U.S. Appl. No. 13/135,389, mailed Jun. 14, 2013.
Restriction Requirement from USPTO for U.S. Appl. No. 13/135,390, mailed Jun. 19, 2013.
Office Action from USPTO for U.S. Appl. No. 13/135,400, mailed Apr. 8, 2013.
Office Action from USPTO for U.S. Appl. No. 13/135,400, mailed Oct. 10, 2013.
Notice of Allowance from USPTO for U.S. Appl. No. 13/135,400, mailed Apr. 9, 2014.
Office Action from USPTO for U.S. Appl. No. 13/135,389, mailed Oct. 11, 2013.
Notice of Allowance from USPTO for U.S. Appl. No. 13/135,389, mailed Feb. 4, 2014.
Office Action from USPTO for U.S. Appl. No. 13/135,390, mailed Oct. 11, 2013.
Notice of Allowance from USPTO for U.S. Appl. No. 13/135,390, mailed Apr. 8, 2014.
Office Action from USPTO for U.S. Appl. No. 13/135,401, mailed Apr. 3, 2013.
Office Action from USPTO for U.S. Appl. No. 13/135,401, mailed Oct. 11, 2013.
Notice of Allowance from USPTO for U.S. Appl. No. 13/135,401, mailed Apr. 14, 2014.
Avasarala, Srikanti Rupa, "Blast Overpressure Relief Using Air Vacated Buffer Medium", bearing dates of 1007 and Jun. 2009; pp. 1-88; Massachusetts Institute of Technology.
"Ballistic Panels, Pipes & Vehicles"; printed on Dec. 28, 2010; p. 1; Trelleborg.
Bass et al.; "A Methodology for Assessing Blast Protection in Explosive Ordnance Disposal Bomb Suits"; International Journal of Occupational Safety and Ergonomics, bearing a date of 2005; pp. 347-361; vol. 11, No. 4.
Benzinger et al.; "Blast-Related Brain Injury: Imaging for Clinical and Research Applications: Report of the 2008 St. Louis Workshop"; Journal of Neurotrauma: Special Proceedings on Blast Injury; bearing a date of Dec. 2009; pp. 2127-2144; vol. 26; Mary Ann Liebert, Inc.
Cullen et al.; "Color changing photonic crystals detect blast exposure"; Science Direct; bearing a date of 2010, printed on Nov. 18, 2010; pp. 1-3; Elsevier Inc.
Fondaw, Grant W.; "Mitigation of Shock Waves in a Cylindrical Tunnel by Foam"; bearing a date of Mar. 1993; pp. 1-105, 113 pages total.
Gayda et al.; "Superalloy Foams for Aeroshell Applications"; bearing a date of Nov. 2001; pp. 1-7; 12 pages total; National Aeronautics and Space Administration.
Ibeh et al.; "Lightweight nanocomposite hierarchical structures for blast mitigation"; Plastics Research Online; bearing a date of 2009; pp. 1-3; Society of Plastics Engineers.
Ling et al.; "Explosive Blast Neurotrauma"; Journal of Neurotrauma; bearing a date of Jun. 2009; pp. 815-825; vol. 26; Mary Ann Liebert, Inc.
Mac Donald et al.; "Detection of Blast-Related Traumatic Brain Injury in U.S. Military Personnel"; The New England Journal of Medicine; bearing a date of Jun. 2, 2011; pp. 2091-2100, 41 pages total; vol. 364, No. 22; Massachusetts Medical Society.
Moss et al.; "Distinguishing realistic military blasts from firecrackers in mitigation studies of blast-induced traumatic brain injury"; PNAS Early Edition; printed on Jun. 10, 2011; p. 1; located at www.pnas.org/cgi/doi/10.1073/pnas.1101671108.
Nyein et al.; "Reply to Moss et al.: Military and medically relevant models of blast-induced traumatic brain injury vs. ellipsoidal heads and helmets"; PNAS Early Edition; printed on Jun. 10, 2011; p. 1; located at www.pnas.org/cgi/doi/10.1073/pnas.1102626108.
Ropper, Allan; "Brain Injuries from Blasts"; The New England Journal of Medicine; bearing a date of Jun. 2, 2011; pp. 2156-2157; vol. 364, No. 22; Massachusetts Medical Society.
Sriram et al.; "Blast impact response of aluminum foam sandwich composites"; Journal of Materials Science: Syntactic and Composite Foams; bearing a date of Jun. 7, 2006; vol. 41; Springer Science + Business Media, Inc.
"Syntactic Foam Blast Protection"; printed on Dec. 28, 2010; p. 1; Trelleborg.
"Technical Manual Operator's Manual for Advanced Combat Helmet (ACH)"; bearing dates of Sep. 30, 2005 and Mar. 14, 2008; Title page and p. 0002-3, 2 pages total; Department of the Army.
"Technical Note 100-1: Underwater Acoustic and Shock Absorption Performance of Syntactic Foam"; printed on Dec. 28, 2010; pp. 1-2; Cuming Corporation.
"Velocity and Acoustic Impedance Chart"; printed on Dec. 28, 2010; p. 1; StressTel.
Wadley, Haydn N. G.; "Multifunctional periodic cellular metals"; Philosophical Transactions of the Royal Society; bearing a date of Dec. 2, 2005; pp. 31-68; vol. 364; The Royal Society.
Hanssen et al.; "Close-range blast loading of aluminum foam panels"; International Journal of Impact Engineering; Received Jun. 28, 2001; pp. 593-618; Elsevier Science Ltd.

FIG. 9

310 Computer modeling at least two candidate reflective materials for a first human-protective and primarily reflective response to a specified incident air blast wave energy, the computer modeling of the at least two candidate reflective materials at least partially based on respective acoustic impedances of the at least two candidate reflective materials to the specified incident air blast wave energy, the respective acoustic impedances of the at least two candidate reflective materials each substantially mismatched to the acoustic impedance of air.

312 Computer modeling at least two candidate reflective materials for a first advantageous human-protective and primarily reflective response to a specified incident air blast wave energy, the computer modeling of the at least two candidate reflective materials at least partially based on respective acoustic impedances of the at least two candidate reflective materials to the specified incident air blast wave energy, the respective acoustic impedances of the at least two candidate reflective materials each substantially mismatched to the acoustic impedance of air.

314 Computer modeling at least two candidate reflective materials for a first human-protective and primarily reflective response to a specified incident air blast wave energy, the computer modeling of the at least two candidate reflective materials at least partially based on (i) respective acoustic impedances of the at least two candidate reflective materials to the specified incident air blast wave energy and (ii) a layer thickness of less than about 3 mm, the respective acoustic impedances of the at least two candidate reflective materials each substantially mismatched to the acoustic impedance of air.

FIG. 10

320 Selecting a layer of a first material from the at least two candidate reflective materials, the selecting based at least partially on the computer modeling of the at least two possible reflective materials.

322 Selecting a layer of a first material from the at least two candidate reflective materials, the selecting based at least partially on the computer modeling of at least two possible reflective materials and on providing an advantageous first human-protective and substantial reflective response to a specified incident air blast wave energy.

FIG. 12

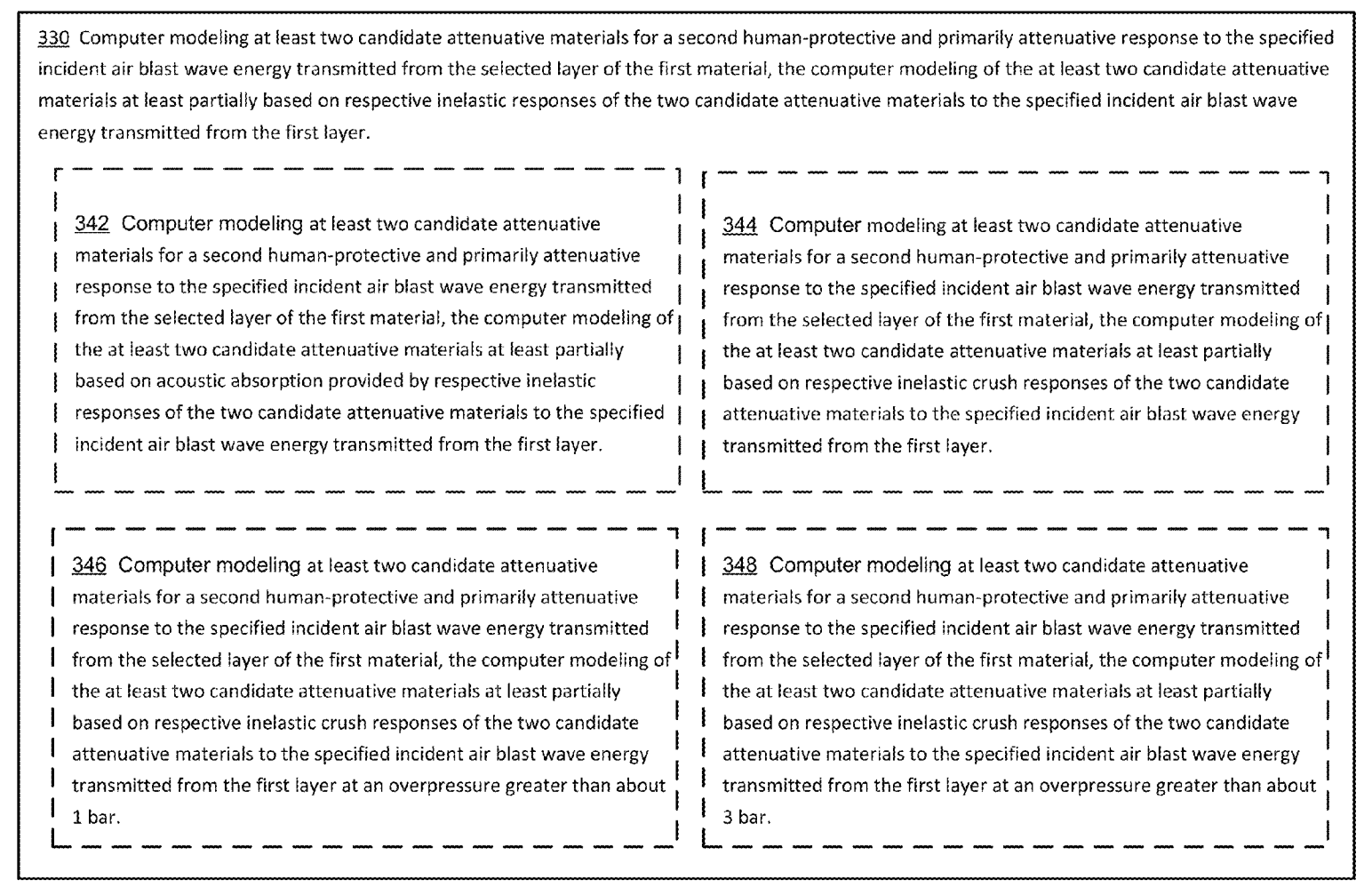

330 Computer modeling at least two candidate attenuative materials for a second human-protective and primarily attenuative response to the specified incident air blast wave energ

FIG. 13

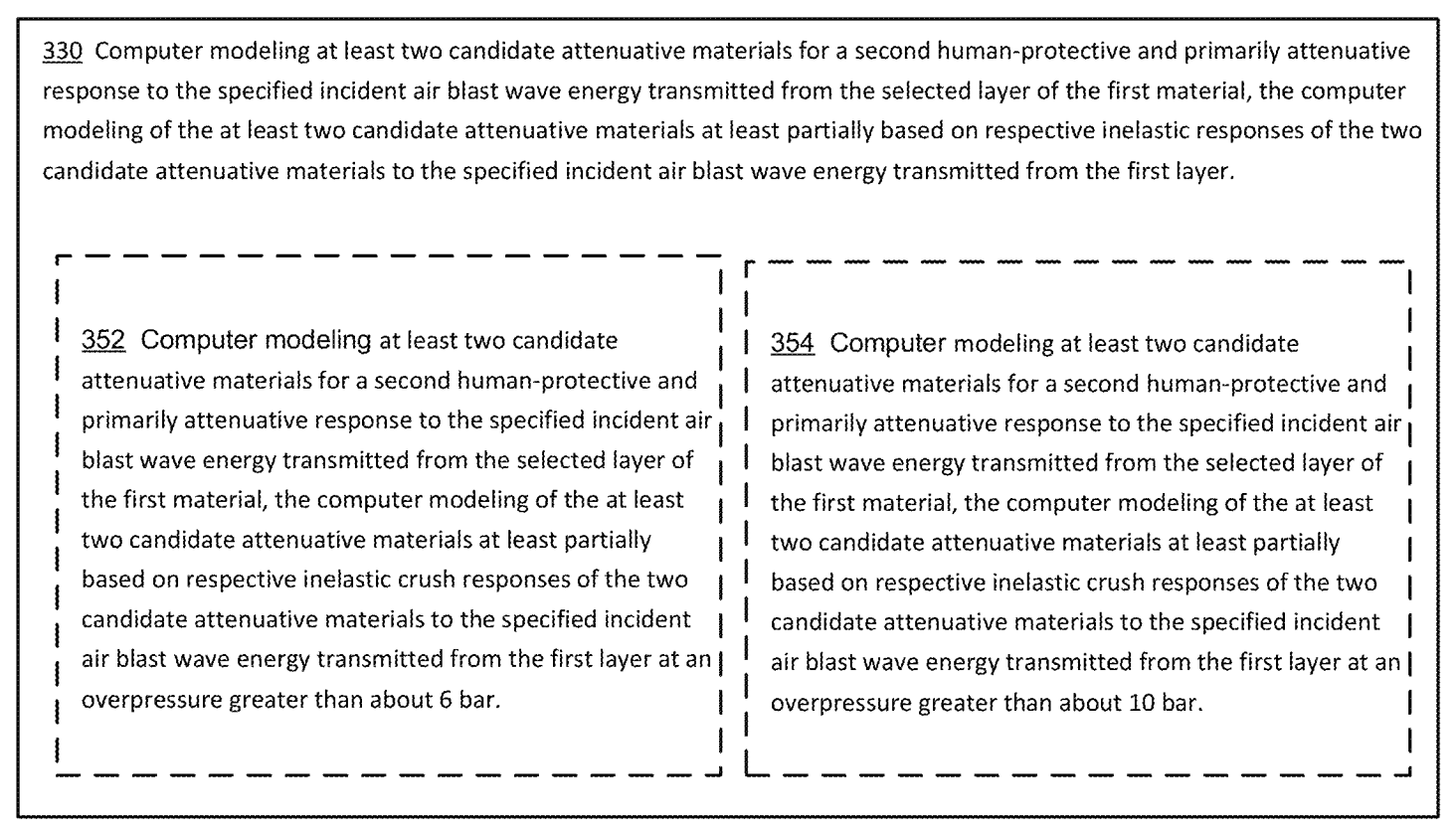

330 Computer modeling at least two candidate attenuative materials for a second human-protective and primarily attenuative response to the specified inc

FIG. 14

360 Selecting a layer of a second material from at least two candidate attenuative materials, the selecting based at least partially on the computer modeling of the at least two candidate attenuative materials.

362 Selecting a layer of a second material from the at least two candidate attenuative materials, the selecting based at least partly on the computer modeling of at least two attenuative materials and on providing an advantageous second human-protective and substantial attenuative response to the specified incident air blast wave energy transmitted from the selected layer of the first material.

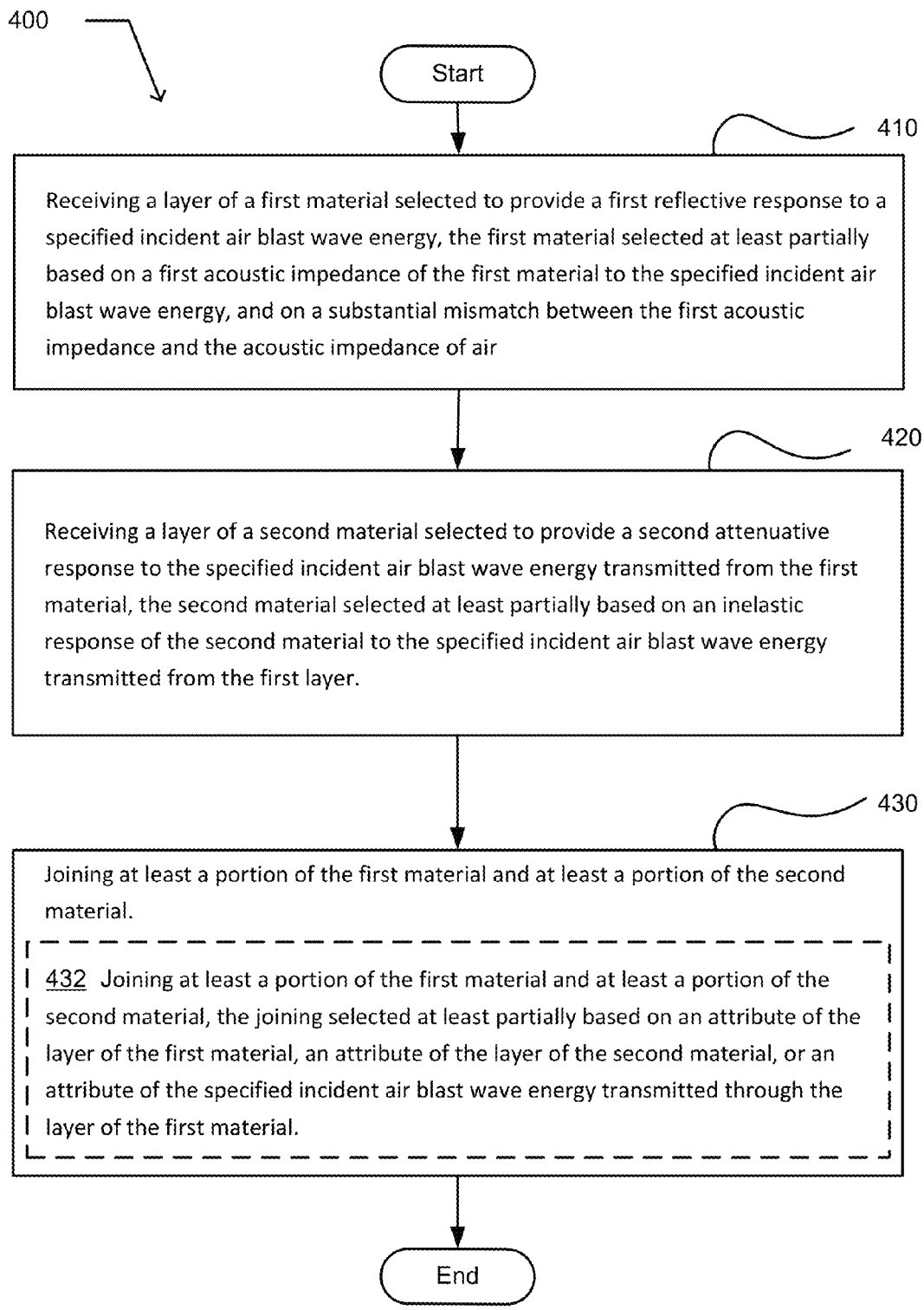

FIG. 18

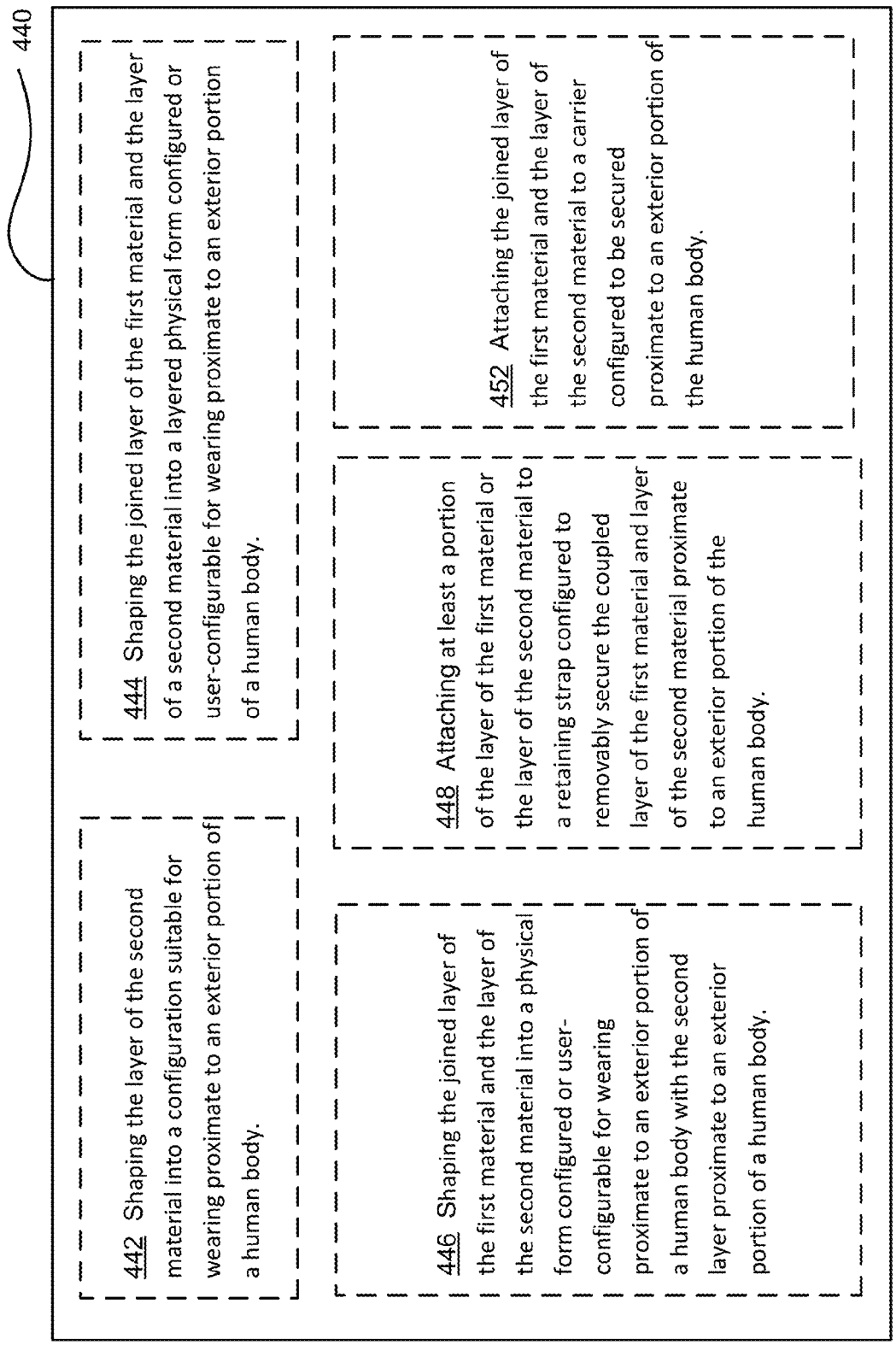

440

442 Shaping the layer of the second material into a configuration suitable for wearing proximate to an exterior portion of a human body.

444 Shaping the joined layer of the first material and the layer of a second material into a layered physical form configured or user-configurable for wearing proximate to an exterior portion of a human body.

446 Shaping the joined layer of the first material and the layer of the second material into a physical form configured or user-configurable for wearing proximate to an exterior portion of a human body with the second layer proximate to an exterior portion of a human body.

448 Attaching at least a portion of the layer of the first material or the layer of the second material to a retaining strap configured to removably secure the coupled layer of the first material and layer of the second material proximate to an exterior portion of the human body.

452 Attaching the joined layer of the first material and the layer of the second material to a carrier configured to be secured proximate to an exterior portion of the human body.

FIG. 20

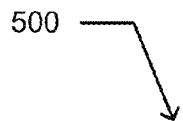

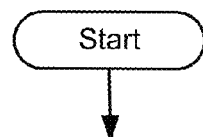 Start

510

Interposing between a blast event generating an air blast wave energy and an exterior portion of a human body
    (a) a layer of a first material positioned to initially receive a specified incident air blast wave energy, the layer of the first material shaped and configured to reflect a substantial portion of the specified incident air blast wave energy, and having (i) an acoustic impedance substantially mismatched to the acoustic impedance of air and (ii) a layer thickness less than about 3 mm; and
    (b) a layer of second material positioned to receive at least a portion of the air blast wave energy transmitted from the first material, the layer of the second material shaped and configured to attenuate a substantial portion of the specified incident air blast wave energy transmitted from the first layer utilizing an inelastic response, and shaped and configured for wearing proximate to the exterior portion of the human body,
    wherein the layer of the first material includes a front surface and a back surface, the layer of the second material includes a front surface and a back surface, and at least a portion of the back surface of the layer of the first material is proximate to at least a portion of the front surface of the layer of the second material.

520

Substantially reflecting a portion the specified incident air blast wave energy utilizing the layer of the first material.

530

Substantially attenuating at least a portion of the specified incident air blast wave energy transmitted through the layer of the first material utilizing an inelastic response of the layer of the second material.

End

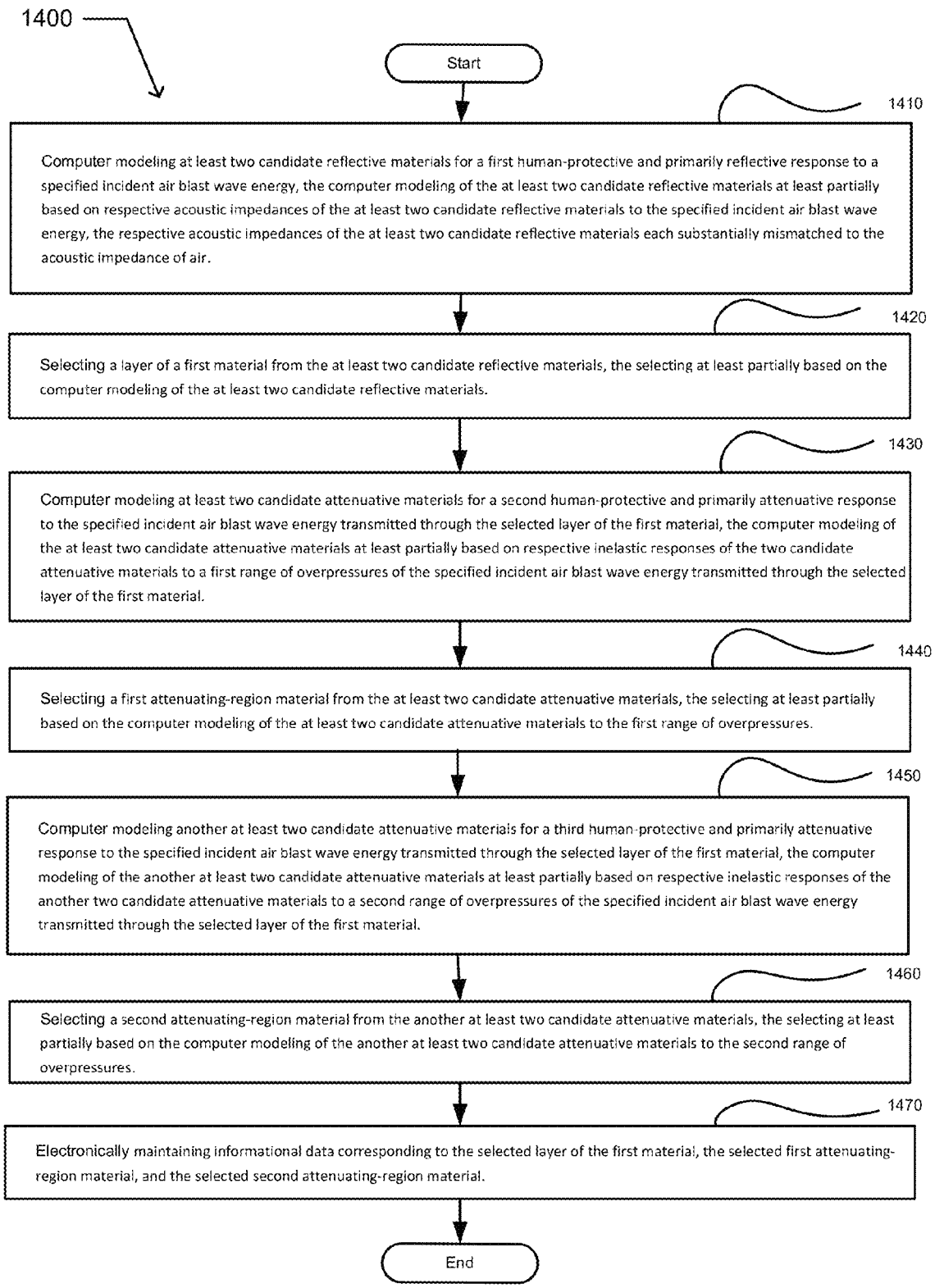

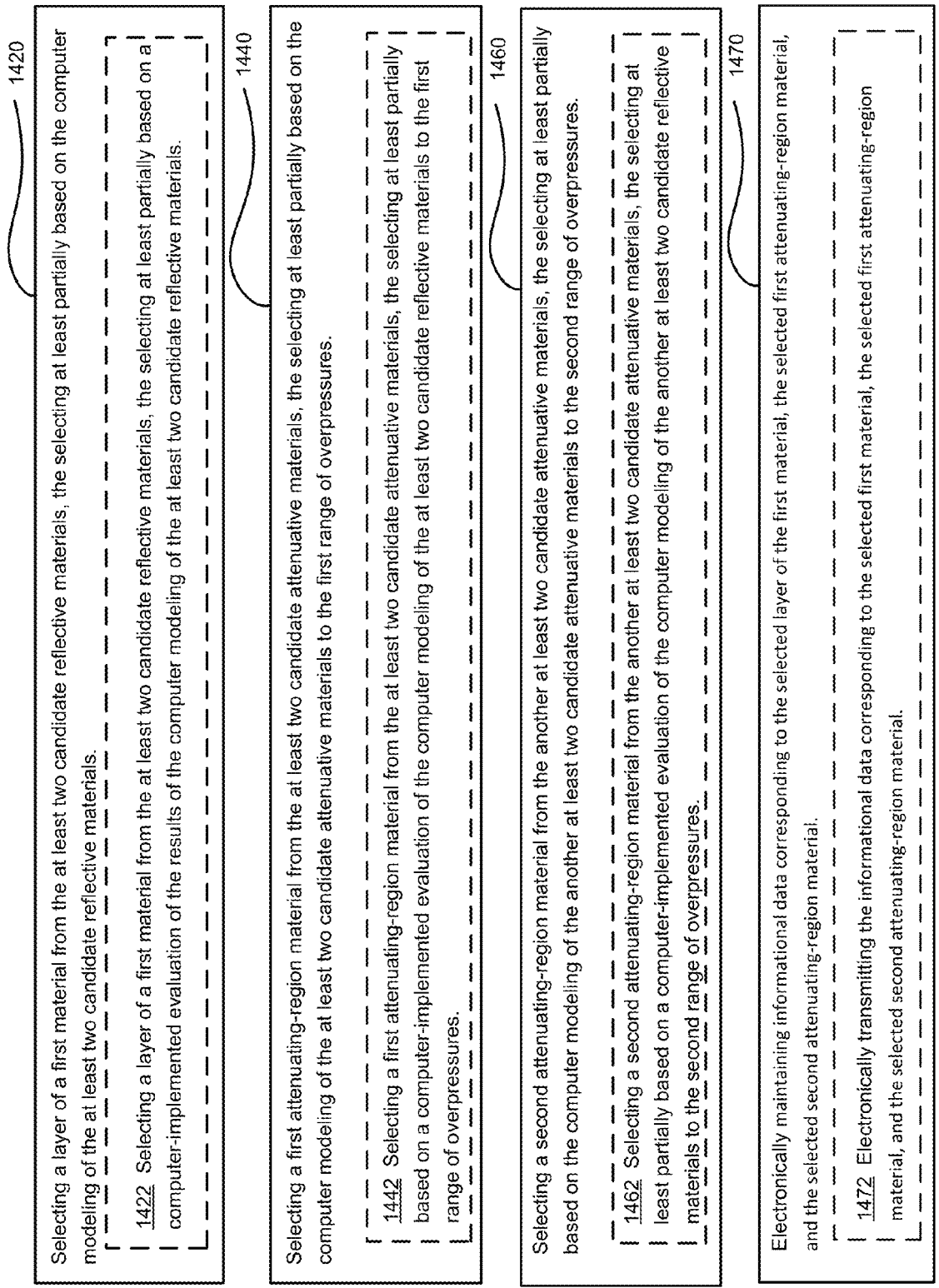

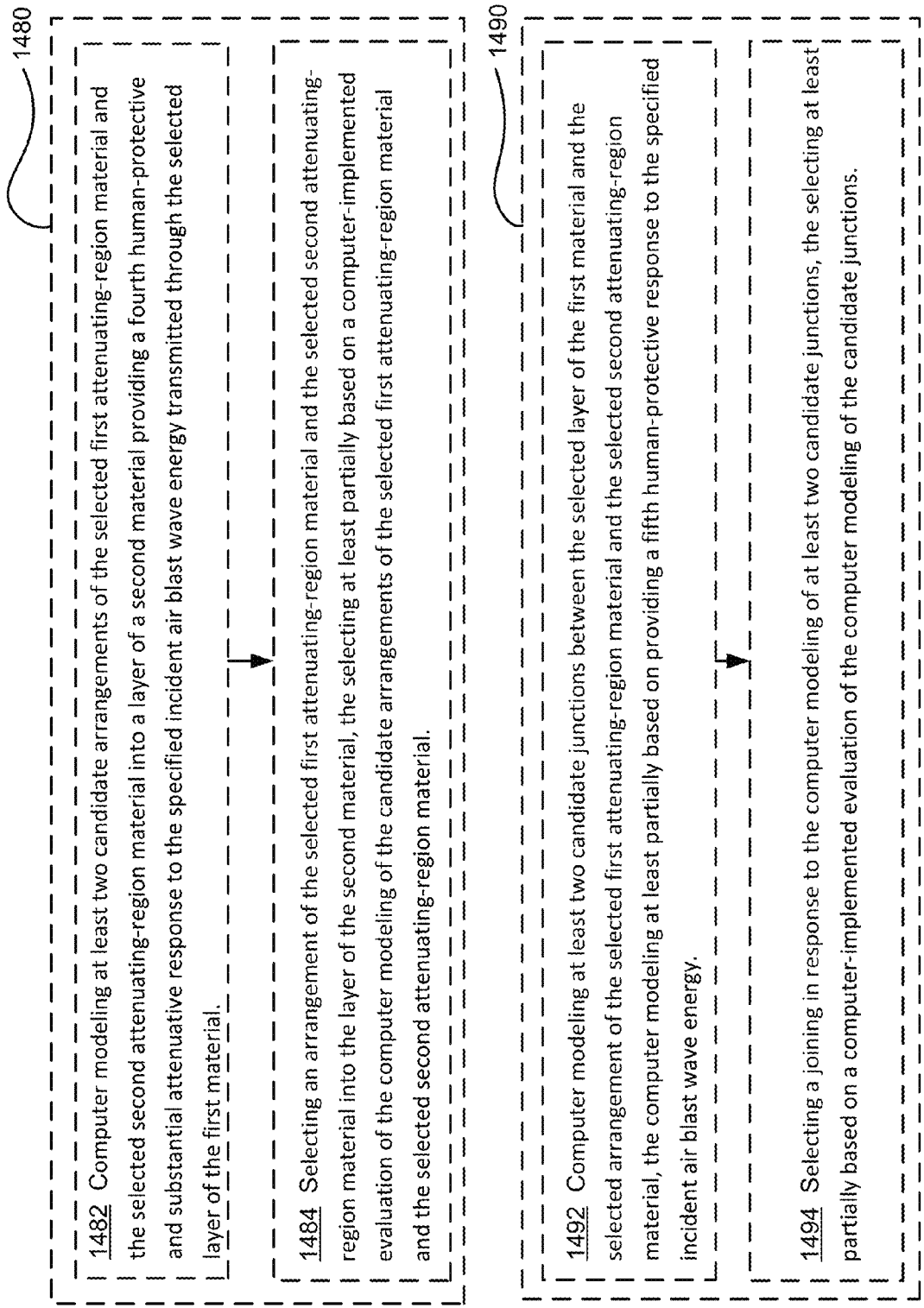

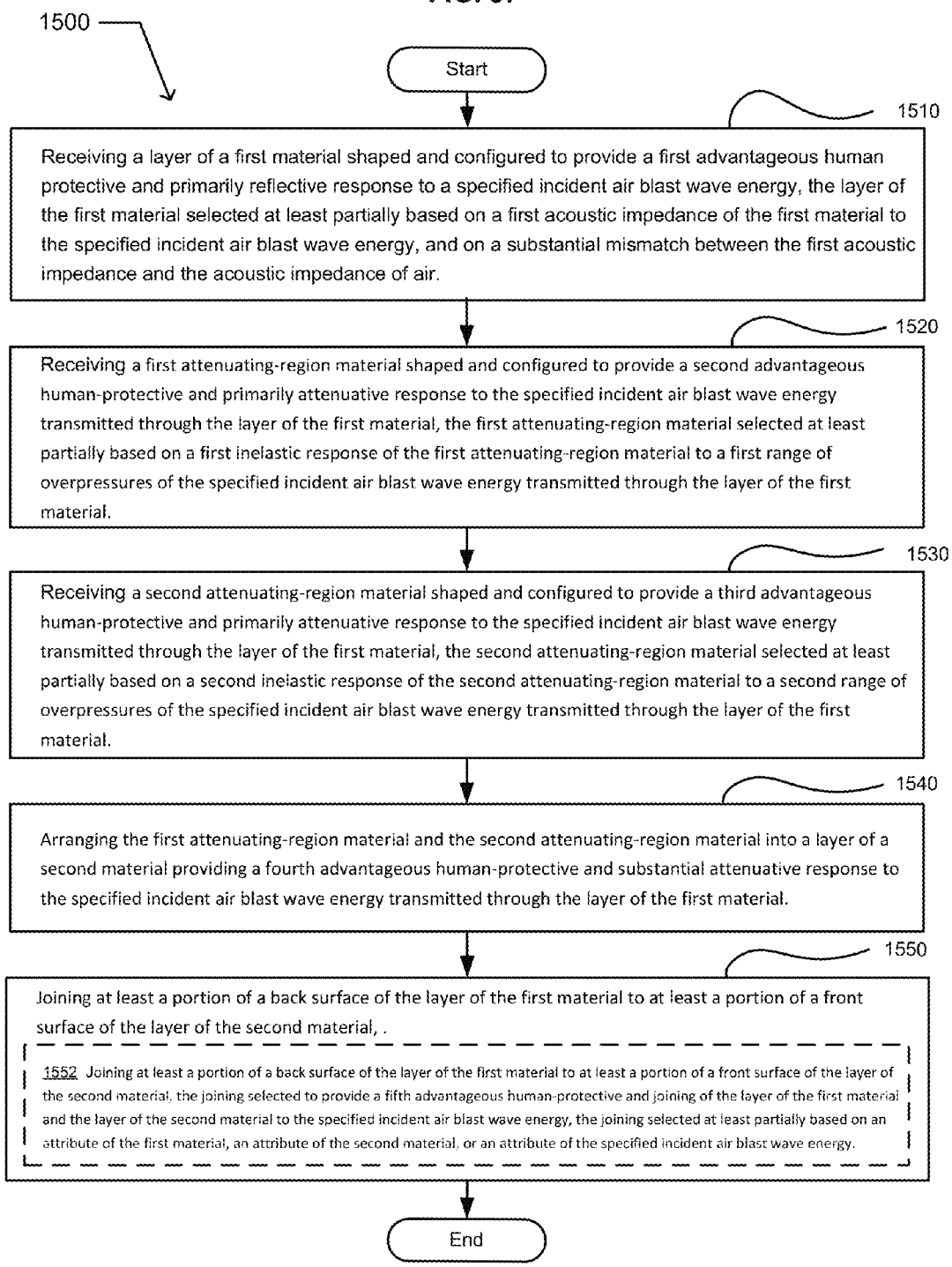

FIG. 38

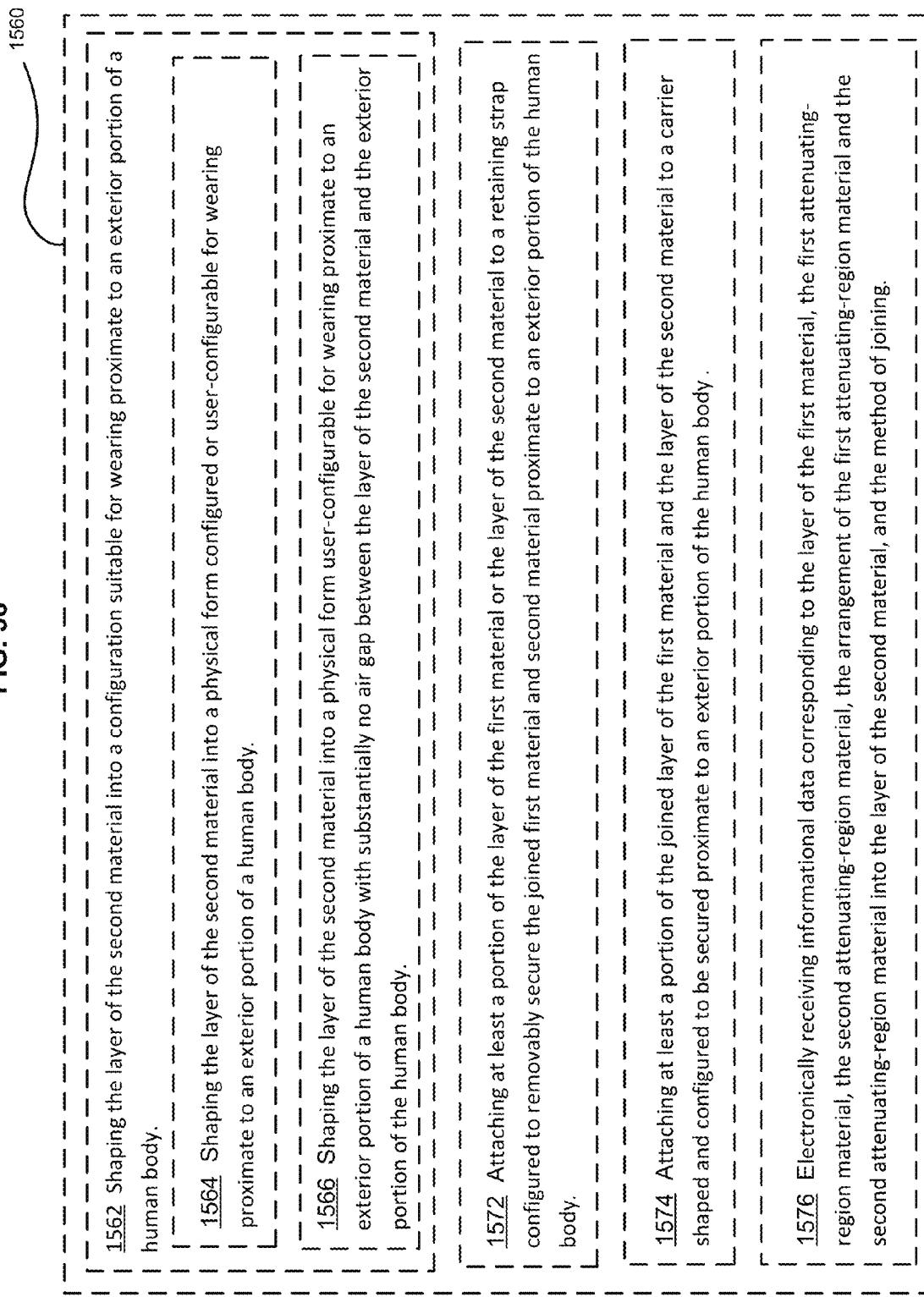

1560

1562 Shaping the layer of the second material into a configuration suitable for wearing proximate to an exterior portion of a human body.

1564 Shaping the layer of the second material into a physical form configured or user-configurable for wearing proximate to an exterior portion of a human body.

1566 Shaping the layer of the second material into a physical form user-configurable for wearing proximate to an exterior portion of a human body with substantially no air gap between the layer of the second material and the exterior portion of the human body.

1572 Attaching at least a portion of the layer of the first material or the layer of the second material to a retaining strap configured to removably secure the joined first material and second material proximate to an exterior portion of the human body.

1574 Attaching at least a portion of the joined layer of the first material and the layer of the second material to a carrier shaped and configured to be secured proximate to an exterior portion of the human body.

1576 Electronically receiving informational data corresponding to the layer of the first material, the first attenuating-region material, the second attenuating-region material, the arrangement of the first attenuating-region material and the second attenuating-region material into the layer of the second material, and the method of joining.

AIR BLAST WAVE PROTECTION

If an Application Data Sheet ("ADS") has been filed on the filing date of this application, it is incorporated by reference herein. Any applications claimed on the ADS for priority under 35 U.S.C. §§119, 120, 121, or 365(c), and any and all parent, grandparent, great-grandparent, etc., applications of such applications, are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority Applications"), if any, listed below (e.g., claims earliest available priority dates for other than provisional patent applications or claims benefits under 35 USC §119(e) for provisional patent applications, for any and all parent, grandparent, great-grandparent, etc. applications of the Priority Application(s)).

Priority Applications:

This application is a continuation of U.S. patent application Ser. No. 13/135,400, filed Jun. 30, 2011, for "Air Blast Wave Protection," which is hereby incorporated by reference in its entirety.

If the listings of applications provided above are inconsistent with the listings provided via an ADS, it is the intent of the Applicant to claim priority to each application that appears in the Domestic Benefit/National Stage Information section of the ADS and to each application that appears in the Priority Applications section of this application.

All subject matter of the Priority Applications and of any and all applications related to the Priority Applications by priority claims (directly or indirectly), including any priority claims made and subject matter incorporated by reference therein as of the filing date of the instant application, is incorporated herein by reference to the extent such subject matter is not inconsistent herewith.

BACKGROUND

The following is an excerpt from Tammie L. S. Benzinger et al., *Blast-Related Brain Injury: Imaging for Clinical and Research Applications: Report of the 2008 St. Louis Workshop*, JOURNAL OF NEUROTRAUMA 26:2127, 2129 (December 2009) (Accessed Aug. 20, 2010, at www.liebertonline com/doi/pdf/10.1089/neu.2009.0885) (citations omitted):

"It is important to have a basic understanding of the physics of blast insult prior to developing any hypothesis regarding bTBI mechanisms, countermeasures, or treatments. Understanding the processes by which a blast event ultimately inflicts stresses at the cellular and subcellular levels is also a prerequisite to the design of proper animal model testing and interpretation of results.

A blast event as considered here begins with a detonation, the nearly instantaneous combustion of a liquid or solid explosive material resulting in the generation of gaseous products at extremely high pressure and temperature (~150 k atm/~2M psi, ~3000° K). The gaseous detonation products expand rapidly into the surrounding atmosphere to about 3000-fold their original volume, and are visible as a luminous fireball. Primary fragmentation from the charge casing as well as dirt and ejecta from buried charges will be carried with the fireball expansion and are projected much further than the gaseous products. The rapid expansion of the fireball drives a shockwave into the surrounding air ahead of it. The combined violent expansion of product gases and propagated shockwave constitute the blast flow field.

The most distinctive feature of the air blast wave energy is the shock front, through which there is a nearly instantaneous change in all gas-dynamic conditions of the air (pressure, density, flow velocity, and temperature). While the air blast wave energy strength is often characterized exclusively in terms of the peak blast overpressure, it is important to note that this metric will usually refer to the static or side-on pressure above ambient levels, which does not represent the loading condition on a typical target. The static pressure is that pressure which would be sensed by a surface aligned parallel to the blastwave propagation, and hence does not experience the kinetic energy component of the flow, which may be many-fold higher than the static pressure component. If the same surface were perpendicular to the blast, it would obstruct the flow and be exposed to a much higher pressure of the reflected blast, including both the static and dynamic (kinetic energy) components. The actual stresses and waveform experienced at the cellular level will depend on the transfer function for the target, which is highly geometry- and material-dependent. These distinctions regarding the incident blast flow conditions, imparted loading, and cellular stresses have important implications with regard to the mechanisms for blast injury, as well as the proper simulation of blast in the laboratory, Whereas the static pressure profile is an important component of blast insult, it is by no means the only relevant energy component, particularly for victims within the area of the fireball, where kinetic energy of the flow is dominant.

The blast flow field exhibits energy in various modes in the hydrodynamic domain, including material flow (kinetic energy), static pressure, and internal energy (temperature). Due to the shock front, the frequency content of the incident wave is extremely high; indeed, the rate of the stress rise imparted to tissue followed by rapid relaxation may be of as much concern with regard to cellular damage as stress amplitude. Blast also can propagate energy in the electromagnetic domain, although the power spectrum is highly dependent on the device size and configuration."

FIG. 1 includes a graph 10 illustrating pressure versus time of an example air blast wave energy 195. The example blast wave represents an air blast wave energy produced by a blast event, such as a detonating high-order explosive. The graph represents time on a horizontal axis, and static or side-on pressure on a vertical axis expressed in units of overpressure $P_{SO}$, or atmospheres above or below ambient pressure. The air blast wave includes a shock front 22, which is typically traveling at a supersonic speed, is nearly vertical in its onset, and has a thickness generally estimated at less than one micron. The shock front is the leading edge of the air blast wave; it is the portion of the air blast wave transitioning from ambient atmospheric pressure to maximum overpressure. The air blast wave includes a region of overpressure 24, and a region of underpressure 26. Humans exposed to air blast waves generated by detonating high-order explosives are at risk for blast-related traumatic brain injury (bTBI), which is particularly relevant in current military engagements around the world, and which some consider the signature injury of the wars in Iraq and Afghanistan.

Air blast waves, like light, ultrasonic, and sonic waves, are reflected at boundaries where there is a difference in acoustic impedances (Z) of the materials on each side of the boundary. This difference in Z is commonly referred to as the impedance mismatch. The greater the impedance mismatch, the greater the percentage of energy that will be reflected at the interface or boundary between one medium and another. Acoustic impedance (Z) values are generally expressed or used herein in MRayls unless otherwise indicated.

The fraction of the incident wave intensity that is reflected can be derived because particle velocity and local particle pressures must be continuous across the boundary. When the acoustic impedances of the materials on both sides of the boundary are known, the fraction of the incident wave intensity that is reflected can be calculated with the equation below. The value produced is known as the reflection coefficient (R). Multiplying the reflection coefficient by 100% yields the calculated amount of energy reflected as a percentage of the original energy.

$$R=[(Z_2-Z_1)/(Z_2+Z_1)]^2$$

Since the amount of reflected energy plus the transmitted energy must equal the total amount of incident energy, the transmission coefficient is calculated by simply subtracting the reflection coefficient from one.

SUMMARY

An embodiment of the subject matter described herein includes an air blast wave protection device. The device includes a layer of a first material shaped and configured to reflect a substantial portion of a specified incident air blast wave energy. The layer of the first material has (i) an acoustic impedance substantially mismatched to the acoustic impedance of air, and (ii) a layer thickness less than about 3 mm. The device includes a layer of a second material shaped and configured to attenuate a substantial portion of the specified incident air blast wave energy transmitted through the layer of the first material utilizing an inelastic response. The layer of the first material includes a front surface and a back surface, and the layer of the second material includes a front surface and a back surface. At least a portion of the back surface of the layer of the first material is proximate to at least a portion of the front surface of the layer of the second material. In an embodiment, the device may include a label indicating use of the device is limited to a single exposure to the specified incident air blast wave energy. In an embodiment, the device may include an indicator configured to provide a human-perceivable indication that the device has been exposed to air blast wave energy. In an embodiment, the device may include a spall liner shaped and configured to restrain at least one fragment broken from of the layer of the first material by the specified incident air blast wave energy. In an embodiment, the device may include a layer of a ballistic material shaped and configured to substantially attenuate energy of an object impacting the exterior portion of the human body. In an embodiment, the device may include a retaining apparatus configured to hold the proximate layer of a first material and the layer of the second material adjacent to the exterior portion of the human body.

An embodiment of the subject matter described herein includes a method of designing a wearable air blast wave energy protection device. The method includes computer modeling is at least two candidate reflective materials for a first human-protective and primarily reflective response to a specified incident air blast wave energy. The computer modeling of the at least two candidate reflective materials is at least partially based on respective acoustic impedances of the at least two candidate reflective materials to the specified incident air blast wave energy. The respective acoustic impedances of the at least two candidate reflective materials are each substantially mismatched to the acoustic impedance of air. The method includes selecting a layer of a first material in response to the computer modeling of the at least two possible layers of reflective material. The method includes computer modeling at least two candidate attenuative materials for a second human-protective and primarily attenuative response to the specified incident air blast wave energy transmitted through the selected layer of the first material. The computer modeling of the at least two candidate attenuative materials is at least partially based on respective inelastic responses of the two candidate attenuative materials to the specified incident air blast wave energy transmitted through the selected layer of the first material. The method includes selecting a layer of a second material in response to the computer modeling of at least two candidate attenuative materials. The method includes electronically maintaining informational data corresponding to the selected layer of the first material and the selected layer of the second material. In an embodiment, the method may include computer modeling at least two candidate methods of joining the layer of the first material and the layer of the second material. The computer modeling is at least partially based on an attribute of (i) the specified incident air blast wave energy, and an attribute of either (ii) the first material relative to the specified incident air blast wave energy or (iii) the second material to the specified incident air blast wave energy. The method may include selecting an method of joining in response to the computer modeling of at least two candidate methods of joining. In an embodiment, the method may include electronically transmitting the informational data to a person or another machine.

An embodiment of the subject matter described herein includes a method of manufacturing a wearable air blast wave energy protection device. The method includes receiving a layer of a first material selected to provide a first reflective response to a specified incident air blast wave energy. The first material selected at least partially based on a first acoustic impedance of the first material to the specified incident air blast wave energy, and on a substantial mismatch between the first acoustic impedance and the acoustic impedance of air. The method includes receiving a layer of a second material selected to provide a second attenuative response to the specified incident air blast wave energy transmitted through the first material. The second material selected at least partially based on an inelastic response of the second material to the specified incident air blast wave energy transmitted through the layer of the first material. The method includes joining at least a portion of the first material and at least a portion of the second material. The joining selected at least partially based on an attribute of the layer of the first material, an attribute of the layer of the second material, or an attribute of the specified incident air blast wave energy transmitted through the layer of the first material.

In an embodiment, the method may include shaping the layer of the second material into a configuration suitable for wearing proximate to the exterior portion of the human body. In an embodiment, the method may include shaping the joined layer of the first material and the layer of a second material into a layered physical form configured or user-configurable for wearing proximate to the exterior portion of the human body. In an embodiment, the method may include shaping the joined layer of the first material and the layer of the second material into a physical form configured or user-configurable for wearing proximate to the exterior portion of the human body with the second layer proximate to the exterior portion of the human body. In an embodiment, the method may include coupling at least a portion of the layer of the first material or the layer of the second material to a retaining strap configured to removably secure the joined layer of the first material and layer of the second material proximate to the exterior portion of the human body. In an embodiment, the method may include attaching the joined layer of the first material and the layer of the second material to a carrier shaped and configured to be secured proximate to the exterior portion of the human body.

An embodiment of the subject matter described herein includes a method. The method includes interposing between a blast event generating an air blast wave energy and the exterior portion of the human body a layer of a first material positioned to initially receive a specified incident air blast wave energy, the layer of the first material is shaped and configured to reflect a substantial portion of the specified incident air blast wave energy. The layer of first material has an acoustic impedance substantially mismatched to the acoustic impedance of air and a layer thickness less than about 3 mm. The method includes interposing between the blast event generating an air blast wave energy and the exterior portion of the human body a layer of second material positioned to receive at least a portion of the air blast wave energy transmitted through the first material. The layer of the second material is shaped and configured to attenuate a substantial portion of the specified incident air blast wave energy transmitted through the layer of the first material utilizing an inelastic response, and shaped and configured for wearing proximate to the exterior portion of the human body. The layer of the first material includes a front surface and a back surface, the layer of the second material includes a front surface and a back surface, and at least a portion of the back surface of the layer of the first material is proximate to at least a portion of the front surface of the layer of the second material. In an embodiment, the method includes substantially reflecting a portion the specified incident air blast wave energy utilizing the layer of the first material. In an embodiment, the method includes substantially attenuating at least a portion of the specified incident air blast wave energy transmitted through the layer of the first material utilizing an inelastic response of the layer of the second material.

An embodiment of the subject matter described herein includes a device. The device includes a layer of a ballistic material shaped and configured to substantially attenuate energy of an object impacting a human head. The device also includes a layer of a first material shaped and configured to reflect a substantial portion of a specified incident air blast wave energy. The layer of the first material has an acoustic impedance substantially mismatched to the acoustic impedance of air and a layer thickness less than about 3 mm. The device also includes a layer of a second material shaped and configured to attenuate a substantial portion of the specified incident air blast wave energy transmitted through the layer of the first material utilizing an inelastic response, and shaped and configured for wearing proximate to the human head. In an embodiment, the layer of the ballistic material includes a front surface and a back surface, the layer of the first material includes a front surface and a back surface, and the layer of the second material includes a front surface and a back surface. At least a portion of the interior surface of the layer of the ballistic material is proximate to the front surface of the layer of the first material, and at least a portion of the back surface of the layer of the first material is proximate to at least a portion of the front surface of the layer of the second material. In an embodiment, the layer of the ballistic material includes a front surface and a back surface, the layer of the first material includes a front surface and a back surface, the layer of the second material includes a front surface and a back surface. At least a portion of the back surface of the layer of the first material is proximate to the front surface of the layer of the ballistic material, and at least a portion of the back surface of the layer of the ballistic material is proximate to at least a portion of the front surface of the layer of the second material. In an embodiment, the layer of the ballistic material includes a front surface and a back surface, the layer of the first material includes a front surface and a back surface, and the layer of the second material includes a front surface and a back surface. At least a portion of the back surface of the layer of the first material is proximate to the front surface of the layer of a second material, and at least a portion of the back surface of the layer of the second material is proximate to at least a portion of the front surface of the layer of the ballistic material.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 9 illustrates alternative embodiments of the reflection modeling operation of the operational flow 300 of FIG. 8;

FIG. 10 illustrates alternative embodiments of the reflective material selecting operation of the operational flow of FIG. 8;

FIG. 12 illustrates alternative embodiments of the attenuation modeling operation 330 of the operational flow of FIG. 8;

FIG. 13 illustrates alternative embodiments of the attenuation modeling operation 330 of the operational flow of FIG. 8;

FIG. 14 illustrates alternative embodiments of the attenuation material selecting operation of the operational flow of FIG. 8;

FIG. 17 illustrates an example operational flow in which embodiments of manufacturing a wearable air blast wave energy protection device may be implemented;

FIG. 18 illustrates alternative embodiments of the operational flow of FIG. 17;

FIG. 20 illustrates alternative embodiments of the operational flow of FIG. 19;

FIG. 34 illustrates an example operational flow;

FIG. 35 illustrates alternative embodiments of the operational flow of FIG. 34;

FIG. 36 illustrates alternative embodiments of the operational flow of FIG. 34;

FIG. 37 illustrates an example operational flow 1500;

FIG. 38 illustrates an alternative embodiment of the operational flow of FIG. 37;

DETAILED DESCRIPTION

Figure 1:
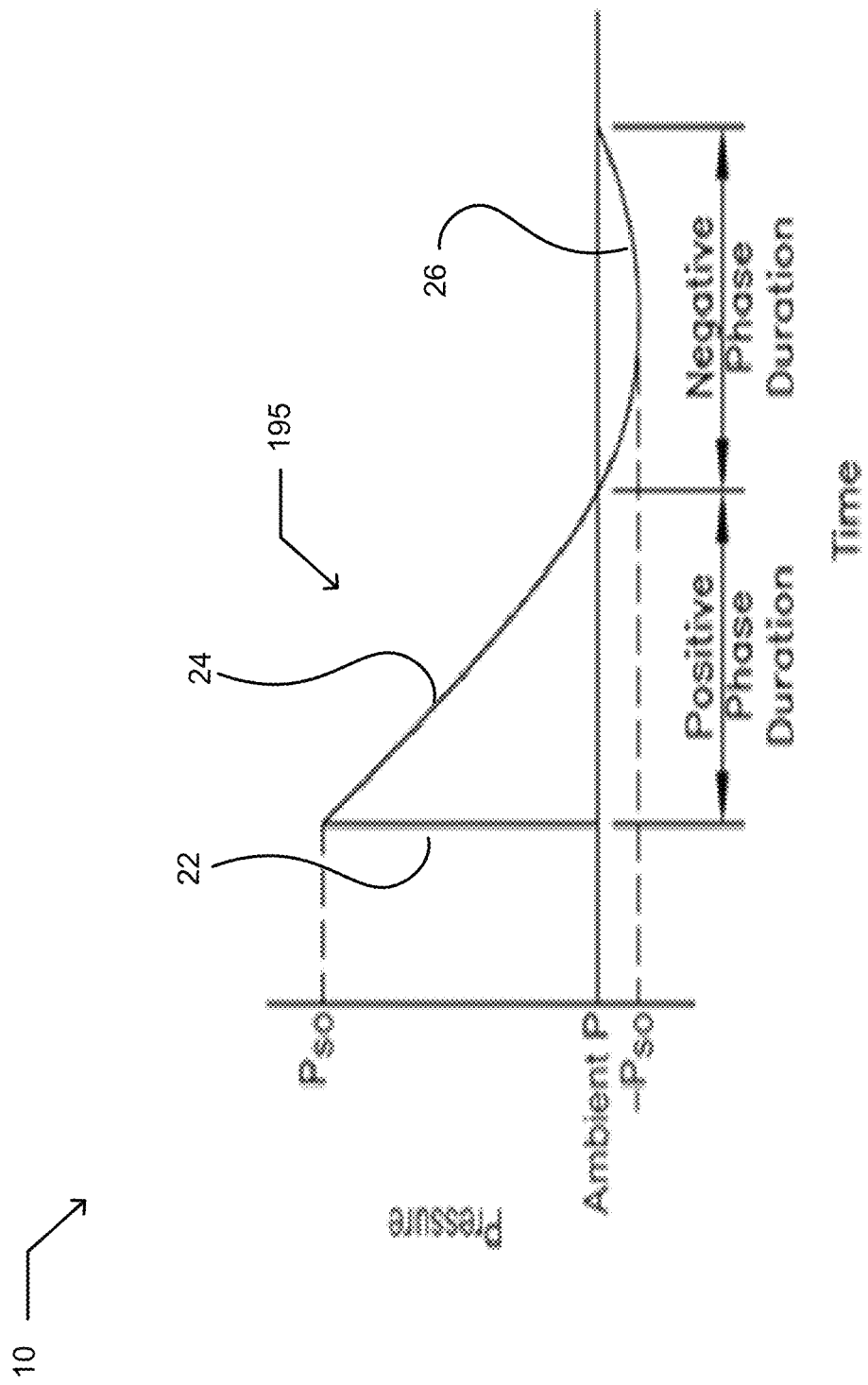
FIG. 1 includes a graph illustrating pressure vs. time of an example air blast wave energy 195.

In the following detailed description, reference is made to the accompanying drawings, which form a part hereof. In the drawings, similar symbols typically identify similar components, unless context dictates otherwise. The illustrated embodiments described in the detailed description, drawings, and claims are not meant to be limiting. Other embodiments may be utilized, and other changes may be made, without departing from the spirit or scope of the subject matter presented here.

Figure 2:
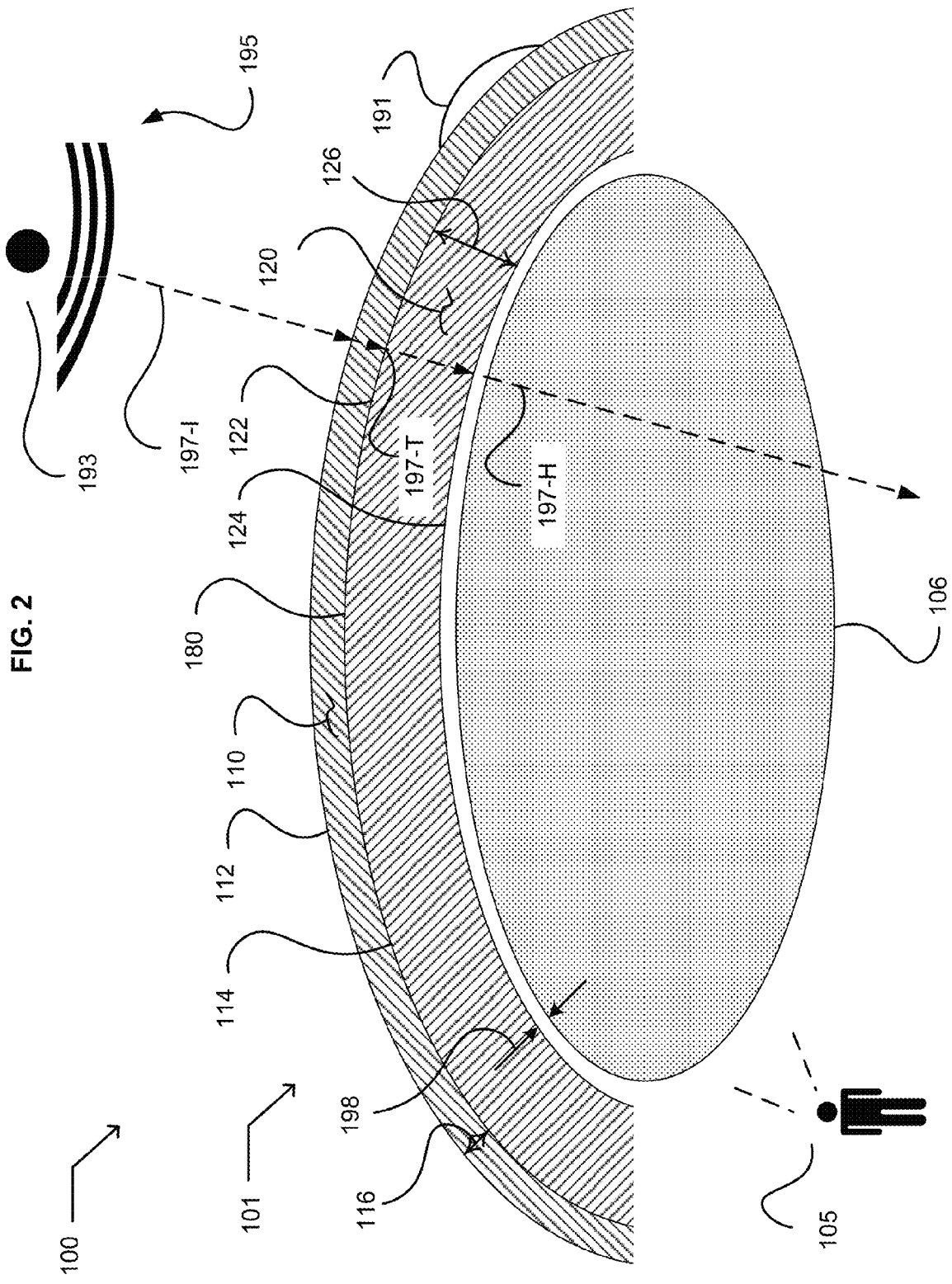
FIG. 2 illustrates an example environment in which embodiments may be implemented.

FIG. 2 illustrates an example environment 100 in which embodiments may be implemented. The environment includes a cross-sectional view of a human body 105 having an exterior body part portion 106, which may for example include a head, leg, arm, trunk, or pelvis. The environment includes a blast event 193 creating an air blast wave 195 has an energy propagating across space from the blast event and illustrated as incident air blast wave energy 197-I. For example, an air blast wave may include a shockwave originated by high explosive. For example, an air blast wave may include a range of overpressures occurring over a very short period of time. For example, an air blast wave may include an acoustic wave moving at or close to the speed of sound. For example, an incident air blast wave energy may include a wave traveling from its blast source and toward a receiving human body, such as the incident air blast wave energy 197-I traveling from the blast event 193 toward the human body 105. While the air blast wave energy 197-I is schematically illustrated by a single line in FIG. 2, in a typical combat situation the air blast wave energy will envelop most or all of the exterior body part portion of the human body, for example, such as a helmet or chest pad.

The environment illustrated includes a cross-sectional view of an air blast wave energy protection device 101. In an embodiment, the air blast wave energy protection device is wearable in a combat situation. The environment illustrated includes an air gap 198 between the exterior body part portion 106 and the device 101. In an embodiment, the air gap may be approximately zero.

The air blast wave energy protection device 101 includes a layer of a first material 110 having a thickness 116 and a layer of a second material 120 having a thickness 126. The layer of a first material is shaped and configured to reflect a substantial portion of a specified incident air blast wave energy 197-I. For example, "configured" may include designed, arranged, set up, shaped, optimized, tuned, adapted, capable of, or with a view to. For example, the specified incident air blast wave energy may be described at least in part by an overpressure, or a range of overpressures. For example, the specified incident air blast wave energy may be described at least in part by a velocity. For example, the specified incident air blast wave energy may be described at least in part by a shock front.

The layer of the first material 110 has (i) an acoustic impedance substantially mismatched to the acoustic impedance of air. The acoustic impedance of air is approximately 0.0004. In an embodiment for example, carbon fiber has a range of acoustic impedances between approximately 3.3 to 40 depending on specific structure, which in this embodiment is considered substantially mismatched to the acoustic impedance of air. In an embodiment for example, aluminum has an acoustic impedance of 17, which in this embodiment is considered substantially mismatched to the acoustic impedance of air. In an embodiment for example, zinc has an acoustic impedance of 29.6, which in this embodiment is considered substantially mismatched to the acoustic impedance of air. In an embodiment for example, steel has an acoustic impedance of 46, which in this embodiment is considered substantially mismatched to the acoustic impedance of air.

The layer thickness of the first material 110 is less than about 3 mm. In an embodiment, a layer of first material having a thickness of at least approximately the mean free path of air (0.066 microns, sometimes approximated as 1 micron) would be theoretically expected to reflect a substantial portion of the specified incident air blast wave energy 197-I. However, because the blast wave may not have point source characteristics due to irregularities in the explosive or a positioning of the explosive, or due to irregularities in the path of the air blast wave energy such as buildings or armored vehicles, in an alternative embodiment, a layer of the first material that is approximately one order of magnitude thicker (approximately 10-15 times) than the mean free path of air is expected to reflect a substantial portion of the specified incident air blast wave energy. In an embodiment, the layer of the first material may include a rigid layer of the first material. For example, a rigid layer of the first material may not be deflected by the specified air blast wave energy. For example, the rigid layer of the first material may include a rigid layer of the first material that does not substantially bend, deform, or change shape in response to the specified air blast wave energy. In an embodiment, the rigid layer of the first material may be deflected by the specified air blast wave energy. For example, the layer of the first material may include a flexible layer of the first material that substantially bends, deforms, or changes shape in response to the specified air blast wave energy. In an embodiment, the layer of the first material may include a non-rigid layer. For example, the non-rigid layer of the first material may be deflectable by the specified air blast wave energy. In an embodiment, the layer of the first material may be at least substantially destroyed by the energy of the specified air blast wave energy.

The layer of a second material 120 is shaped and configured to attenuate a substantial portion of the specified incident air blast wave energy 197-I transmitted through the layer of the first material 110. The attenuation utilizes an inelastic response to attenuate the specified incident air blast wave energy. For example, an inelastic response may include a crumpling response, a crushing response, or a plastic flow response. The portion of specified incident air blast wave energy 197-I transmitted through the layer of the first material 110 and that falls on the front surface 122 of the layer of the second material is illustrated as air blast wave energy 197-T.

For example, the air blast wave energy 197-T is the portion of the specified incident air blast wave energy 197-I that passes through the layer of the first material and is transmitted from the back surface 114 of the layer of the first material. The portion of the air blast wave energy 197-T that is transmitted through the layer of the second material 120 and toward the exterior body part portion 106 is illustrated as air blast wave energy 197-H. For example, the air blast wave energy 197-H is the portion of the air blast wave energy 197-T that passes through the layer of the second material and is transmitted from the back surface 124 of the layer of the second material. The layer of the second material is shaped and configured for wearing proximate to the exterior portion 106 of the human body 105. In an embodiment, the specified incident air blast wave energy transmitted 197-T from the layer of the first material includes that portion of the specified incident air blast wave energy 197-I transmitted across an interface formed by the proximate 180 a back surface 114 of the layer of the first material 110 and a front surface 122 of the layer of the second material 120. In an embodiment, a layer of an intermediate material (not illustrated) may be interposed between the back surface of the layer of the first material and the front surface of the layer of the second material. In such an embodiment, the specified incident air blast wave energy transmitted through the layer of the first material would include the specified incident air blast wave energy transmitted through the layer of the first material and the interposed layer.

As used herein for example, "elastic" may include capable of resuming original shape after a stretching or compression. As used herein for example, "inelastic" may include lacking elasticity or not elastic (e.g., plastic), i.e., having a shape altered after a stretching or compression. As used herein for example, attenuation "utilizing an inelastic response" may include utilizing an attenuation achieved primarily by an inelastic response with other properties of the layer of a second material supplying a significant attenuation or absorption of the specified incident air blast wave energy transmitted through the layer of the first material. As used herein for example, "utilizing an inelastic response" may include employing an inelastic response. As used herein for example, "utilizing an inelastic response" may include utilizing an inelastic transaction. An inelastic response may include for example, a plastic flow or fracture.

In the air blast wave energy protection device 101, the layer of the first material 110 includes a front surface 112 and the back surface 114, the layer of the second material 120 includes the front surface 122 and a back surface 124. At least a portion of the back surface of the layer of the first material is proximate to at least a portion of the front surface of the layer of the second material.

Figure 3:
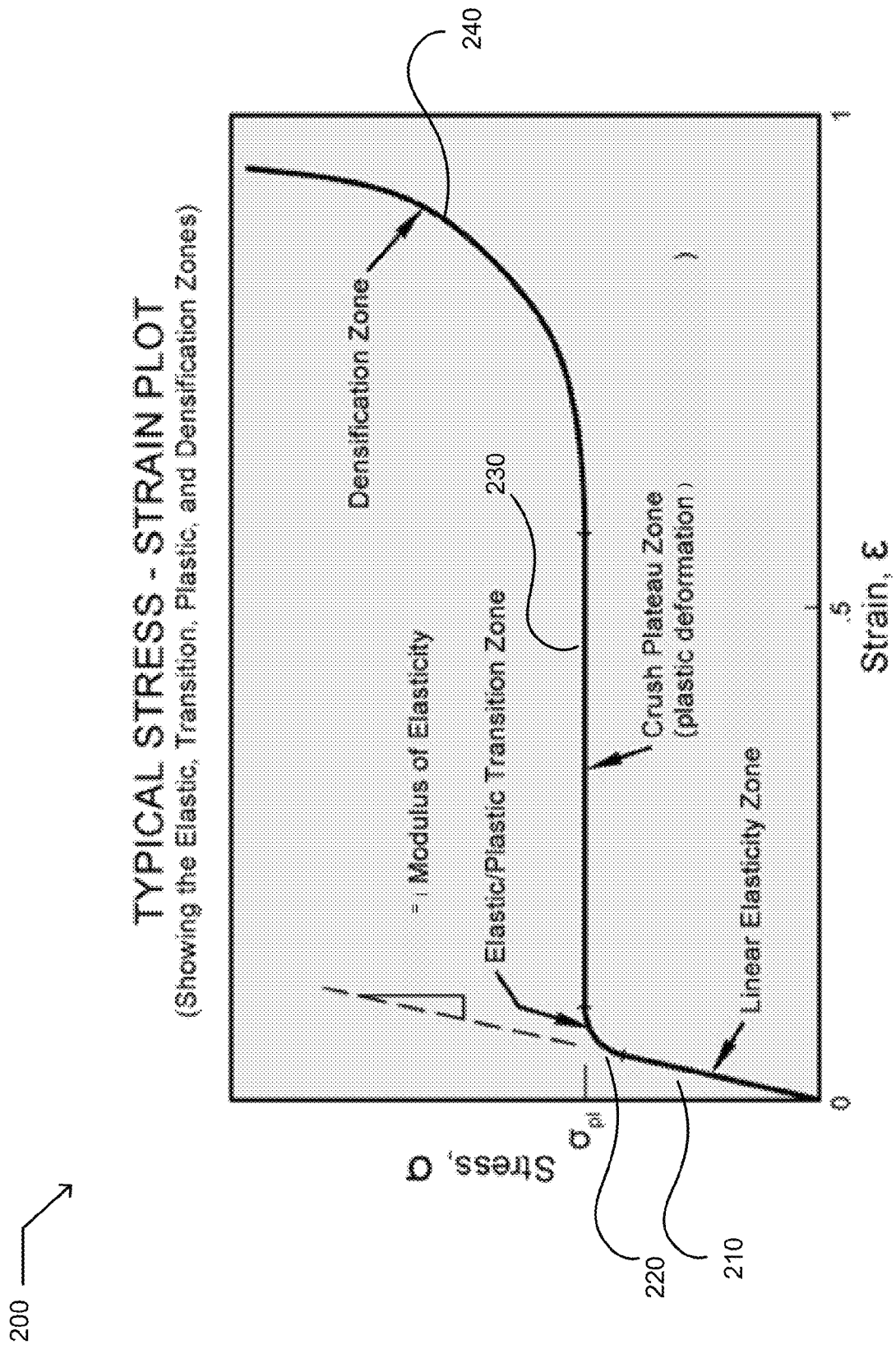
FIG. 3 illustrates a classical stress vs. strain plot for a typical material.

FIG. 3 illustrates a classical stress vs. strain plot 200 showing a linear elastic zone 210, an elastic/plastic transition zone 220, a crush plateau zone 230, and a densification zone 240 for a typical material. The initial linear elastic zone illustrates the region where a typical material is capable of resuming original shape after a stretching or compression in response to an applied elastic stress σ between 0 and $\sigma_{pl}$. The crush plateau zone (which may also be called an inelastic or plastic deformation zone) illustrates the typical material lacking elasticity or is not elastic, i.e., not capable of resuming original shape after a stretching or compression in response to an applied yield stress $\sigma_y \geq \sigma_{pl}$.

In a first phase of application of increasing stress, the typical material has an initial elastic regime illustrated by the relatively steeply rising line of the linear elasticity zone 210. In a second phase of application of increasing stress, the typical material has a plateau regime illustrated by the relatively horizontal line of the crush plateau zone 230. The load-to-crush ratio (or crush strength profile, or crush profile) remains relatively constant in the crush plateau zone. This document uses "inelastic response" to describe a response of the typical material to an applied yield stress $\sigma_y$ in the crush plateau region. As used herein for example, an "inelastic response" may include an inelastic transformation. As used herein for example, an "inelastic response" may include an inelastic crushing or an inelastic crush response. As used herein for example, an "inelastic response" may include an inelastic transaction. As used herein for example, an "inelastic response" may include an inelastic transformation. As used herein for example, an "inelastic response" may include a crushing response. As used herein for example, an "inelastic response" may include an elasto-plastic deformation. In a third phase of the application of increasing applied stress, the typical material has a regime illustrated by the increasingly vertical line of the densification zone 240. The densification zone may also reflect a "lock up regime" of a material.

Returning to FIG. 2, in an embodiment, the layer of the first material 110 includes a layer of a first material shaped and configured to reflect a substantial portion of the shock front 22 of a specified incident air blast wave energy 197-I. The shock front is illustrated in FIG. 1. In an embodiment, the layer of the first material may be demolished by the shock front and rendered at least substantially ineffective to reflect a remainder of the region of overpressure 24 of the incident air blast wave energy. In an embodiment, the layer of the first material may remain partially or substantially intact after passage of the shock front and remain effective to reflect at least a portion of the remainder of the region of overpressure 24 of the incident air blast wave energy. The layer of the first material has (i) an acoustic impedance substantially mismatched to the acoustic impedance of air, and (ii) a layer thickness 116 less than about 3 mm. In an embodiment, the layer of the first material includes a layer of a first acoustic reflective material shaped and configured to reflect a substantial portion of a specified incident air blast wave energy. The layer of the first material has (i) an acoustic impedance substantially mismatched to the acoustic impedance of air, and (ii) a layer thickness less than about 3 mm. In an embodiment, the layer of the first material includes a layer of a first material having (i) a calculated reflection coefficient to a specified incident air blast wave energy of at least 99% (99% reflected, 1% transmitted), (ii) an acoustic impedance substantially mismatched to the acoustic impedance of air, and (iii) a layer thickness less than about 3 mm. The reflection coefficient is calculated using the formula $$R=[(Z_2-Z_1)/(Z_2+Z_1)]^2$$

In an embodiment, the layer of the first material includes a layer of a first material shaped and configured to reflect at least 99% of a shock front of a specified incident air blast wave energy and having (i) an acoustic impedance substantially mismatched to the acoustic impedance of air, and (ii) a layer thickness less than about 3 mm. In an embodiment, the layer of the first material includes a layer of a first material having (i) a calculated reflection coefficient to a specified incident air blast wave energy of at least 75% (75% reflected, 25% transmitted), and (ii) a layer thickness less than about 3 mm. In an embodiment, the layer of the first material includes a layer of a first material shaped and configured to reflect at least 75% of a shock front of a specified incident air blast wave energy and having (i) an acoustic impedance substantially mismatched to the acoustic impedance of air, and (ii) a layer thickness less than about 3 mm. In an embodiment, the layer of the first material includes a layer of a first material having (i) a calculated reflection coefficient to a specified incident air blast wave energy of at least 50% (50% reflected, 50% transmitted), and (ii) a layer thickness less than about 3 mm. In an embodiment, the layer of the first material includes a layer of a first material shaped and configured to reflect at least 50% of a shock front of a specified incident air blast wave energy and having (i) an acoustic impedance substantially mismatched to the acoustic impedance of air, and (ii) a layer thickness less than about 3 mm. In an embodiment, the layer of the first material includes a layer of a first material having (i) a calculated reflection coefficient to a specified incident air blast wave energy of at least 25%, and (ii) a layer thickness less than about 3 mm. In an embodiment, the layer of the first material includes a layer of a first material shaped and configured to reflect at least 25% of a shock front of a specified incident air blast wave energy and having (i) an acoustic impedance substantially mismatched to the acoustic impedance of air, and (ii) a layer thickness less than about 3 mm. In an embodiment, the layer of the first material includes a layer of a first material having (i) a calculated reflection coefficient to a specified incident air blast wave energy of at least 10%, and (ii) a layer thickness less than about 3 mm. In an embodiment, the layer of the first material includes a layer of a first material shaped and configured to reflect at least 10% of a shock front of a specified incident air blast wave energy and having (i) an acoustic impedance substantially mismatched to the acoustic impedance of air, and (ii) a layer thickness less than about 3 mm. In an embodiment, the layer of the first material includes a layer of a first material having (i) a calculated reflection coefficient to a specified incident air blast wave energy of at least 5%, and (iii) a layer thickness less than about 3 mm. In an embodiment, the layer of the first material includes a layer of a first material shaped and configured to reflect at least 5% of a shock front of a specified incident air blast wave energy and having (i) an acoustic impedance substantially mismatched to the acoustic impedance of air, and (ii) a layer thickness less than about 3 mm.

In an embodiment, the layer of the first material 110 includes a layer of a first material shaped and configured to reflect a substantial portion of a frequency spectrum or profile of the specified incident air blast wave energy 197-I. The layer of the first material has (i) an acoustic impedance substantially mismatched to the acoustic impedance of air, and (ii) a layer thickness less than about 3 mm. In an embodiment, the layer of the first material includes a layer of a first material shaped and configured to reflect a substantial portion of a specified incident combat high explosive air blast wave energy. The layer of the first material has (i) an acoustic impedance substantially mismatched to the acoustic impedance of air, and (ii) a layer thickness less than about 3 mm.

In an embodiment, the layer of the first material 110 includes a layer of a first material shaped and configured to reflect a substantial portion of a specified incident air blast wave energy 197-I. The layer of the first material has (i) an acoustic impedance substantially mismatched to the acoustic impedance of air, and (ii) a layer thickness 116 less than about 2 millimeters. In an embodiment, the layer of the first material includes a layer of a first material shaped and configured to reflect a substantial portion of a specified incident air blast wave energy. The layer of the first material has (i) an acoustic impedance substantially mismatched to the acoustic impedance of air, and (ii) a layer thickness less than about 1.5 millimeters. In an embodiment, the layer of the first material includes a layer of a first material shaped and configured to reflect a substantial portion of a specified incident air blast wave energy. The layer of the first material has (i) an acoustic impedance substantially mismatched to the acoustic impedance of air, and (ii) a layer thickness less than about 1.0 millimeters. In an embodiment, the layer of the first material includes a layer of a first material shaped and configured to reflect a substantial portion of a specified incident air blast wave energy. The layer of the first material has (i) an acoustic impedance substantially mismatched to the acoustic impedance of air, and (ii) a layer thickness less than about 500 microns. In an embodiment, the layer of the first material 110 includes a layer of a first material shaped and configured to reflect a substantial portion of a specified incident air blast wave energy. The layer of the first material has (i) an acoustic impedance substantially mismatched to the acoustic impedance of air, and (ii) a layer thickness less than about 100 microns. In an embodiment, the layer of the first material includes a layer of a first material shaped and configured to reflect a substantial portion of a specified incident air blast wave energy. The layer of the first material has (i) an acoustic impedance substantially mismatched to the acoustic impedance of air, and (ii) a layer thickness less than about 10 microns.

In an embodiment, the layer of the first material 110 includes a layer of a first material shaped and configured to reflect a substantial portion of a specified incident air blast wave energy 197-I. The layer of the first material has (i) an acoustic impedance substantially mismatched to the acoustic impedance of air, and (ii) a layer thickness minimized to a minimum thickness providing a selected level of reflection of the specified incident air blast wave energy. In an embodiment for example, the layer thickness of the layer of the first material is minimized while achieving a selected level of reflection of the specified incident air blast wave energy, such as a −3 db or −5 db level of reflection of the specified incident air blast wave energy. For example, the layer thickness of the first material may be minimized to a thickness that is approximately one order of magnitude thicker (approximately 10-15 times) than the mean free path of air is expected to reflect a substantial portion of the specified incident air blast wave energy. In an embodiment, the layer of the first material includes a layer of a first material includes (a) a first reflective-region shaped and configured to reflect a substantial portion of a specified incident air blast wave energy. The first reflective-region has (i) an acoustic impedance substantially mismatched to the acoustic impedance of air, and (ii) a layer thickness less than about 3 millimeters. The layer of the first material includes (b) a substrate region (not illustrated) shaped and configured to physically support the first reflective-region.

Figure 4:
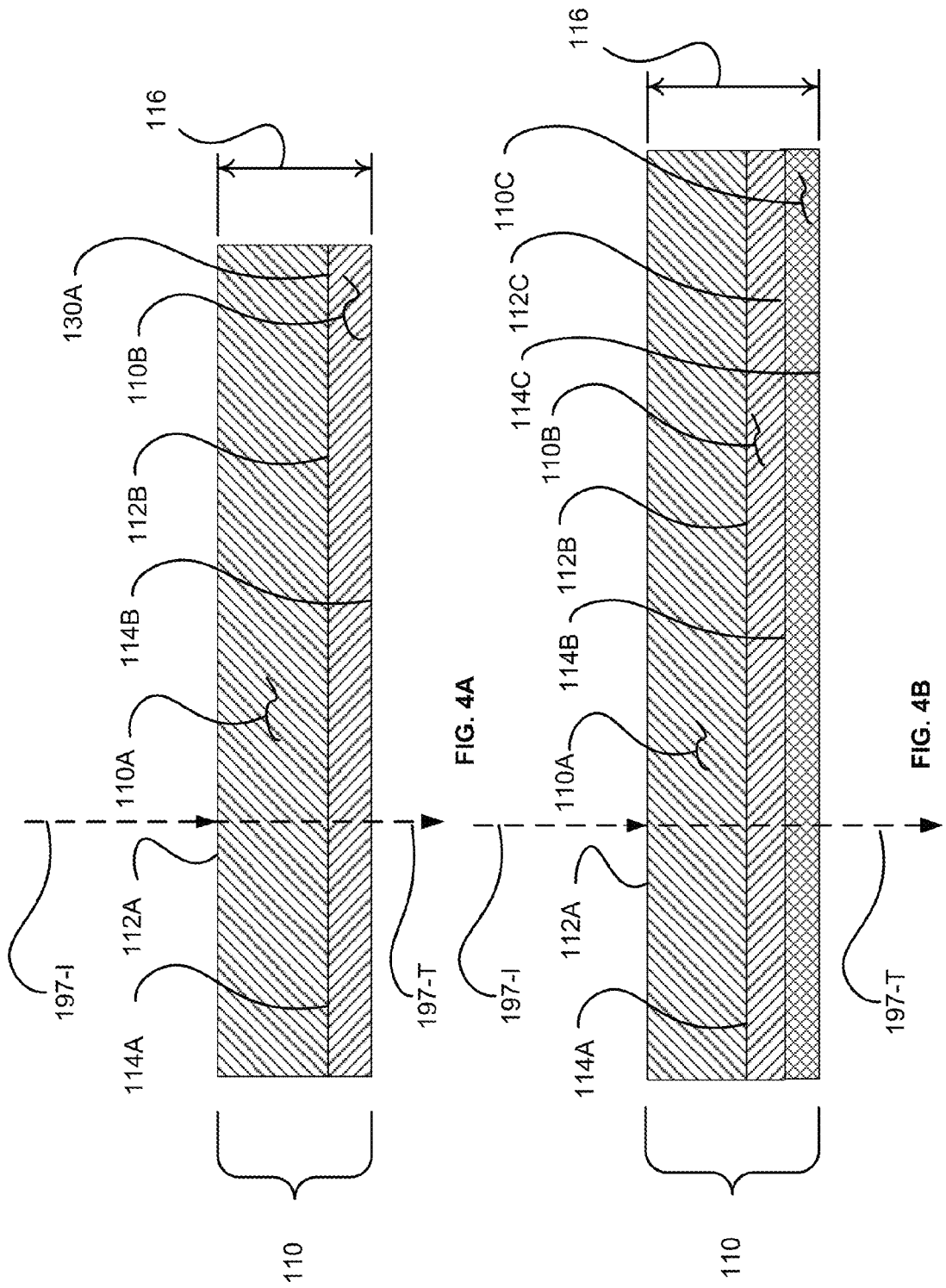
FIG. 4A illustrates a cross-sectional view of an alternative embodiment of the device of FIG. 2.
FIG. 4B illustrates a cross-sectional view of another alternative embodiment of the device 101 of FIG. 2.
Figure 23:
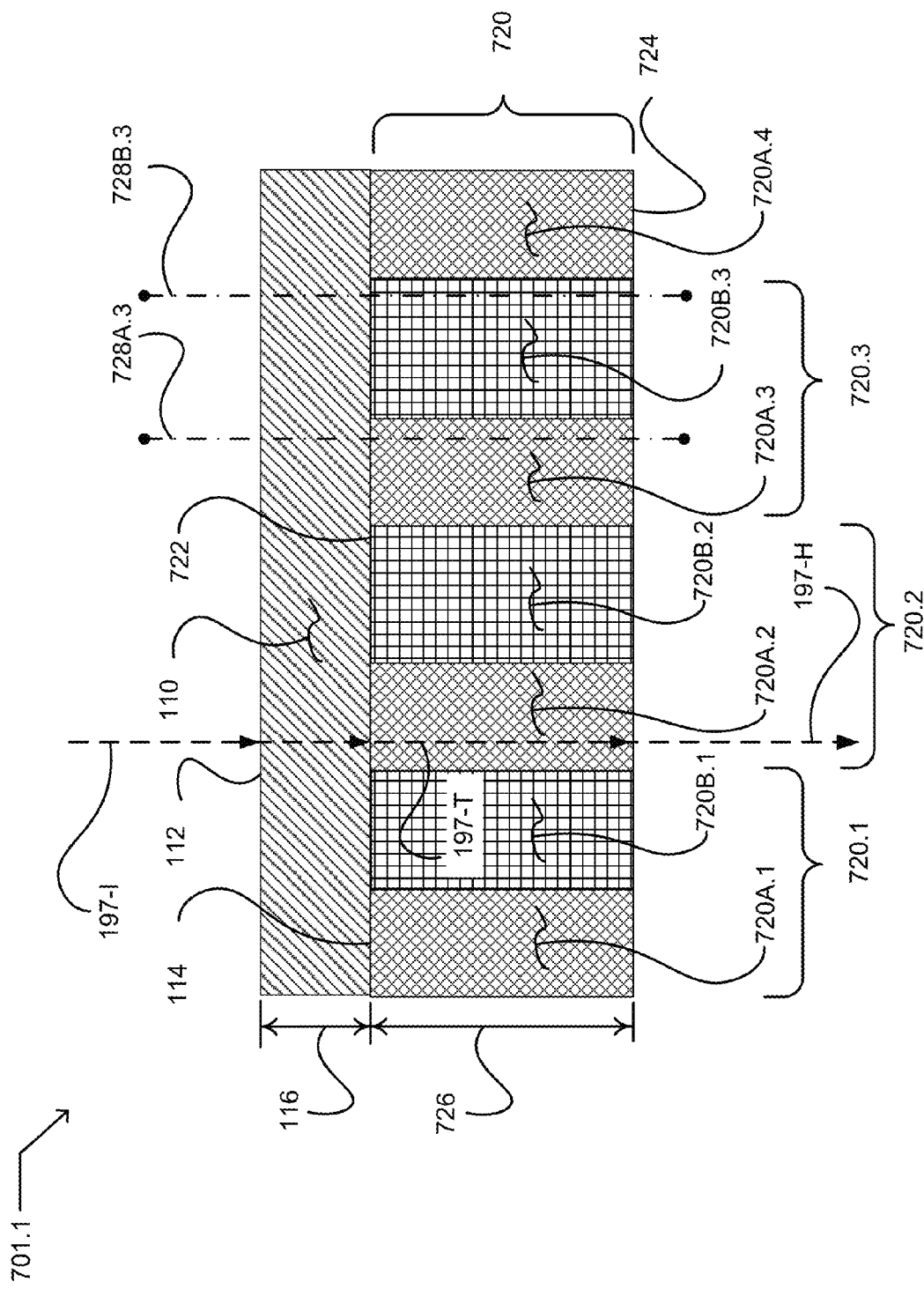
FIG. 23 illustrates an alternative embodiment of the device.
Figure 43:
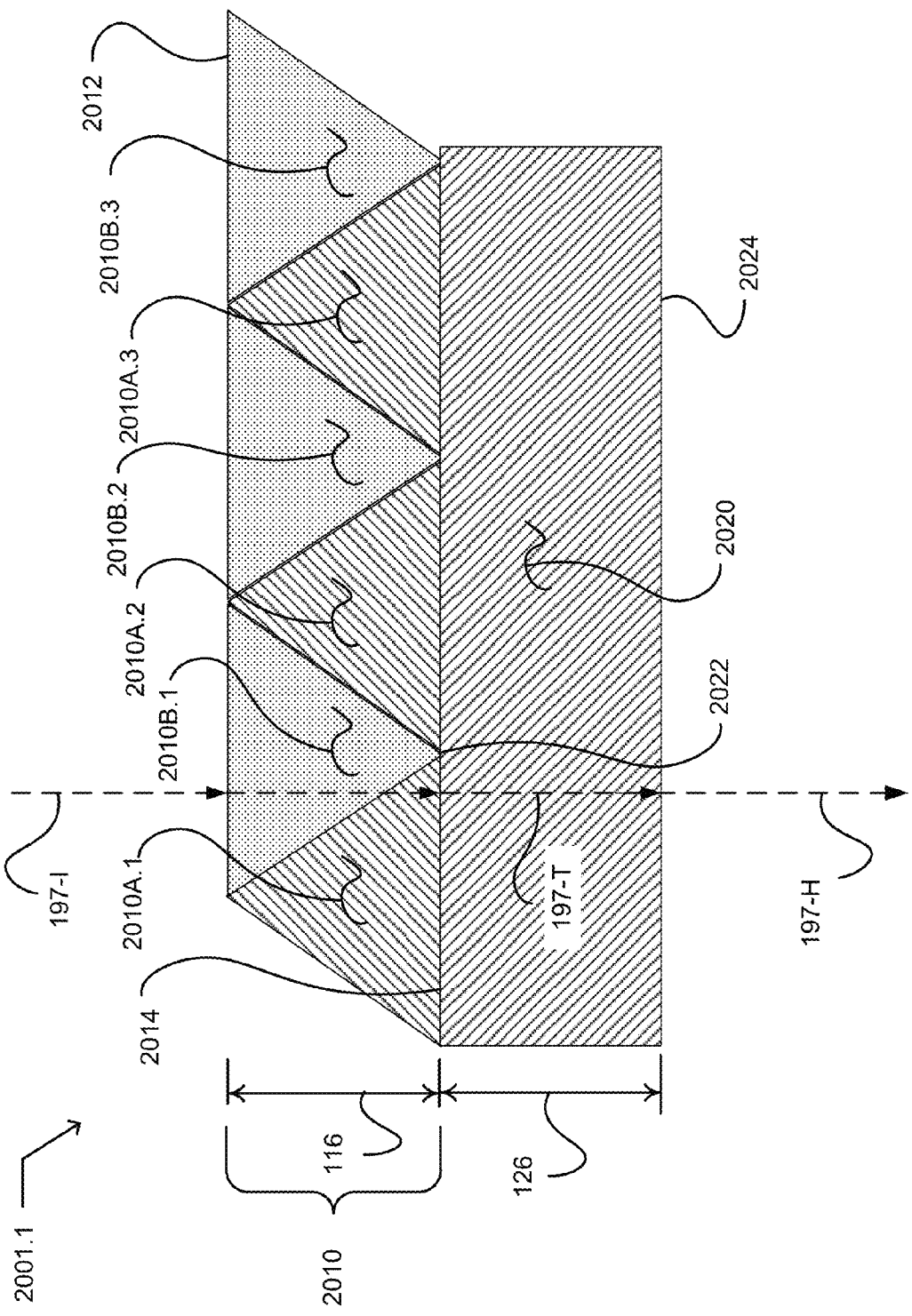
FIG. 43 illustrates a cross-sectional view of an alternative embodiment of an wearable air blast wave energy protection device.

FIG. 4A illustrates a cross-sectional view of an alternative embodiment of the device 101 of FIG. 2. In the alternative embodiment, the layer of the first material 110 is shaped and configured to reflect a substantial portion of a specified incident air blast wave energy 197-I and has a layer thickness 116 less than about 3 mm. The layer of the first material includes a pair of reflective-regions. A first reflective-region 110A of the pair of regions has a first acoustic impedance $Z_1$ substantially mismatched to the acoustic impedance of air $Z_A$. A second reflective-region 110B of the pair of regions has a second acoustic impedance $Z_2$ substantially dissimilar from the first acoustic impedance. In an embodiment, the specified incident air blast wave energy 197-T firstly arrives as the first reflective region and secondly arrives at the second acoustic region. The first reflective region includes a front surface 112A and a back surface 114A, the second reflective region includes a front surface 112B and a back surface 114B, and at least a portion of the back surface of the layer of the first material is proximate 130A to at least a portion of the front surface of the layer of the second material. In an alternative embodiment, the pair of reflective regions 110A and 110B may be positioned side-by-side with each occupying the full thickness 116 of the layer of first material and oriented to present both regions in parallel to the specified incident air blast wave energy 197-I rather than in series as illustrated in FIG. 4A. For example, see FIG. 23 illustrating a layer of a second material 720 having pairs of regions positioned side-by-side, or FIG. 43 illustrating a layer of a first material 2010 having pairs of regions positioned side-by-side. In this embodiment, the specified incident air blast wave energy arrives substantially simultaneously at the first reflective region and the second acoustic region.

Continuing with FIG. 4A, in such alternative embodiment, multiple pairs of the reflective regions 110A and 110B may comprise the layer of the first material. In an embodiment, the layer of the first material is shaped and configured to reflect a substantial portion of a specified incident air blast wave energy and has a layer thickness less than about 3 mm. The layer of the first material includes a pair of reflective-regions. A first reflective-region of the pair of regions has a first acoustic impedance $Z_1$ substantially mismatched to the acoustic impedance of air $Z_A$, and a second reflective-region of the pair of regions has a second acoustic impedance $Z_2$ substantially dissimilar from the first acoustic impedance. In this embodiment, $Z_1 > Z_2$. In an embodiment, the layer of the first material is shaped and configured to reflect a substantial portion of a specified incident air blast wave energy and has a layer thickness less than about 3 mm. The layer of the first material includes a pair of reflective-regions. A first reflective-region of the pair of regions has a first acoustic impedance $Z_1$ substantially mismatched to the acoustic impedance of air $Z_A$. A second reflective-region of the pair of regions has a second acoustic impedance $Z_2$ substantially dissimilar from the first acoustic impedance. In this embodiment, $Z_1 < Z_2$.

FIG. 4B illustrates a cross-sectional view of another alternative embodiment of the device 101 of FIG. 2. In the alternative embodiment, the layer of the first material 110 is shaped and configured to reflect a substantial portion of a specified incident air blast wave energy 197-I and has a layer thickness 116 less than about 3 mm. The layer of the first material includes at least three reflective-regions. A first reflective-region 110A of the at least three reflective-regions has a first acoustic impedance $Z_1$ substantially mismatched to the acoustic impedance of air $Z_A$. A second reflective-region of the at least three reflective-regions has a second acoustic impedance $Z_2$ substantially dissimilar from the first acoustic impedance. A third reflective-region of the at least three reflective-regions has a third acoustic impedance $Z_3$. For example, in an embodiment, the specified incident air blast wave energy arrives firstly at the first reflective region, arrives secondly at the second reflective region, and arrives thirdly at the third reflective region. In an alternative embodiment that is not illustrated, the at least three reflective regions 110A, 110B, and 110C may be positioned side-by-side with each occupying the full thickness 116 of the layer of first material and oriented to present the at least three regions in parallel to the specified incident air blast wave energy 197-I rather than in series as illustrated in FIG. 4B. In this alternative embodiment, the specified incident air blast wave energy arrives substantially simultaneously at the first reflective region, the second acoustic region, and the third reflective region. In this alternative embodiment, multiple instances of the at least three reflective regions 110A, 110B, and 110C may comprise the layer of the first material. In an embodiment, the layer of the first material is shaped and configured to reflect a substantial portion of a specified incident air blast wave energy and has a layer thickness less than about 3 mm. The layer of the first material includes at least three reflective-regions. A first reflective-region of the at least three reflective-regions has a first acoustic impedance substantially $Z_1$ mismatched to the acoustic impedance of air $Z_A$. A second reflective-region of the at least three reflective-regions has a second acoustic impedance $Z_2$ substantially dissimilar from the first acoustic impedance. A third reflective-region of the at least three reflective-regions has a third acoustic impedance $Z_3$ substantially dissimilar from the first acoustic impedance $Z_1$. In an embodiment, the layer of the first material is shaped and configured to reflect a substantial portion of a specified incident air blast wave energy and has a layer thickness less than about 3 mm. The layer of the first material includes at least three reflective-regions. A first reflective-region of the at least three reflective-regions has a first acoustic impedance substantially $Z_1$ mismatched to the acoustic impedance of air $Z_A$. A second reflective-region of the at least three reflective-regions has a second acoustic impedance $Z_2$ substantially dissimilar from the first acoustic impedance. A third reflective-region of the at least three reflective-regions has a third acoustic impedance $Z_3$ substantially dissimilar from the second acoustic impedance $Z_2$. In an embodiment, the layer of the first material is shaped and configured to reflect a substantial portion of a specified incident air blast wave energy and has a layer thickness less than about 3 mm. The layer of the first material includes at least three reflective-regions. A first reflective-region of the at least three reflective-regions has a first acoustic impedance substantially $Z_1$ mismatched to the acoustic impedance of air $Z_A$. A second reflective-region of the at least three reflective-regions has a second acoustic impedance $Z_2$ substantially dissimilar from the first acoustic impedance. A third reflective-region of the at least three reflective-regions has a third acoustic impedance $Z_3$ substantially dissimilar from the second acoustic impedance $Z_2$. In this embodiment, $Z_1 > Z_2$. In an embodiment, the layer of the first material is shaped and configured to reflect a substantial portion of a specified incident air blast wave energy and has a layer thickness less than about 3 mm. The layer of the first material includes at least three reflective-regions. A first reflective-region of the at least three reflective-regions has a first acoustic impedance substantially $Z_1$ mismatched to the acoustic impedance of air $Z_A$. A second reflective-region of the at least three reflective-regions has a second acoustic impedance $Z_2$ substantially dissimilar from the first acoustic impedance. A third reflective-region of the at least three reflective-regions has a third acoustic impedance $Z_3$ substantially dissimilar from the second acoustic impedance $Z_2$. In this embodiment, $Z_1 < Z_2$.

In an embodiment that is not illustrated, the layer of the first material 110 is shaped and configured to reflect a substantial portion of a specified incident air blast wave energy 197-I and has a layer thickness less than about 3 mm. The layer of the first material includes at least four reflective-regions. A first reflective-region of the at least four reflective-regions has a first acoustic impedance substantially $Z_1$ mismatched to the acoustic impedance of air. A second reflective-region of the at least four reflective-regions has a second acoustic impedance $Z_2$. A third reflective-region of the at least four reflective-regions has a third acoustic impedance $Z_3$. A fourth reflective-region of the at least four reflective-regions has a fourth acoustic impedance $Z_4$. In this embodiment, $Z_3/Z_4$ at least approximately equals $Z_1/Z_2$. In an embodiment of this embodiment, the specified incident air blast wave energy arrives firstly at the first reflective region, arrives secondly at the second reflective region, arrives thirdly at the third reflective region, and arrives fourthly at the fourth reflective region. In an alternative embodiment that also is not illustrated, the at least four reflective regions may be positioned side-by-side with each occupying the full thickness 116 of the layer of first material and oriented to present the at least four regions in parallel to the specified incident air blast wave energy 197-I rather than in series as illustrated in FIG. 4B. In an embodiment of this embodiment, the specified incident air blast wave energy arrives substantially simultaneously at the first reflective region, the second reflective region, the third reflective region, and the fourth reflective region. In this alternative embodiment, multiple instances of the at least three reflective regions may comprise the layer of the first material.

Returning to FIG. 2, in an embodiment, the layer of the second material 120 includes a layer of a second material shaped and configured to attenuate and to substantially increase a duration of the region of overpressure 24 of FIG. 1 of the specified incident air blast wave energy transmitted 197-T through the layer of the first material utilizing an inelastic response. The layer of the second material is shaped and configured for wearing proximate to the exterior portion 106 of the human body 105. In some instances, substantially increasing a duration of the region of overpressure of the specified incident air blast wave energy may be implemented using voids, or inclusions such as microspheres or macrospheres in the second material. It is expected that substantially increasing the duration of the specified incident air blast wave energy will decrease incoming incident air blast wave energy per unit of time, and thus provide a human protective response. In an embodiment, the layer of the second material includes a layer of a second material shaped and configured to attenuate a substantial portion of the specified incident air blast wave energy transmitted through the layer of the first material and to substantially decrease a slope of the shock front of the specified incident air blast wave energy transmitted through the layer of the first material utilizing an inelastic response. The layer of the second material is shaped and configured for wearing proximate to the exterior portion of the human body. In some instances, substantially decreasing the slope of the shock front 22 of FIG. 1 of the specified incident air blast wave energy may be implemented using voids, microspheres, or macrospheres in the second material. It is expected that decreasing the slope of the shock front will provide a human protective response. In an embodiment, the layer of the second material includes a layer of a second material shaped and configured to attenuate a substantial portion of the specified incident air blast wave energy transmitted through the layer of the first material and to widen the leading edge of the shock front of the specified incident air blast wave energy transmitted through the layer of the first material utilizing an inelastic response. The layer of the second material is shaped and configured for wearing proximate to the exterior portion of the human body. In an embodiment, the layer of the second material includes a layer of a second material shaped and configured to attenuate a substantial portion of the specified incident air blast wave energy transmitted through the layer of the first material and to shift the spectral peak of the specified incident air blast wave energy transmitted through the layer of the first material by about at least one order-of-magnitude lower utilizing an inelastic response. The layer of the second material is shaped and configured for wearing proximate to the exterior portion of the human body.

In an embodiment, the layer of the second material 120 includes a layer of a second material shaped and configured to attenuate a substantial portion of the specified incident air blast wave energy transmitted 197-T through the layer of the first material 110 utilizing an inelastic response. The layer of the second material is shaped and configured for wearing proximate to the exterior portion 106 of the human body 105, and has a layer thickness 126 of less than about 5 cm. In an embodiment, the layer of the second material includes a layer of a second material shaped and configured to attenuate a substantial portion of the specified incident air blast wave energy transmitted through the layer of the first material utilizing an inelastic response. The layer of the second material is shaped and configured for wearing proximate to the exterior portion of the human body, and has a layer thickness of less than about 1 cm.

In an embodiment, the layer of the second material 120 includes a layer of a second material shaped and configured to attenuate a substantial portion of the specified incident air blast wave energy transmitted 197-T through the layer of the first material 110 by at least 3 dB utilizing an inelastic response. The layer of the second material is shaped and configured for wearing proximate to the exterior portion 106 of the human body 105. The at least 3 db attenuation is expected to attenuate at least 50% of the specified incident air blast wave energy transmitted through the layer of the first material. In an embodiment, the layer of the second material includes a layer of a second material shaped and configured to attenuate a substantial portion of the specified incident air blast wave energy transmitted through the layer of the first material by at least 6 dB utilizing an inelastic response. The layer of the second material is shaped and configured. The at least 6 db attenuation is expected to attenuate at least 75% of the specified incident air blast wave energy transmitted through the layer of the first material. In an embodiment, the layer of the second material includes a layer of a second material shaped and configured to attenuate a substantial portion of the specified incident air blast wave energy transmitted through the layer of the first material by at least 10 dB utilizing an inelastic response. The layer of the second material is shaped and configured. The at least 10 db attenuation is expected to attenuate at least 90% of the specified incident air blast wave energy transmitted through the layer of the first material. In an embodiment, the layer of the second material includes a layer of a second material shaped and configured to attenuate a substantial portion of the specified incident air blast wave energy transmitted through the layer of the first material by at least 20 dB utilizing an inelastic response. The layer of the second material is shaped and configured. The at least 20 db attenuation is expected to attenuate at least 99% of the specified incident air blast wave energy transmitted through the layer of the first material. In an embodiment, the layer of the second material includes a layer of a second material shaped and configured to attenuate a substantial portion of the specified incident air blast wave energy transmitted through the layer of the first material by at least 30 dB utilizing an inelastic response. The layer of the second material is shaped and configured. The at least 30 db attenuation is expected to attenuate at least 99.9% of the specified incident air blast wave energy transmitted through the layer of the first material.

In an embodiment, the layer of the second material 120 includes a layer of an acoustic absorption material shaped and configured to attenuate a substantial portion of the specified incident air blast wave energy transmitted 197-T through the layer of the first material 110 utilizing an inelastic response. The layer of the second material is shaped and configured for wearing proximate to the exterior portion 106 of the human body 105. In an embodiment, the layer of the second material includes a layer of a second material shaped and configured to absorb a substantial portion of the specified incident air blast wave energy transmitted through the layer of the first material utilizing an inelastic response. The layer of the second material is shaped and configured for wearing proximate to the exterior portion of the human body.

In an embodiment, the layer of the second material 120 includes a layer of a second material shaped and configured to attenuate a substantial portion of the specified incident air blast wave energy transmitted 197-T through the layer of the first material 110 utilizing an inelastic response. The layer of the second material is shaped and configured for wearing proximate to the exterior portion 106 of the human body 105. The inelastic response of the layer of the second material is selected as at least substantially likely to provide a human-protective response to the specified incident air blast wave energy transmitted through the layer of the first material. In an embodiment, the layer of the second material includes a layer of a second material shaped and configured to attenuate a substantial portion of the specified incident air blast wave energy transmitted through the layer of the first material utilizing an inelastic response. The layer of the second material is shaped and configured for wearing proximate to the exterior portion of the human body. The inelastic response of the second material includes an inelastic crush response to the specified incident air blast wave energy transmitted through the layer of the first material. For example, an inelastic crush response may be illustrated by the crush plateau zone 200 or region of FIG. 3.

Continuing with reference to FIG. 2, in an embodiment, the layer of the second material 120 is shaped and configured to attenuate a substantial portion of the specified incident air blast wave energy transmitted 197-T through the layer of the first material 110 utilizing an inelastic response. The layer of the second material shaped and configured for wearing proximate to the exterior portion 106 of the human body 105. The inelastic response of the second material includes an inelastic crush response to the specified incident air blast wave energy transmitted through the layer of the first material at an overpressure greater than about 0.1 bar. In an embodiment, the layer of the second material is shaped and configured to attenuate a substantial portion of the specified incident air blast wave energy transmitted through the layer of the first material utilizing an inelastic response. The layer of the second material is shaped and configured for wearing proximate to the exterior portion of the human body. The inelastic response of the second material includes an inelastic crush response to the specified incident air blast wave energy transmitted through the layer of the first material at an overpressure greater than about 1 bar. In an embodiment, the layer of the second material is shaped and configured to attenuate a substantial portion of the specified incident air blast wave energy transmitted through the layer of the first material utilizing an inelastic response. The layer of the second material is shaped and configured for wearing proximate to the exterior portion of the human body. The inelastic response of the second material includes an inelastic crush response to the specified incident air blast wave energy transmitted through the layer of the first material at an overpressure greater than about 3 bar. In an embodiment, the layer of the second material is shaped and configured to attenuate a substantial portion of the specified incident air blast wave energy transmitted through the layer of the first material utilizing an inelastic response. The layer of the second material is shaped and configured for wearing proximate to the exterior portion of the human body. The inelastic response of the second material includes an inelastic crush response to the specified incident air blast wave energy transmitted through the layer of the first material at an overpressure greater than about 6 bar. In an embodiment, the layer of the second material is shaped and configured to attenuate a substantial portion of the specified incident air blast wave energy transmitted through the layer of the first material utilizing an inelastic response. The layer of the second material is shaped and configured for wearing proximate to the exterior portion of the human body. The inelastic response of the second material includes an inelastic crush response to the specified incident air blast wave energy transmitted through the layer of the first material at an overpressure greater than about 10 bar.

In an embodiment, the layer of the second material 120 includes a layer of a metallic foam material shaped and configured to attenuate a substantial portion of the specified incident air blast wave energy transmitted 197-T through the layer of the first material 110 utilizing an inelastic response. The layer of the second material is shaped and configured for wearing proximate to the exterior portion 106 of the human body 105. For example, the metallic foam may include an aluminum foam. For example, the metallic foam may include a closed cell metallic foam. For example, the metallic foam may include open cell metallic foam. For example the metallic foam may include a sandwich of at least two metallic foams.

In an embodiment, the second material 120 includes a layer of an aerogel material shaped and configured to attenuate a substantial portion of the specified incident air blast wave energy transmitted 197-T through the layer of the first material 110 utilizing an inelastic response. The layer of the second material is shaped and configured for wearing proximate to the exterior portion of the human body. In an embodiment, the second material includes a layer of a syntactic foam material shaped and configured to attenuate a substantial portion of the specified incident air blast wave energy transmitted 197-T through the layer of the first material utilizing an inelastic response. The layer of the second material is shaped and configured for wearing proximate to the exterior portion of the human body.

In an embodiment, the second material 120 includes a layer of a plastic foam material shaped and configured to attenuate a substantial portion of the specified incident air blast wave energy transmitted 197-T through the layer of the first material 110 utilizing an inelastic response. The layer of the second material is shaped and configured for wearing proximate to the exterior portion of the human body. For example, the layer of the plastic foam material may include a hybrid composite of phenolic foams reinforced with chopped glass and aramid fibers in varied proportions.

In an embodiment, the second material 120 includes a layer of a periodic cellular metal material shaped and configured to attenuate a substantial portion of the specified incident air blast wave energy transmitted 197-T through the layer of the first material 110 utilizing an inelastic response. The layer of the second material is shaped and configured for wearing proximate to the exterior portion of the human body. For example, a layer of a periodic cellular metal may include less than about 20% interior volume occupied by metal. For example, the layer of a periodic cellular metal may include closed cell honeycomb, prismatic corrugations, or lattice structures with hollow trusses and cell sizes the millimeter range.

In an embodiment, the layer of the second material 120 is shaped and configured to attenuate a substantial portion of the specified incident air blast wave energy transmitted 197-T through the layer of the first material 110 utilizing a high-modulus low-density second material in an inelastic response. For example, a high-modulus low-density material may include a material like a syntactic foam that includes microspheres or hollow microballoons. For example, a high-modulus low-density material may include a material like Corecell™ S-Foam manufactured by SP-High Modulus/Gurit of Isle of Wright, UK. The layer of the second material is shaped and configured for wearing proximate to the exterior portion of the human body. In an embodiment, the second material includes a layer of a high-modulus low-density second material shaped and configured to attenuate a substantial portion of the specified incident air blast wave energy transmitted through the layer of the first material utilizing an inelastic response. The layer of the second material is shaped and configured for wearing proximate to the exterior portion of the human body.

In an embodiment, the layer of the second material 120 is shaped and configured to attenuate a substantial portion of the specified incident air blast wave energy transmitted 197-T through the layer of the first material 110 utilizing an inelastic response. The layer of the second material is shaped and configured for wearing proximate to the exterior portion of the human body. The layer of the second material has a mass per unit area less than about 1 g/cm². In an embodiment, the layer of the second material 120 is shaped and configured to attenuate a substantial portion of the specified incident air blast wave energy transmitted 197-T through the layer of the first material 110 utilizing an inelastic response. The layer of the second material is shaped and configured for wearing proximate to the exterior portion of the human body. The layer of the second material has a mass per unit area less than about 0.3 g/cm². In an embodiment, the layer of the second material 120 is shaped and configured to attenuate a substantial portion of the specified incident air blast wave energy transmitted 197-T through the layer of the first material 110 utilizing an inelastic response. The layer of the second material is shaped and configured for wearing proximate to the exterior portion of the human body. The layer of the second material has a mass per unit area less than about 0.1 g/cm².

In an embodiment, the layer of the second material 120 is shaped and configured to attenuate a substantial portion of the specified incident air blast wave energy transmitted 197-T through the layer of the first material 110 utilizing an inelastic response. The layer of the second material has a shape configured for wearing proximate to the exterior portion 106 of the human body 105. In an embodiment, the layer of the second material is shaped and configured to attenuate a substantial portion of the specified incident air blast wave energy transmitted through the layer of the first material utilizing an inelastic response. The layer of the second material has a shape configured for wearing proximate to a portion of a human head (not illustrated). For example, the layer of the second material may be contoured to closely fit the portion of a human head and to minimize or eliminate the air gap 198. In an embodiment, the layer of the second material is shaped and configured to attenuate a substantial portion of the specified incident air blast wave energy transmitted through the layer of the first material utilizing an inelastic response. The layer of the second material is shaped and configured to fit in close proximity to the exterior portion of the human body. For example, the close proximity may include touching the exterior portion of the human body. In an embodiment, the layer of the second material is shaped and configured to attenuate a substantial portion of the specified incident air blast wave energy transmitted through the layer of the first material utilizing an inelastic response. The layer of the second material has a shape configured to fit against the exterior portion of the human body.

In an embodiment, the layer of the second material 120 is shaped and configured to attenuate a substantial portion of the specified incident air blast wave energy transmitted 197-T through the layer of the first material 110 utilizing a single-use inelastic response. The layer of the second material is shaped and configured for wearing proximate to the exterior portion 106 of the human body 105.

In an embodiment, the device 101 includes a label (not illustrated) indicating use of the device is limited to a single exposure to an air blast wave energy, such as the selected incident air blast wave energy 197-I. In an embodiment, the device includes an indicator 191 configured to provide a human-perceivable indication that the device has been exposed to an air blast wave energy, such as the selected incident air blast wave energy. For example, the indicator may be implemented using pores or small spheres filed with a colored liquid that bleed into a visible region of the device when crushed by the incident air blast wave energy. An example indicator using a color changing crystal may be found in D. K. Cullen, et al., *Color changing photonic crystals detect blast exposure*, Science 19 Nov. 2010: Vol. 330 no. 6007 p. 1023.

Figure 5:
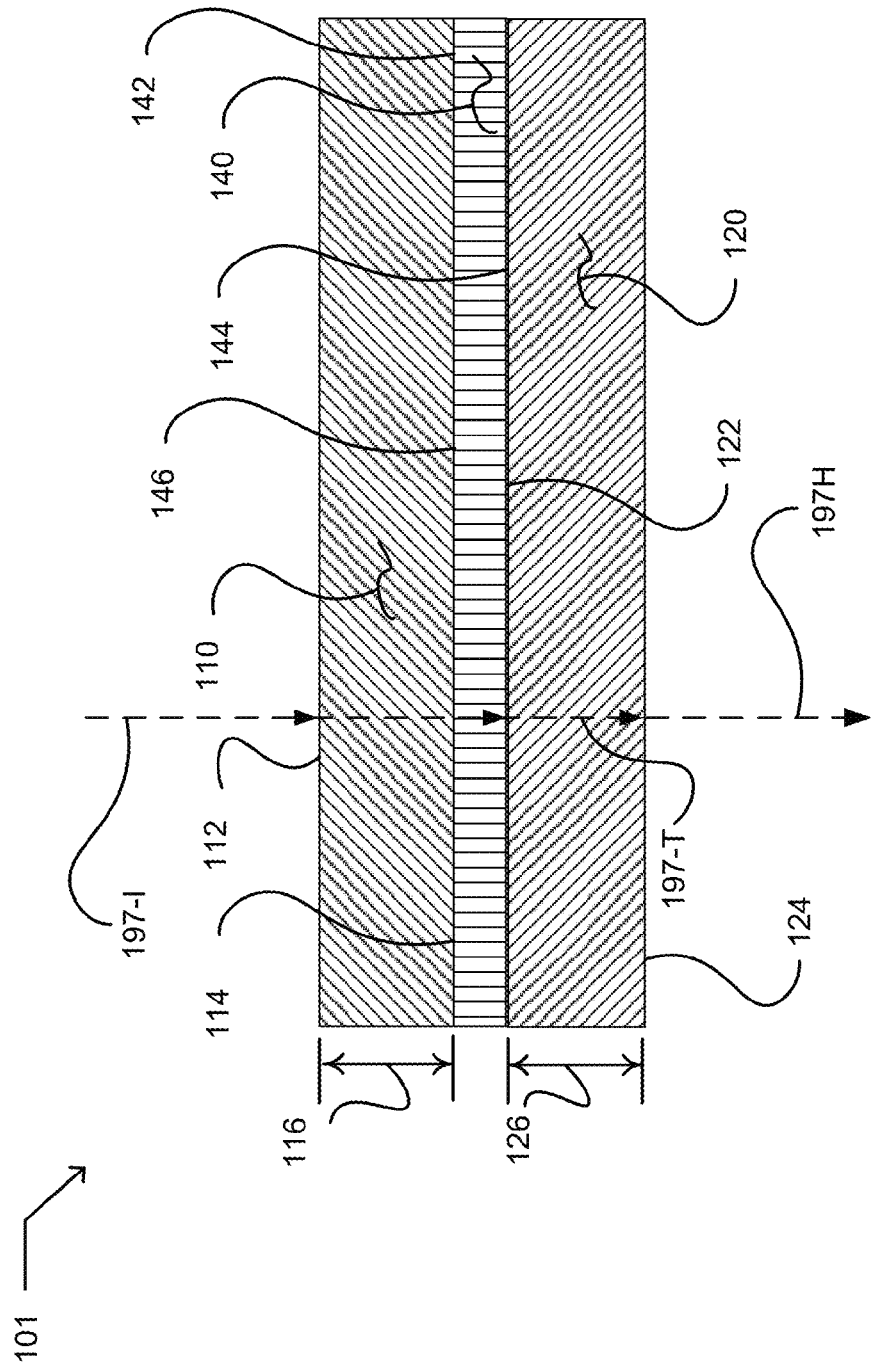
FIG. 5 illustrates a cross-sectional view an alternative embodiment of the device of FIG. 2.
Figure 6:
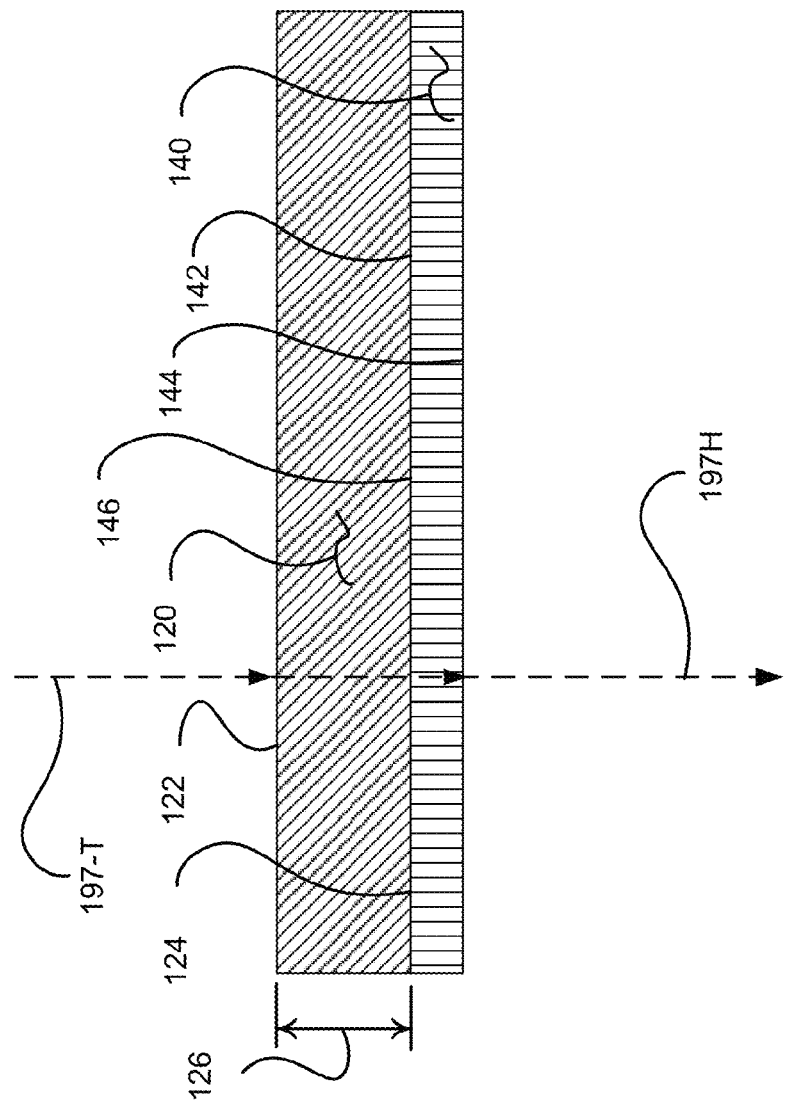
FIG. 6 illustrates an alternative embodiment a cross-sectional view an alternative embodiment of the device 101 of FIG. 2.

FIGS. 5 and 6 illustrate cross-sectional views of alternative embodiments of the device 101 of FIG. 2. The device includes a spall liner 140 shaped and configured to restrain at least one fragment broken from of the layer of the first material 110 by the specified incident air blast wave energy 197-I. For example, the spall liner may be made using aramid fibers, such as KEVLAR®, or TWARON®. For example, the spall liner may be made using polyethylene fibers, such as DYNEEMA®, or ZYLON®. For example, the spall liner may be made using a very high tensile strength biomaterial, such as spider silk, spider silk from goat's milk, or similar materials. For example, the spall liner may be made using polyethylene, polypropylene, composite laminate, E-glass, or and S2-glass materials. FIG. 5 illustrates an alternative embodiment where the spall liner is interposed between the layer of the first material 110 and the layer of the second material. The layer of the first material includes the front surface 112 and the back surface 114, the layer of the second material includes the front surface 122 and the back surface 124, the spall liner includes a front surface 142 and a back surface 144. In this embodiment, at least a portion of the back surface of the layer of the first material is proximate 146 to at least a portion of the front surface of the spall liner, and at least a portion of the back surface of the spall liner is proximate to the front surface of the layer of the second material. For example, two materials that are proximate may include two materials that are in physical contact, joined, bonded, fused, or coupled. For example, two materials that are proximate may include two materials that are joined by an adhesive, such as contact cement, film, adhesive, wax, or resin. For example, two materials that are proximate may include two materials that are joined by a thermal fusion.

FIG. 6 illustrates an alternative embodiment where the spall liner 140 is interior of the layer of the second material 120. In this embodiment, at least a portion of the back surface 124 (not illustrated) of the layer of the first material 110 (not illustrated) is proximate 180 (not illustrated) to at least a portion of the front surface 122 of the layer of the second material, and at least a portion of the back surface 124 of the layer of the second material is proximate 146 to at least a portion of the front surface 142 of the spall liner.

Returning to FIG. 2, in an embodiment the layer of the first material 110 includes a front surface 112 and a back surface 114, and the layer of the second material 120 includes a front surface 122 and a back surface 124. At least a portion of the back surface of the layer of the first material is joined proximate 180 to the at least a portion of the front surface of the layer of the second material. In an embodiment, the at least a portion of the back surface of the layer of the first material is joined at the proximity of the at least a portion of the front surface of the layer of the second material. The joined first material and the second material forming an at least substantially stiff assembly. For example, the joined first material and the second material may have a specific bending stiffness in the range of an aluminum foam sandwich, which may be approximately 41.5 $[10^4 \text{N mm}^3/\text{kG}]$. In an embodiment, the at least a portion of the back surface of the layer of the first material is joined at the proximity of the at least a portion of the front surface of the layer of the second material. The joined first material and the second material forming an at least substantially flexible assembly. For example, the joined first material and the second material may have a specific bending stiffness in the range of aluminum, which may be approximately 2.5 $[10^4 \text{N mm}^3/\text{kG}]$. In an embodiment, the at least a portion of the back surface of the layer of the first material is acoustically coupled at the proximity of the at least a portion of the front surface of the layer of the second material. In an embodiment, the at least a portion of the back surface of the layer of the first material is proximate to at least a portion of the front surface of the layer of the second material. The proximate first material and the second material are shaped and configured such that the device is wearable proximate to the exterior portion 106 of the human body 105 without a significant continuous air path between a portion of the front surface 112 of the first material and at least one portion of the exterior portion of the human body.

Figure 7:
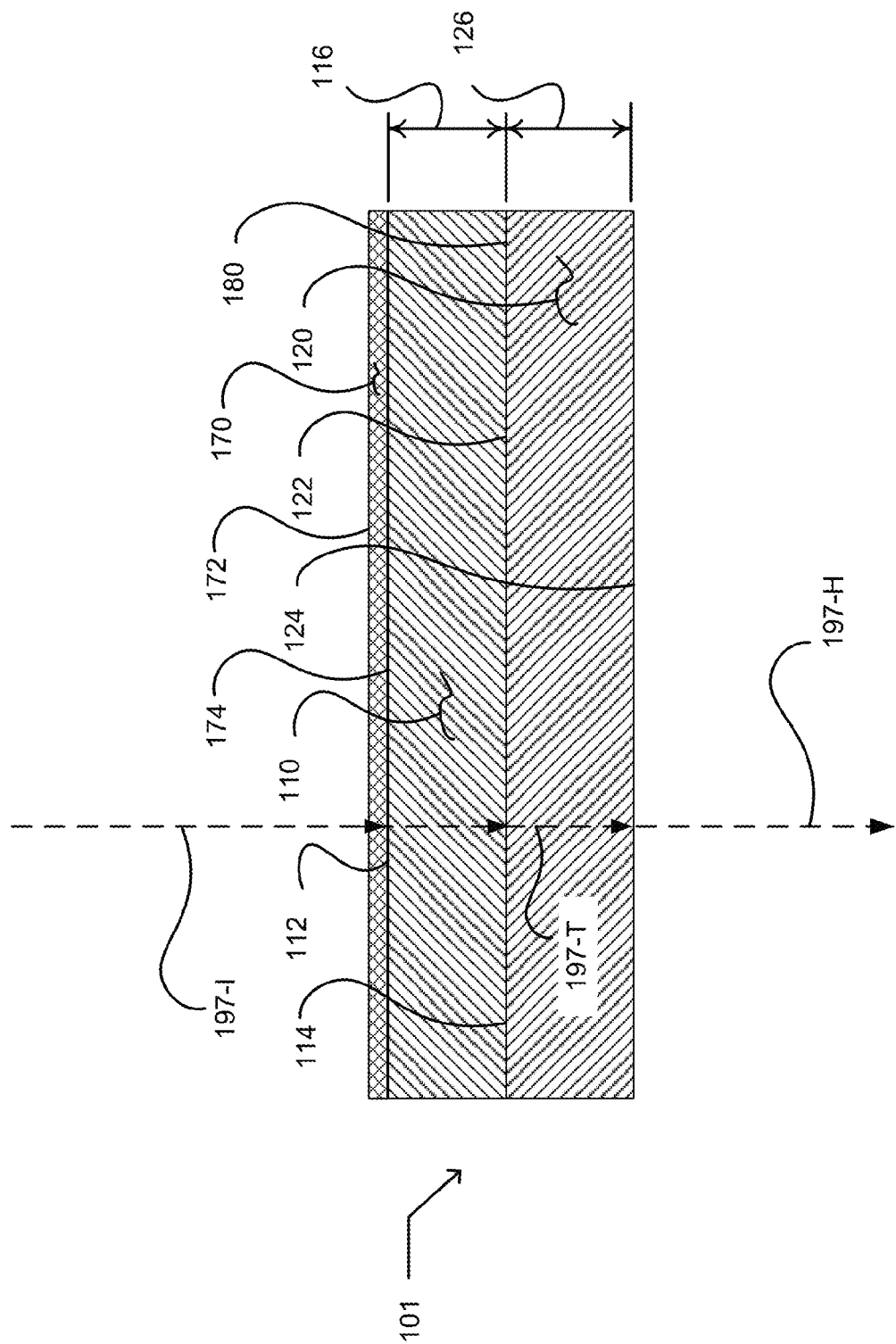
FIG. 7 illustrates a cross-sectional view of an alternative embodiment of the device of FIG. 2.

FIG. 7 illustrates a cross-sectional view of an alternative embodiment of the device 101 of FIG. 2. In an embodiment, the device includes a layer of a ballistic material 170 shaped and configured to substantially attenuate energy of an object (not illustrated) impacting the (hereafter "impacting object") exterior portion 106 of the human body 105. For example, an impacting object may include a ballistic, projectile, blunt force, or shrapnel. For example, the energy of an impacting object may include a kinetic energy of the impacting object. For example, the energy of an impacting object may include a rotational or spinning energy, such as a rotating, tumbling, or spinning of a projectile. The layer of the first material 110 includes a front surface 112 and a back surface 114, the layer of the second material 120 includes a front surface 122 and a back surface 124, and the layer of the ballistic material 170 includes a front surface 172 and a back surface 174. In an embodiment, the front surface of the layer of ballistic material may be considered an exterior or outside surface of a helmet. In an embodiment, the back surface may be considered an interior or inside surface of a helmet. In an embodiment, at least a portion of the back surface of the layer of the ballistic material is proximate to the front surface of the layer of the first material, and at least a portion of the back surface of the layer of the first material is proximate to at least a portion of the front surface of the layer of the second material. In an embodiment, at least a portion of the back surface of the layer of the ballistic material is joined to the front surface of the layer of the first material, and at least a portion of the back surface of the layer of the first material is joined to at least a portion of the front surface of the layer of the second material. In an embodiment, at least a portion of the back surface of the layer of the ballistic material is acoustically coupled to the front surface of the layer of the first material, and at least a portion of the back surface of the layer of the first material is acoustically coupled to at least a portion of the front surface of the layer of the second material. In an embodiment (not illustrated), at least a portion of the back surface of the layer of the first material is proximate to the front surface of the layer of the ballistic material, and at least a portion of the back surface of the layer of the ballistic material proximate to at least a portion of the front surface of the layer of the second material. In an embodiment (not illustrated), at least a portion of the back surface of the layer of the first material is proximate to the front surface of the layer of the second material, and at least a portion of the back surface of the layer of the second material is proximate to at least a portion of the front surface of the layer of the ballistic material.

Returning to FIG. 2, in an embodiment, the device 101 further comprises a retaining apparatus (not illustrated) configured to hold the layer of the first material 110 and the layer of the second material 120 adjacent to the exterior portion 106 of the human body 105. In an embodiment, the retaining apparatus includes at least one strap. For example, the retaining apparatus may include a chin strap. For example, the retaining apparatus may include a removable fixation device. For example, the retaining apparatus is configured to hold the layer of the first material and the layer of the second material in a substantially direct contact with or adjacent to the exterior portion of the human body. In such an example, the air gap 198 is minimized or non-existent. In an embodiment, the retaining apparatus in cooperation with the layer of the second material are configured to hold the layer of the second material immediately against the exterior portion of the human body. In such an embodiment, the air gap 198 is minimized or non-existent.

Continuing with FIG. 2, in an embodiment, the device 101 includes the layer of a first material 110. The layer of first material is shaped and configured to reflect at least 50% of the shock front 22 of a specified incident air blast wave energy 197-I. The first material has an acoustic impedance substantially mismatched to the acoustic impedance of air, and a layer thickness 116 of less than about 3 mm. The device includes the layer of the second material 120. The layer of the second material is shaped and configured to attenuate a substantial portion of the specified incident air blast wave energy transmitted 197-T through the layer of the first material utilizing an inelastic response. The layer of the first material includes a front surface and a back surface, and the layer of the second material includes a front surface and a back surface. At least a portion of the back surface of the layer of the first material is proximate to at least a portion of the front surface of the layer of the second material.

Continuing with FIG. 2, in an embodiment, the device 101 includes the layer of a first material 110. The layer of first material is shaped and configured to reflect at least 10% of the shock front 22 of a specified incident air blast wave energy 197-I. The first material has an acoustic impedance substantially mismatched to the acoustic impedance of air, and a layer thickness less than about 3 mm. The device includes the layer of the second material 120. The layer of a second material is shaped and configured to attenuate a substantial portion of the specified incident air blast wave energy transmitted 197-T through the layer of the first material utilizing an inelastic response The layer of the first material includes a front surface and a back surface, and the layer of the second material includes a front surface and a back surface. At least a portion of the back surface of the layer of the first material is proximate to at least a portion of the front surface of the layer of the second material.

Figure 8:
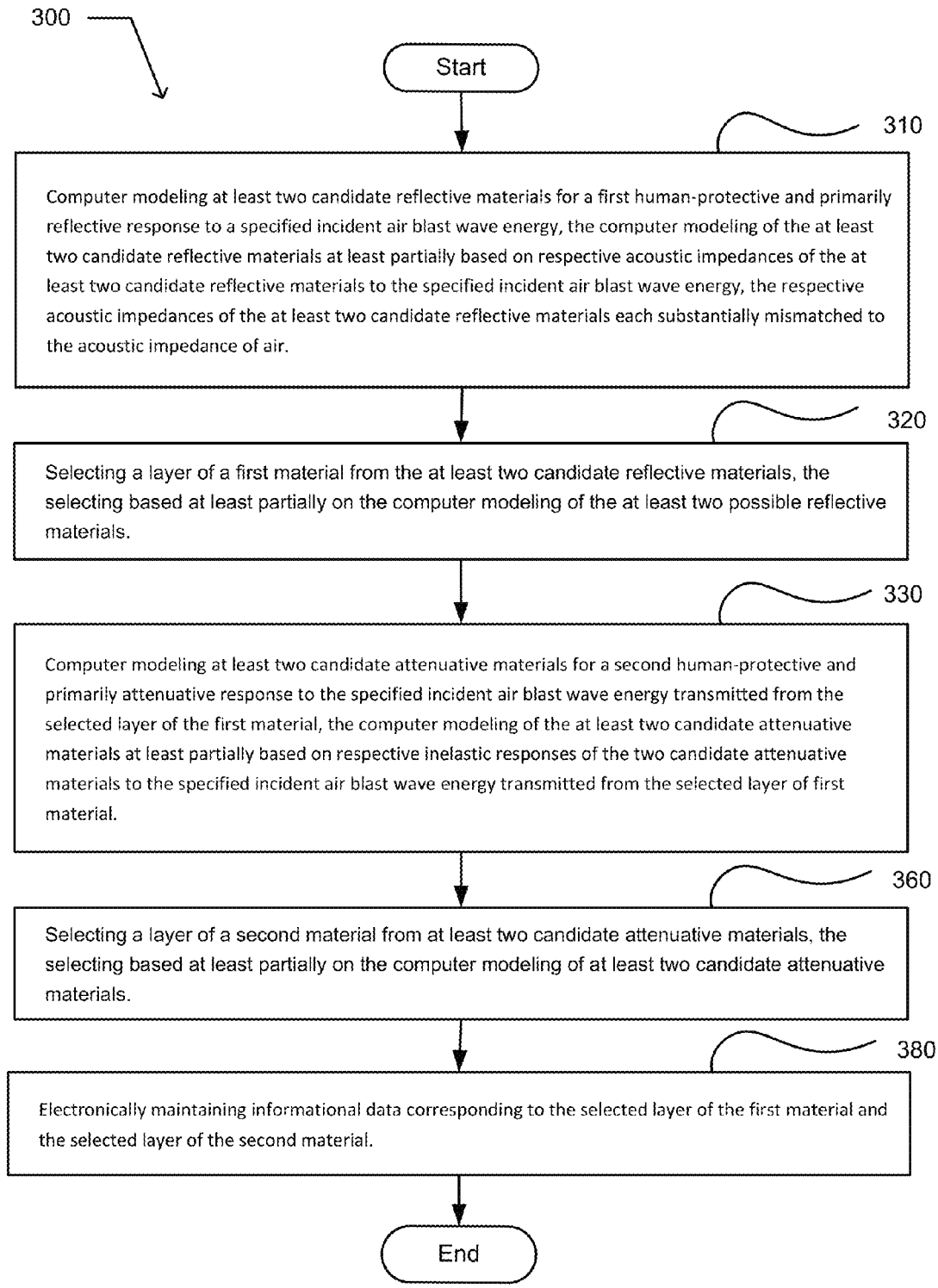
FIG. 8 illustrates an example operational flow 300.

FIG. 8 illustrates an example operational flow 300 in which embodiments of designing a wearable air blast wave energy protection device may be implemented. After a start operation, the operational flow includes a reflection modeling operation 310. The reflection modeling operation includes computer modeling at least two candidate reflective materials for a first human-protective and primarily reflective response to a specified incident air blast wave energy. The computer modeling of the at least two candidate reflective materials is at least partially based on respective acoustic impedances of the at least two candidate reflective materials to the specified incident air blast wave energy. The air blast wave energy includes an air blast wave energy produced by a high intensity explosive. In an embodiment, the blast event 193 creates the air blast wave 195, a portion of which proceeds toward the human body 105 as depicted by the incident air blast wave energy 197-I described in conjunction with FIG. 2. The respective acoustic impedances of the at least two candidate reflective materials are each substantially mismatched to the acoustic impedance of air. The operational flow includes a reflective material selecting operation 320. The reflective material selecting operation includes selecting a layer of a first material from the at least two candidate reflective materials. The selecting is based at least partially on the computer modeling of the at least two possible layers of reflective material. In an embodiment, the selected layer of the first material includes selecting the layer of the first material 110 described in conjunction with FIG. 2. The operational flow includes an attenuation modeling operation 330. The attenuation modeling operation includes computer modeling at least two candidate attenuative materials for a second human-protective and primarily attenuative response to the specified incident air blast wave energy transmitted through the selected layer of the first material. The computer modeling of the at least two candidate attenuative materials is at least partially based on respective inelastic responses of the two candidate attenuative materials to the specified incident air blast wave energy transmitted through the selected layer of the first material. In an embodiment, the specified incident air blast wave energy transmitted through the layer of the first material includes the specified incident air blast wave energy transmitted 197-T through the layer of the first material described in conjunction with FIG. 2. The operational flow includes an attenuation material selecting operation 360. The attenuation material selecting operation includes selecting a layer of a second material from at least two candidate attenuative materials. The selecting is based at least partially on the computer modeling of at least two candidate attenuative materials. For example, the selected layer of the second material may include the layer of the second material 120 described in conjunction with FIG. 2. The operational flow includes storage operation 380. The storage operation includes electronically maintaining informational data corresponding to the selected layer of the first material and the selected layer of the second material. The operational flow includes an end operation.

As used herein for example, "selecting" or "selected" may include any process or methodology used to identify or select for use one or more materials, or a parameter of one or more materials from a plurality of candidates. As used herein for example, "selecting" or "selected" may include any process or methodology used to identify or choose an acoustic reflection, an acoustic impedance, an acoustic attenuation, or a layer thickness parameter of one or more materials. As used herein for example, "selecting" or "selected" may include any process or methodology used to identify or choose one or more materials having a particular acoustic reflection, acoustic impedance, acoustic attenuation, or layer thickness parameter. As used herein for example, a process to implement a "selecting" or "selected" may include, but is not limited to, a user based selecting, user identified selecting, software analysis based selecting, algorithm based selecting, computer mediated selecting, operations research based selection, optimization based selecting, simulation based selecting, queuing theory based selecting, and/or game theory based selecting.

FIG. 9 illustrates alternative embodiments of the reflection modeling operation 310 of the operational flow 300 of FIG. 8. The reflection modeling operation may include at least one alternative embodiment. The at least one alternative embodiment may include an operation 312 or an operation 314. The operation 312 includes computer modeling at least two candidate reflective materials for a first advantageous human-protective and primarily reflective response to a specified incident air blast wave energy. The computer modeling of the at least two candidate reflective materials is at least partially based on respective acoustic impedances of the at least two candidate reflective materials to the specified incident air blast wave energy. The respective acoustic impedances of the at least two candidate reflective materials are each substantially mismatched to the acoustic impedance of air. For example, an advantageous response may include a response likely to provide a significant measure of human protection in a combat condition. For example, an advantageous response may include a response likely to aid in providing human protection to the specified incident air blast wave energy. For example, an advantageous response may include a response likely to provide a more suitable protection to the specified incident air blast wave energy than another candidate material. In an embodiment, the computer modeling at least two candidate reflective materials includes computer modeling at least two combat-conditions appropriate candidate reflective materials for human-protective and primarily reflective response. For example, a combat conditions-appropriate candidate reflective material for a human-protective and primarily reflective response may include candidate reflective material having a weight or configuration that a soldier is reasonably likely to wear in combat conditions. In an embodiment, the computer modeling at least two candidate reflective materials includes computer modeling at least two candidate reflective materials for a combat-conditions optimized candidate reflective materials for a human-protective and primarily reflective response. For example, the combat-conditions optimized candidate reflective materials for human-protective and primarily reflective response may include candidate reflective materials reasonably attainable within weight, environment, or budgetary restrictions imposed on combat equipment.

The operation 314 includes computer modeling at least two candidate reflective materials for a first human-protective and primarily reflective response to a specified incident air blast wave energy. The computer modeling of the at least two candidate reflective materials is at least partially based on (i) respective acoustic impedances of the at least two candidate reflective materials to the specified incident air blast wave energy and (ii) a layer thickness of less than about 3 mm. The respective acoustic impedances of the at least two candidate reflective materials are each substantially mismatched to the acoustic impedance of air.

FIG. 10 illustrates alternative embodiments of the reflective material selecting operation 320 of the operational flow 300 of FIG. 8. The reflective material selecting operation may include at least one alternative embodiment, such as an operation 322. The operation 322 includes selecting a layer of a first material from the at least two candidate reflective materials. The selecting based at least partially on the computer modeling of the at least two possible layers of reflective material and on providing an advantageous first human-protective and substantial reflective response to a specified incident air blast wave energy. In an embodiment, the selecting a layer of a first material includes selecting a layer of a first material providing a combat-situation appropriate first human-protective and substantial reflective response to a specified incident air blast wave energy. In an embodiment, the selecting a layer of a first material includes selecting a layer of a first material providing a combat-conditions optimized first human-protective and substantial reflective response to a specified incident air blast wave energy.

Figure 11:
FIG. 11 illustrates alternative embodiments of the attenuation modeling operation 330 of the operational flow of FIG. 8.

FIG. 11 illustrates alternative embodiments of the attenuation modeling operation 330 of the operational flow 300 of FIG. 8. The attenuation modeling operation may include at least one alternative embodiment. The at least one alternative embodiment may include an operation 332, an operation 334, an operation 336, or an operation 338. The operation 332 includes computer modeling at least two candidate attenuative materials for a second advantageous human-protective and primarily attenuative response to the specified incident air blast wave energy transmitted through the selected layer of first material. The computer modeling of the at least two candidate attenuative materials is at least partially based on respective inelastic responses of the two candidate attenuative materials to the specified incident air blast wave energy transmitted through the selected layer of first material. For example, the computer modeling at least two candidate attenuative materials for a second advantageous human-protective and primarily attenuative response may include computer modeling at least two candidate attenuative materials having a combat-conditions appropriate human-protective and primarily attenuative response to the specified incident air blast wave energy transmitted through the selected layer of first material. For example, combat conditions-appropriate candidate attenuative materials for a human-protective and primarily attenuative response may include candidate attenuative materials having a weight or configuration that a soldier is reasonably likely to wear in a combat conditions. For example, the computer modeling at least two candidate attenuative materials may include computer modeling at least two candidate attenuative materials for a combat-conditions optimized candidate attenuative materials for a human-protective and primarily attenuative response. For example, the combat-conditions optimized candidate attenuative materials for human-protective and primarily attenuative response may include candidate attenuative materials reasonably attainable within weight, environment, or budgetary restrictions imposed on combat equipment.

The operation 334 includes computer modeling at least two candidate attenuative materials for a second human-protective and primarily attenuative response to the specified incident air blast wave energy transmitted through the selected layer of the first material. The computer modeling of the at least two candidate attenuative materials is at least partially based on (i) respective inelastic responses of the two candidate attenuative materials to the specified incident air blast wave energy transmitted through the selected layer of the first material and (ii) a layer thickness of less than about 3 cm. The operation 336 includes computer modeling at least two candidate attenuative materials for a second human-protective and primarily attenuative response to the specified incident air blast wave energy transmitted through the selected layer of the first material. The computer modeling of the at least two candidate attenuative materials is at least partially based on (i) respective inelastic responses of the two candidate attenuative materials to the specified incident air blast wave energy transmitted through the layer of the selected layer of the first material and (ii) a layer thickness of less than about 2 cm. The operation 338 includes computer modeling at least two candidate attenuative materials for a second human-protective and primarily attenuative response to the specified incident air blast wave energy transmitted through the selected layer of the first material. The computer modeling of the at least two candidate attenuative materials is at least partially based on (i) respective inelastic responses of the two candidate attenuative materials to the specified incident air blast wave energy transmitted through the selected layer of the first material and (ii) a layer thickness of less than about 1 cm.

FIG. 12 illustrates alternative embodiments of the attenuation modeling operation 330 of the operational flow 300 of FIG. 8. The attenuation modeling operation may include at least one alternative embodiment. The at least one alternative embodiment may include an operation 342, an operation 344, an operation 346, or an operation 348. The operation 342 includes computer modeling at least two candidate attenuative materials for a second human-protective and primarily attenuative response to the specified incident air blast wave energy transmitted through the selected layer of the first material. The computer modeling of the at least two candidate attenuative materials is at least partially based on acoustic absorption provided by respective inelastic responses of the two candidate attenuative materials to the specified incident air blast wave energy transmitted through the selected layer of the first material. The operation 344 includes computer modeling at least two candidate attenuative materials for a second human-protective and primarily attenuative response to the specified incident air blast wave energy transmitted through the selected layer of the first material. The computer modeling of the at least two candidate attenuative materials is at least partially based on respective inelastic crush responses of the two candidate attenuative materials to the specified incident air blast wave energy transmitted through the selected layer of the first material. The operation 346 includes computer modeling at least two candidate attenuative materials for a second human-protective and primarily attenuative response to the specified incident air blast wave energy transmitted through the selected layer of the first material. The computer modeling of the at least two candidate attenuative materials is at least partially based on respective inelastic crush responses of the two candidate attenuative materials to the specified incident air blast wave energy transmitted through the selected layer of the first material at an overpressure greater than about 1 bar. The operation 348 includes computer modeling at least two candidate attenuative materials for a second human-protective and primarily attenuative response to the specified incident air blast wave energy transmitted through the selected layer of the first material. The computer modeling of the at least two candidate attenuative materials is at least partially based on respective inelastic crush responses of the two candidate attenuative materials to the specified incident air blast wave energy transmitted through the selected layer of the first material at an overpressure greater than about 3 bar.

FIG. 13 illustrates alternative embodiments of the attenuation modeling operation 330 of the operational flow 300 of FIG. 8. The attenuation modeling operation may include at least one alternative embodiment. The at least one alternative embodiment may include an operation 352, or an operation 354. The operation 352 includes computer modeling at least two candidate attenuative materials for a second human-protective and primarily attenuative response to the specified incident air blast wave energy transmitted through the selected layer of the first material. The computer modeling of the at least two candidate attenuative materials is at least partially based on respective inelastic crush responses of the two candidate attenuative materials to the specified incident air blast wave energy transmitted through the selected layer of the first material at an overpressure greater than about 6 bar. The operation 354 includes computer modeling at least two candidate attenuative materials for a second human-protective and primarily attenuative response to the specified incident air blast wave energy transmitted through the selected layer of the first material. The computer modeling of the at least two candidate attenuative materials is at least partially based on respective inelastic crush responses of the two candidate attenuative materials to the specified incident air blast wave energy transmitted through the selected layer of the first material at an overpressure greater than about 10 bar.

FIG. 14 illustrates alternative embodiments of the attenuation material selecting operation 360 of the operational flow 300 of FIG. 8. The attenuation material selecting operation may include an operation 362. The operation 362 includes selecting a layer of a second material from the at least two candidate attenuative materials. The selecting based at least partly on the computer modeling of the at least two layers of attenuative material and on providing an advantageous second human-protective and substantial attenuative response to the specified incident air blast wave energy transmitted through the selected layer of the first material. For example, the selecting a layer of a second material may include selecting a layer of a second material providing a combat-situation appropriate second human-protective and substantial attenuative response to the specified incident air blast wave energy transmitted through the selected layer of the first material. For example, the selecting a layer of a second material may include selecting a layer of a second material providing a combat-conditions optimized second human-protective and substantial reflective response to the specified incident air blast wave energy transmitted through the selected layer of the first material.

Figure 15:
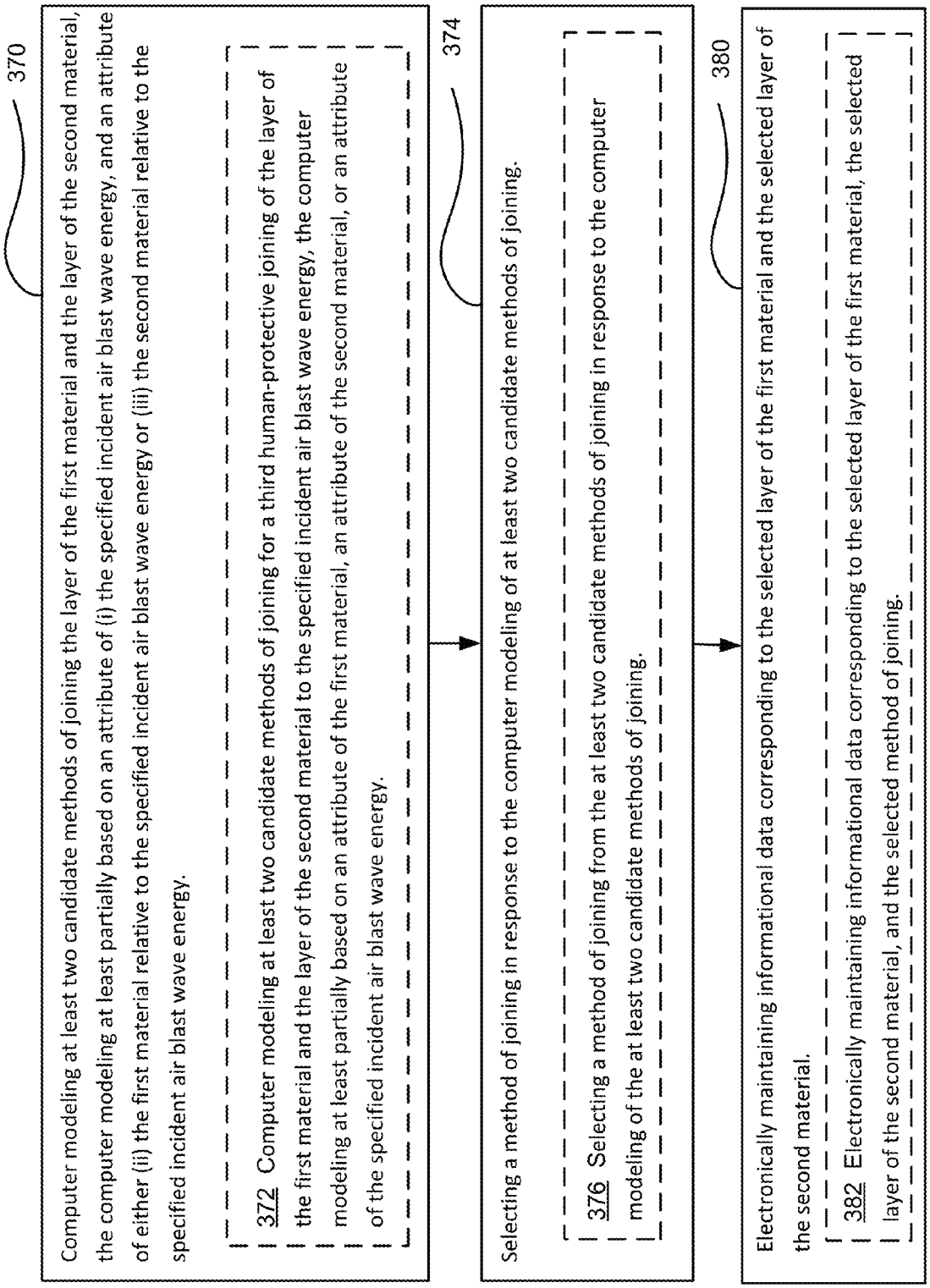
FIG. 15 illustrates alternative embodiments of operational flow of FIG. 8.

FIG. 15 illustrates alternative embodiments of operational flow 300 of FIG. 8. The operational flow 300 may include at least one alternative embodiment. The at least one alternative embodiment may include an operation 370, an operation 374, or an operation 382. The operation 370 includes computer modeling at least two candidate methods of joining the layer of the first material and the layer of the second material. The computer modeling is at least partially based on an attribute of (i) the specified incident air blast wave energy, and an attribute of either (ii) the first material relative to the specified incident air blast wave energy or (iii) the second material relative to the specified incident air blast wave energy. For example, the computer modeling may be at least partially based on at least one of a thickness, orientation, affixation, adhere, or acoustic parameter of a candidate method of joining. For example, the computer modeling may be at least partially based on at least one of an absence or presence of an acoustic joining compound or structure. For example, the computer modeling may be at least partially based on at least one of a specific acoustic property of a joining compound. In an embodiment, the operation 370 may include at least one alternative embodiment, such as an operation 372. The operation 372 includes computer modeling at least two candidate methods of joining for a third human-protective joining of the layer of the first material and the layer of the second material to the specified incident air blast wave energy. The computer modeling is at least partially based on an attribute of the first material, an attribute of the second material, or an attribute of the specified incident air blast wave energy.

The operation 374 includes selecting a method of joining in response to the computer modeling of at least two candidate methods of joining. In an embodiment, the operation 374 may include at least one alternative embodiment, such as an operation 376. The operation 376 includes selecting a method of joining from the at least two candidate methods of joining in response to the computer modeling of the at least two candidate methods of joining.

In an embodiment, the storage operation 380 may include at least one alternative embodiment, such as the operation 382. The operation 382 includes electronically maintaining informational data corresponding to the selected layer of the first material, the selected layer of the second material, and the selected method of joining.

Figure 16:
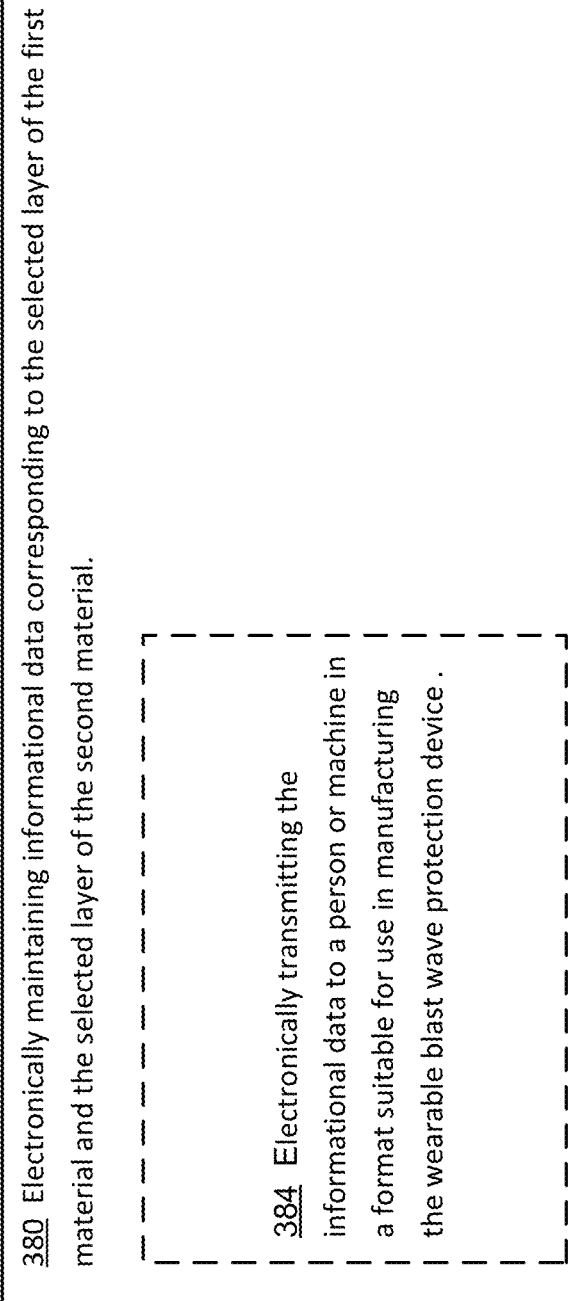
FIG. 16 illustrates alternative embodiments of the storage operation of the operational flow of FIG. 8.

FIG. 16 illustrates alternative embodiments of the storage operation 380 of the operational flow 300 of FIG. 8. The storage operation may include an alternative embodiment, such as an operation 384. The operation 384 includes electronically transmitting the informational data to a person or machine in a format suitable for use in manufacturing the wearable blast wave protection device. For example, the information data may be transmitted via email, a network, or the Internet.

FIG. 17 illustrates an example operational flow 400 in which embodiments of manufacturing a wearable air blast wave energy protection device may be implemented. After a start operation, the operational flow includes a reflective material receiving operation 410. The reflective material receiving operation includes receiving a layer of a first material selected to provide a first reflective response to a specified incident air blast wave energy. The layer of the first material was selected at least partially based on a first acoustic impedance of the first material to the specified incident air blast wave energy, and on a substantial mismatch between the first acoustic impedance and the acoustic impedance of air. In an embodiment, the layer of the first material was selected to provide a first advantageous human-protective and primarily reflective response to a specified incident air blast wave energy. For example, the reflective material receiving operation may include receiving the first layer of material 110 described in conjunction with FIG. 2.

An attenuative material receiving operation 420 includes receiving a layer of a second material selected to provide a second attenuative response to the specified incident air blast wave energy transmitted through the first material. The layer of the second material selected at least partially based on an inelastic response of the second material to the specified incident air blast wave energy transmitted through the layer of the first material. In an embodiment, the layer of the second material was selected to provide a second advantageous human-protective and primarily attenuative response to the specified incident air blast wave energy transmitted through the first material. For example, the second receiving operation may include receiving the second layer of material 120 described in conjunction with FIG. 2.

A joining operation 430 includes joining at least a portion of the first material and at least a portion of the second material. In an embodiment, the joining operation may include at least one alternative embodiment, such as an operation 432. In the operation 432, the joining is selected at least partially based on an attribute of the layer of the first material, an attribute of the layer of the second material, or an attribute of the specified incident air blast wave energy transmitted through the layer of the first material. For example, the joining of at least a portion of the first material and at least a portion of the second material may include at least one of placing merely proximate, affixing, adhering, acoustically joining, acoustically coupling, or acoustically de-coupling the first material and the second material to the specified incident air blast wave energy. For example, the joining may include a joining selected to provide a third advantageous human-protective and primarily acoustic interface between the first material and the second material to the specified incident air blast wave energy. In an embodiment, the joining includes joining to form the air blast wave energy protection device. The joining selected at least partially based on an attribute of the layer of the first material, an attribute of the layer of the second material, or an attribute of the specified incident air blast wave energy transmitted through the layer of the first material. For example, the joining of at least a portion of the first material and at least a portion of the second material may include placing the first material 110 and the second material 120 proximate 180 as described in conjunction with FIG. 2.

FIG. 18 illustrates alternative embodiments of the operational flow 400 of FIG. 17. The operational flow may include an alternative embodiment illustrated as an operation 480. The operation 480 may include at least one of an operation 442, an operation 444, an operation 446, an operation 448, or an operation 452. The operation 442 includes shaping the layer of the second material into a configuration suitable for wearing proximate to the exterior portion of the human body. The operation 444 includes shaping the joined layer of the first material and the layer of a second material into a layered physical form configured or user-configurable for wearing proximate to the exterior portion of the human body. The operation 446 includes shaping the joined layer of the first material and the layer of the second material into a physical form configured or user-configurable for wearing proximate to the exterior portion of the human body with the second layer proximate to the exterior portion of the human body. In an embodiment, the operation 446 includes shaping the joined layer of the first material and the layer of the second material into a physical form configured or user-configurable for wearing proximate to the exterior portion of the human body with the second layer proximate to the exterior portion of the human body with no substantial air gap 198 (the air gap is illustrated in FIG. 2). The operation 448 includes attaching at least a portion of the layer of the first material or the layer of the second material to a retaining strap. The retaining strap is configured to removably secure the joined layer of the first material and layer of the second material proximate to the exterior portion of the human body. In an embodiment, the retraining strap includes a chin strap. For example, the retaining strap may include a retaining strap configured in a manner similar to retaining straps on the U.S. Military's Advanced Combat Helmet (ACH) presently used in the wars in Iraq or Afghanistan. See *Technical Manual Operator's Manual for Advanced Combat Helmet (ACH)*, 0002-3, Dept. of the Army (TM 10-8470-204-14 Mar. 2008). In an embodiment, the retraining strap includes a retaining strap attached to a ballistic helmet, and at least a portion of the ballistic helmet is coupled to the layer of the first material or the layer of the second material. The operation 452 includes attaching the joined layer of the first material and the layer of the second material to a carrier shaped and configured to be secured proximate to the exterior portion of the human body. In an embodiment, the carrier is also shaped and configured to provide a protection against impacting objects. In an embodiment, the carrier is also shaped and configured to maintain a physical integrity of the coupled first material and second material before receiving an instance of the specified incident air blast wave energy.

Figure 19:
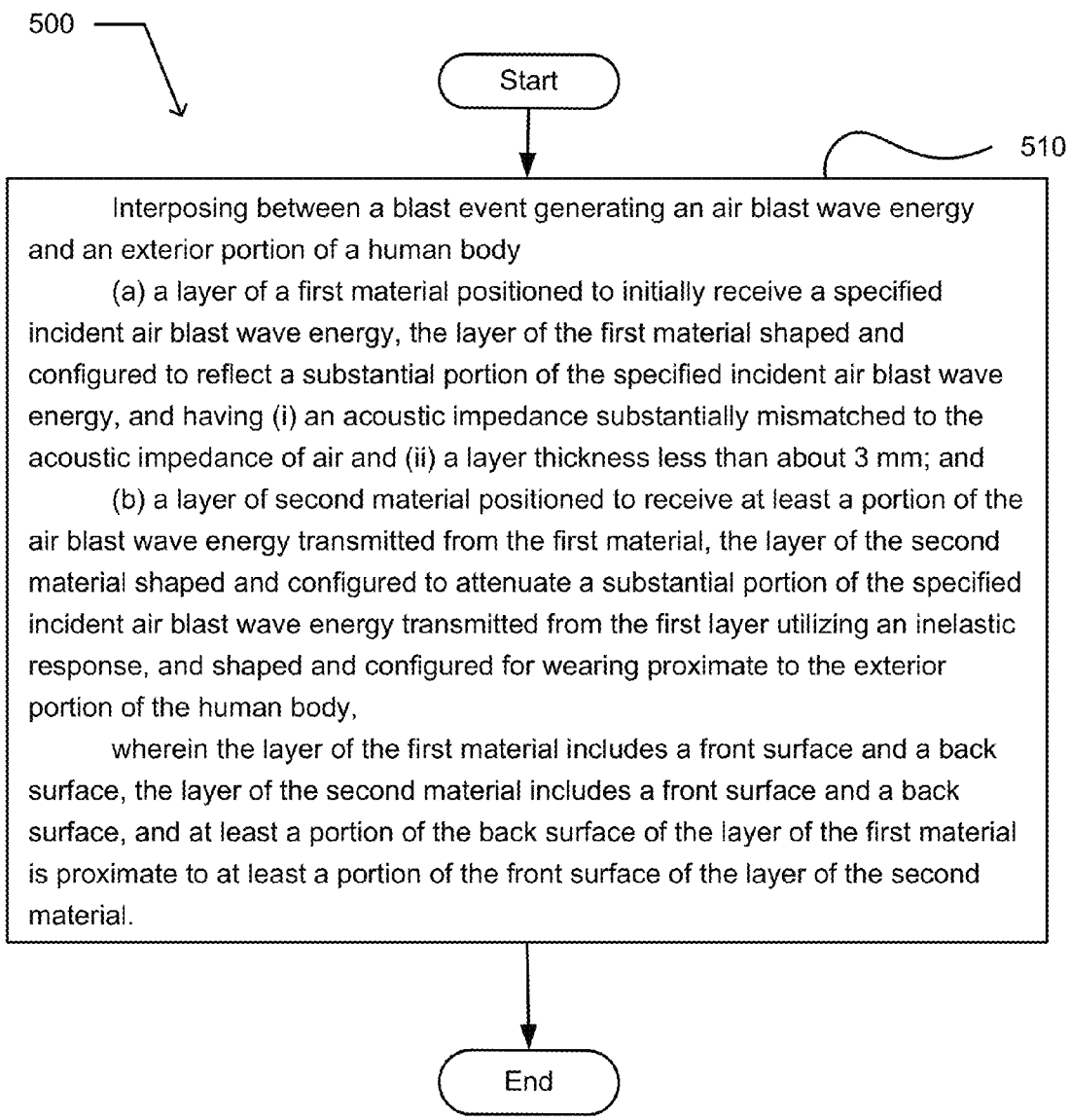
FIG. 19 illustrates an example operational flow.

FIG. 19 illustrates an example operational flow 500. The operational flow includes a start operation. The operational flow includes an operation 510. The operation 510 includes interposing between a blast event generating an air blast wave energy and the exterior portion of the human body a layer of a first material positioned to initially receive a specified incident air blast wave energy. The layer of the first material is shaped and configured to reflect a substantial portion of the specified incident air blast wave energy, and has (i) an acoustic impedance substantially mismatched to the acoustic impedance of air and (ii) a layer thickness less than about 3 mm. The operation 510 also includes interposing between the blast event generating the air blast wave energy and the exterior portion of the human body a layer of second material positioned to receive at least a portion of the air blast wave energy transmitted through the first material. The layer of the second material is shaped and configured to attenuate a substantial portion of the specified incident air blast wave energy transmitted through the layer of the first material utilizing an inelastic response, and is shaped and configured for wearing proximate to the exterior portion of the human body. The layer of the first material includes a front surface and a back surface. The layer of the second material includes a front surface and a back surface. At least a portion of the back surface of the layer of the first material is proximate to at least a portion of the front surface of the layer of the second material. The operational flow includes an end operation.

In an embodiment, the operational flow 500 may be implemented by interposing the device 101 described in conjunction with FIG. 2 between the incident air blast wave energy 197-I produced by the blast event 193 and the exterior body part portion 106 of the human body 105.

FIG. 20 illustrates alternative embodiments of the operational flow 500 of FIG. 19. The operational flow may include at least one an addition operation. The at least one alternative embodiment may include an operation 520 or an operation 530. The operation 520 includes substantially reflecting a portion the specified incident air blast wave energy utilizing the layer of the first material. The operation 530 includes substantially attenuating at least a portion of the specified incident air blast wave energy transmitted through the layer of the first material utilizing an inelastic response of the layer of the second material.

Figure 21:
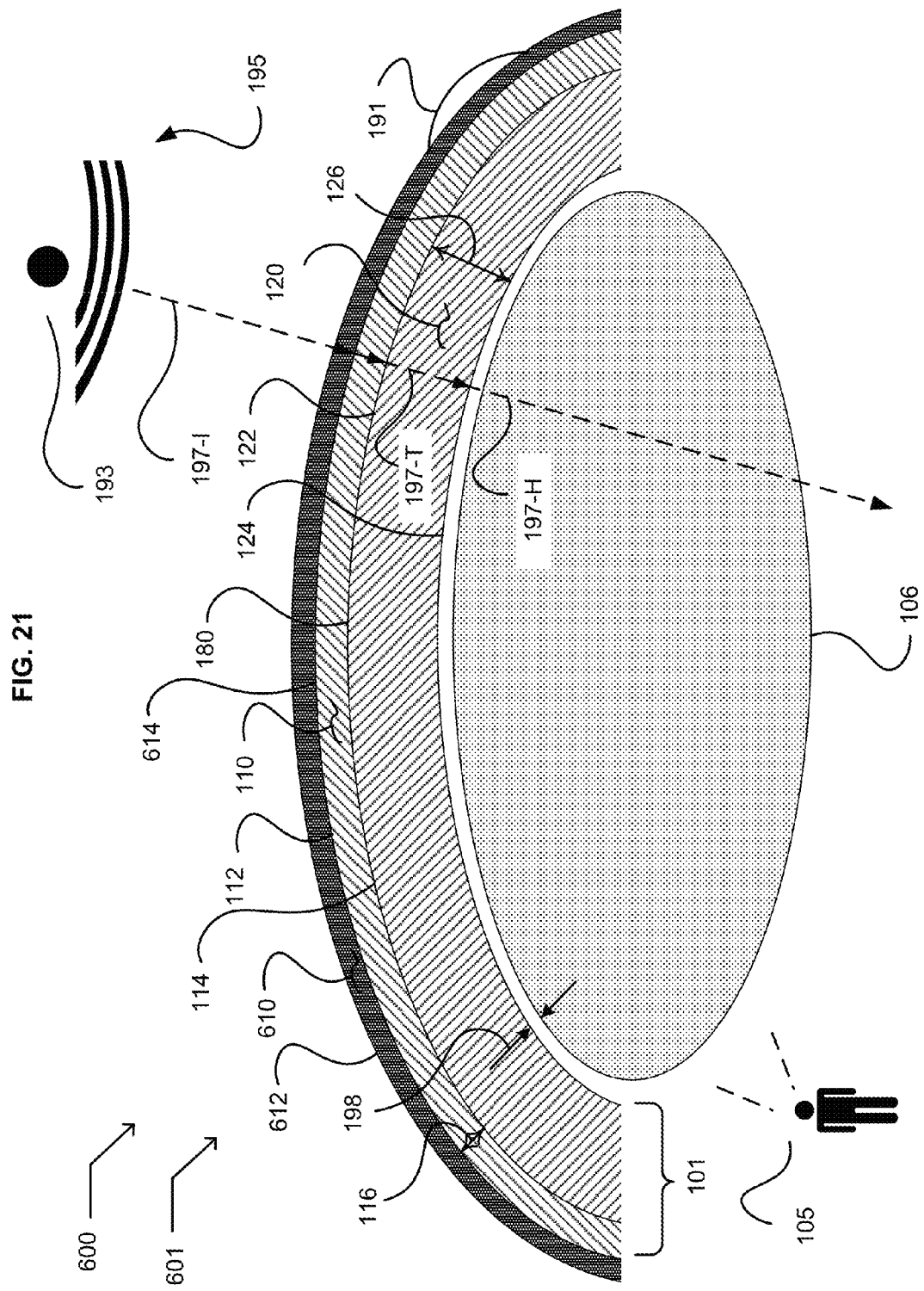
FIG. 21 illustrates an environment that includes a cross-sectional view of an example device.

FIG. 21 illustrates an environment 600 that includes a cross-sectional view of an example device 601. The device includes a layer of a ballistic material 610 shaped and configured to substantially attenuate energy of an object (not illustrated) impacting an external portion of a human body. For example, the impacting object may include a ballistic, blunt force, or shrapnel object. The device includes the air blast wave energy protection device 101 that includes the layer of the first material 110 and the layer of the second material 120. The layer of the first material 110 is shaped and configured to reflect a substantial portion of a specified incident air blast wave energy 197-I. The layer of the first material has (i) an acoustic impedance substantially mismatched to the acoustic impedance of air and (ii) a layer thickness 116 less than about 3 mm. The layer of the second material 120 is shaped and configured to attenuate a substantial portion of the specified incident air blast wave energy transmitted 197-T through the layer of the first material utilizing an inelastic response. The layer of the second material is shaped and configured for wearing proximate to the exterior portion 106 of the human body 105.

In an embodiment of the device 601, the layer of the ballistic material 610 includes a front surface 612 and a back surface 614. In an embodiment, the front surface may be considered an exterior surface of the ballistic material and the back surface may be considered an interior surface of the ballistic material. The layer of the first material 110 includes the front surface 112 and the back surface 114. The layer of the second material 120 includes the front surface 122 and the back surface 124. At least a portion of the interior surface of the layer of the ballistic material is proximate to the front surface of the layer of the first material, and at least a portion of the back surface of the layer of the first material is proximate to at least a portion of the front surface of the layer of the second material. In an embodiment of the device, at least a portion of the back surface of the layer of the first material is proximate to the front surface of the layer of the ballistic material, and at least a portion of the back surface of the layer of the ballistic material is proximate to at least a portion of the front surface of the layer of the second material (not illustrated). In an embodiment of the device, at least a portion of the back surface of the layer of the first material is proximate to the front surface of the layer of a second material, and at least a portion of the back surface of the layer of the second material is proximate to at least a portion of the front surface of the layer of the ballistic material (not illustrated).

Figure 22:
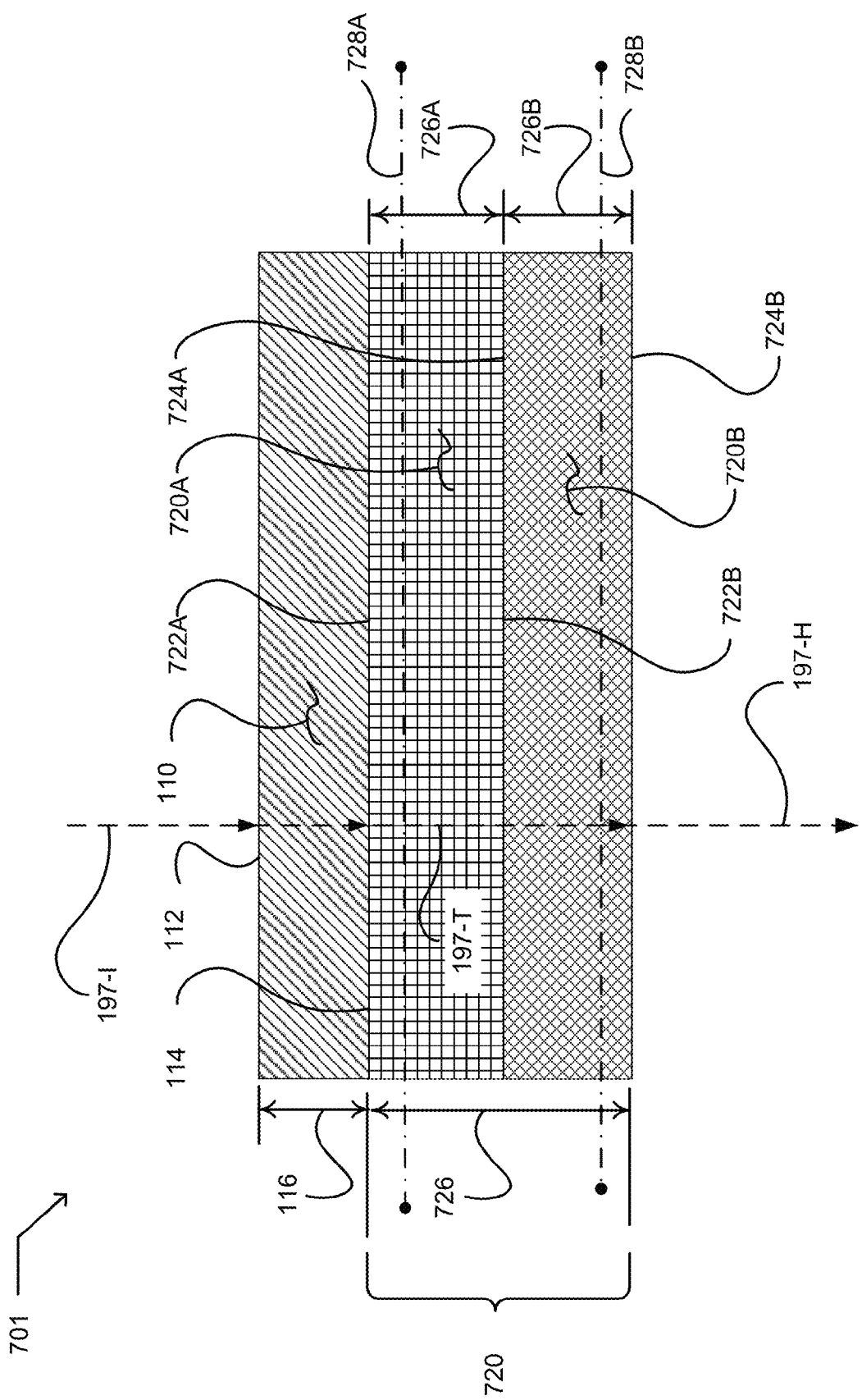
FIG. 22 illustrates a cross-sectional view of an example wearable air blast wave energy protection device.

FIG. 22 illustrates a cross-sectional view of an example wearable air blast wave energy protection device 701 that may be implemented in the environment 100 described in conjunction with FIG. 2. FIG. 23 illustrates a cross-sectional view of an alternative embodiment of the wearable air blast wave energy protection device 701 denoted as wearable air blast wave energy protection device 701.1. Continuing with FIG. 22, in an embodiment, the air blast wave energy protection device is wearable in combat situations. The wearable air blast wave energy protection device includes the layer of the first material 110 and a layer of a second material 720. The layer of the first material includes a layer of a first material shaped and configured to reflect a substantial portion of the specified incident air blast wave energy 197-I. The layer of the first material has an acoustic impedance substantially mismatched to the acoustic impedance of air. The layer of the second material includes a layer of a second material shaped and configured for wearing proximate to the exterior portion 196 of the human body 195 as illustrated in FIG. 2. The layer of the second material has a thickness 726. The second material includes two attenuating-regions. A first attenuating-region 720A has a first inelastic response to the specified incident air blast wave energy transmitted 197-T through the layer of the first material. The first attenuating-region has a thickness 726A. A second attenuating-region 720B has a second inelastic response to the specified incident air blast wave energy transmitted through the layer of the first material. In an alternative embodiment, the second material includes at least three attenuating-regions. In an alternative embodiment, the second material includes at least six attenuating-regions. The second attenuating-region has a thickness 726B.

The layer of the first material 110 includes the front surface 112 and the back surface 114. The layer of the second material 720 includes a front surface 722A and a back surface 724B. At least a portion of the back surface 114 of the layer of the first material is proximate to at least a portion of the front surface 722A of the layer of the second material. In an embodiment, at least a portion of the back surface of the layer of the first material is joined or acoustically coupled to at least a portion of the front surface of the layer of the second material.

In an embodiment, the first attenuating-region 720A is shaped and configured to substantially increase a duration of the specified incident air blast wave energy transmitted 197-T through the layer of the first material 110, and has a first inelastic response to the specified incident air blast wave energy transmitted through the layer of the first material.

In an embodiment, the layer of the second material 720 includes a layer of a second material shaped and configured for wearing proximate to the exterior portion 196 of the human body 195 and having a layer thickness 726 of less than about 5 cm. In an embodiment, the second inelastic response being substantially dissimilar from the first inelastic response. In an embodiment, the second inelastic response being substantially similar to the first inelastic response.

In an embodiment, the layer of a second material 720 includes a layer of a second material shaped and configured for wearing proximate to the exterior portion 106 of the human body 195 as illustrated in FIG. 2. The second material includes a single region presenting a graduated inelastic response to the specified incident air blast wave energy transmitted 197-T through the layer of the first material 110 (not illustrated). The graduated inelastic response having a range of inelastic responses including the first inelastic response and the second inelastic response. Examples of a graduated inelastic response across a layer of acoustic attenuating material is described in *Underwater Acoustic and Shock Absorption Performance of Syntactic Foam*, Technical Note 100-1 by Cuming Corporation of Avon, Mass., accessed at www.cumingcorp.com/pdf/cumingtechnicalnote100-1.pdf (accessed Oct. 25, 2010). For example, the graduated response may be provided by voids or by inclusions, such as microspheres or macrospheres, in the second material. For example, a graduated layer combining a variety of sizes and strengths is expected to effectively provide an inelastic response to the specified incident air blast wave energy transmitted through the layer of the first material. For example, the graduated inelastic response may be provided by a varying, stepped, or sawtooth structure having a graduated structure. As used herein for example, "graduated" may include divided by degrees, steps, or small stages of inelastic responses to the specified incident air blast wave energy transmitted through the layer of the first material. As used herein for example, "graduated" may include passing continuously from one inelastic response to another inelastic response. As used herein for example, an inelastic response may be "graduated" along an axis normal or incident to the front 722A or the back 724B surface of the layer of the second material. In an embodiment, the layer of a second material includes a layer of a second material shaped and configured for wearing proximate to an exterior portion of the human body. The second material includes a syntactic foam presenting a gradated inelastic response across the layer to the specified incident air blast wave energy transmitted through the layer of the first material. For example, the gradated inelastic response may be provided by a variety of sizes or strengths of microspheres or other inclusions distributed over a thickness of the layer of the syntactic foam.

In an embodiment, the layer of a second material 720 includes a layer of a second material shaped and configured for wearing proximate to the exterior portion 196 of the human body 195. The second material includes a first attenuating-region 720A presenting a first graduated inelastic response across the first attenuating-region to the specified incident air blast wave energy transmitted 197-T through the layer of the first material 110. The second material includes a second attenuating-region 720B presenting a second graduated inelastic response to the specified incident air blast wave energy transmitted through the layer of the first material. In an embodiment, the layer of a second material includes a layer of a second material shaped and configured for wearing proximate to an exterior portion of a human body. The second material includes an aggregation of attenuating-regions. The attenuating-regions include first attenuating-regions having a first inelastic response to the specified incident air blast wave energy transmitted through the layer of the first material. The attenuating-regions include second attenuating-regions having a second inelastic response to the specified incident air blast wave energy transmitted through the layer of the first material. In an embodiment, the layer of a second material includes a layer of a second material shaped and configured for wearing proximate to an exterior portion of a human body. The second material includes an aggregation of approximately equal volumes of at least two attenuating-regions. The at least two attenuating-regions include first attenuating-regions having a first inelastic response to the specified incident air blast wave energy transmitted through the layer of the first material. The at least two attenuating-regions include second attenuating-regions having a second inelastic response to the specified incident air blast wave energy transmitted through the layer of the first material.

In an embodiment, the layer of a second material 720 includes a layer of a second material shaped and configured for wearing proximate to the exterior portion 196 of the human body 195. The second material includes an arrangement of at least two attenuating-regions. A first attenuating-region 720A has a first inelastic response to the specified incident air blast wave energy transmitted 197-T through the layer of the first material 110. A second attenuating-region 720B has a second inelastic response to the specified incident air blast wave energy transmitted 197-T through the layer of the first material.

In an embodiment, the layer of a second material 720 includes a layer of a second material shaped and configured for wearing proximate to the exterior portion 106 of the human body 105. The second material includes an arrangement of attenuating-regions of at least two attenuating-regions. A first attenuating-region 720A has (i) a first inelastic response to the specified incident air blast wave energy transmitted through the layer of the first material and (ii) a first directional orientation 728A to the specified incident air blast wave energy transmitted 197-T through the layer of the first material. A second attenuating-region 720B has (i) a second inelastic response to the specified incident air blast wave energy transmitted through the layer of the first material and (ii) a second directional orientation 728B to the specified incident air blast wave energy transmitted through the layer of the first material. In an embodiment, a directional orientation of an attenuating-region includes a directional orientation of a major or longest axis of the attenuation region. In an embodiment, the second directional orientation is at least substantially the same as the first directional orientation. For example, FIG. 22 illustrates an embodiment where the layer of the second material 720 of the device 701 includes a second directional orientation 728B of the second attenuating-region 720B that is at least substantially the same as a first directional orientation 728A of the first attenuating-region 720A. For example, FIG. 23 illustrates an alternative embodiment device 701.1 of the device 701. The device 701.1 includes a layer of a second material 720 that includes an arrangement of at least two segments of attenuating-regions. A first attenuating-region segment 720.1 includes an attenuating-region 720A.1 and an attenuating-region 720B.1. A second attenuating-region segment 720.2 includes an attenuating-region 720A.2 and an attenuating-region 720B.2. A third-attenuating-region segment 720.3 includes an attenuating-region 720A.3 and an attenuating-region 720B.3. FIG. 23 illustrates an embodiment where the third attenuating-region segment 720.3 of the device 701.1 includes a second directional orientation 728B.3 of the second attenuating-region 720B.3 substantially similar to a first directional orientation 728A.3 of the first attenuating-region 720A.3. In an embodiment of the device 701 or the device 701.1, the second directional orientation being substantially dissimilar from the first directional orientation (not illustrated). For example, the second directional orientation 728B.3 of the second attenuating-region 720B.3 may be at least substantially normal to the first directional orientation 728A.3 of the first attenuating-region 720A.3 (not illustrated). In an embodiment of the device 701 or the alternative embodiment of the device 701.1, attenuating or sub-attenuating-regions of the layer of the second material may include an arrangement of shapes each not having a substantial directional orientation, for example, such as that illustrated in FIG. 43 for a layer of a first material 2010.

Figure 33:
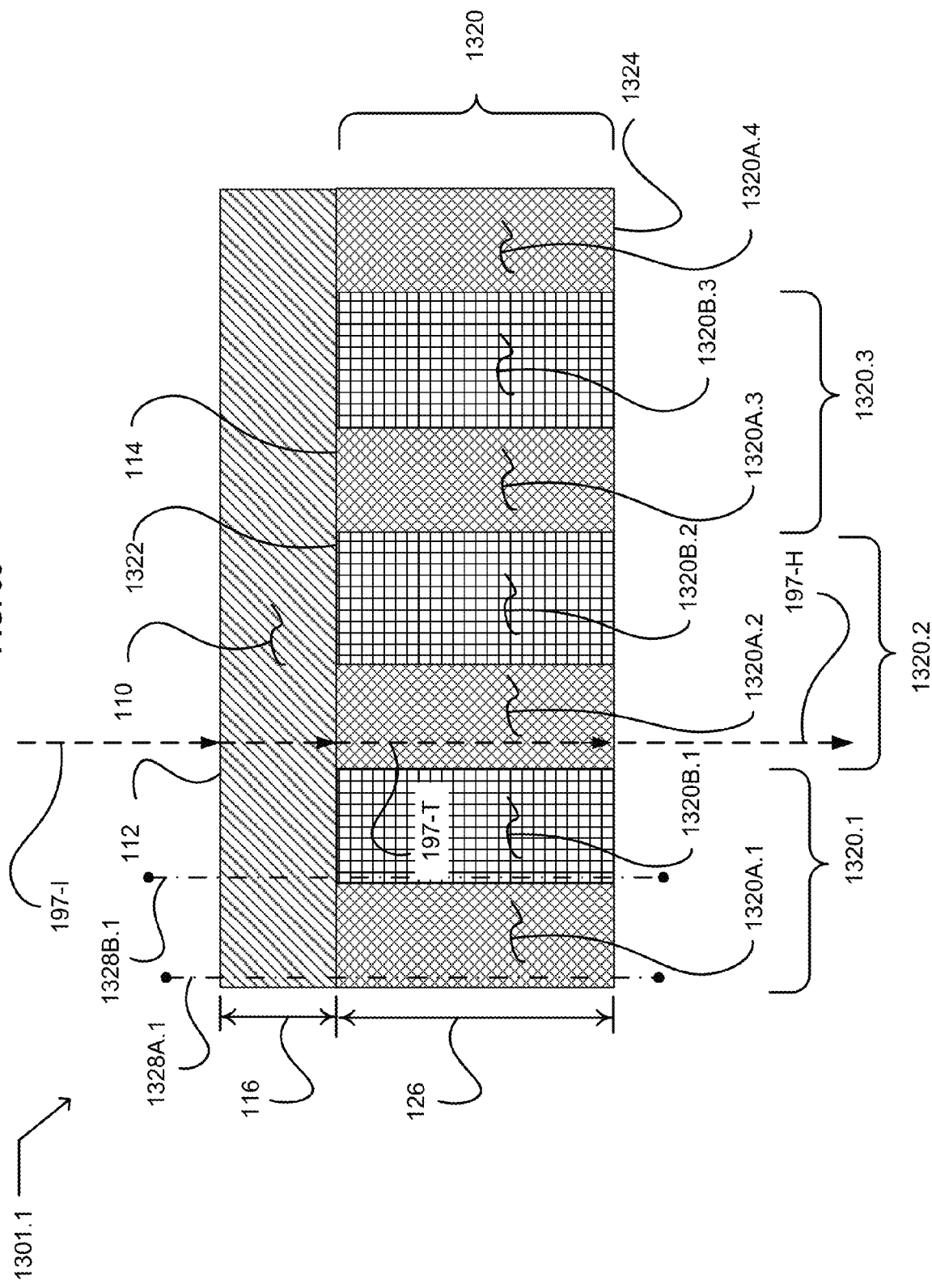
FIG. 33 illustrates a cross-sectional view of an alternative embodiment of the wearable air blast wave energy protection device.

Continuing with FIG. 22, in an embodiment, the at least two attenuating-regions are respectively formed in sub-layers each having front and back surfaces generally aligned with the interface between the layer of the first material 110 and the layer of the second material 720 as illustrated by FIG. 22. In an embodiment, the at least two attenuating-regions are respectively formed in layers each having front and back surfaces generally perpendicular to the interface between the layer of the first material 110 and the layer of the second material 720 as illustrated by FIG. 33.

Continuing with FIG. 22, in an embodiment, the layer of the second material 720 includes a layer of a second material shaped and configured for wearing proximate to the exterior portion 106 of the human body 105. The second material includes at least two segments respectively having at least two attenuating-regions. A first segment of the at least two segments includes a first attenuating-region of the at least two attenuating-regions having a first inelastic response to the specified incident air blast wave energy transmitted 197-T through the layer of the first material. The first segment includes a second attenuating-region of the at least two attenuating-regions having a second inelastic response to the specified incident air blast wave energy transmitted through the layer of the first material. For example, the first sub-layer of attenuating-regions may include the attenuating-region 720A and the attenuating-region 720B. The second sub-layer of attenuating-regions may include another pair of attenuating-regions.

FIG. 23 illustrates an alternative embodiment of the device 701.1. In this alternative embodiment, the layer of the second material 720 includes a layer of a second material shaped and configured for wearing proximate to the exterior portion 106 of the human body. The second material includes at least two segments respectively having attenuating-regions, such as a first segment 720.1, a second segment 720.2, and a third segment 720.3. A first attenuating-region 720A.1 of the first segment 720.1 of the at least two segments has a first inelastic response to the specified incident air blast wave energy transmitted 197-T through the layer of the first material 110. A second attenuating-region 720B.1 of the first segment 720.1 of the at least two segments has a second inelastic response to the specified incident air blast wave energy transmitted through the layer of the first material.

In an embodiment (not illustrated), the layer of a second material 720 includes a layer of a second material shaped and configured for wearing proximate to the exterior portion 106 of the human body 105. The second material includes at least three attenuating-regions (not illustrated). The at least three attenuating-regions include a first attenuating-region having a first inelastic response to the specified incident air blast wave energy transmitted 197-T through the layer of the first material 110. The at least three attenuating-regions include a second attenuating-region having a second inelastic response to the specified incident air blast wave energy transmitted through the layer of the first material. The at least three attenuating-regions include a third attenuating-region having a third inelastic response to the specified incident air blast wave energy transmitted through the layer of the first material.

Returning to FIG. 22, in an embodiment, the layer of a second material 720 includes a layer of a second material shaped and configured to inelastically attenuate the specified incident air blast wave energy transmitted 197-T through the layer of the first material 110 by at least 3 dB, and for wearing proximate to an exterior portion of a human body. In an embodiment, the layer of a second material includes a layer of a second material shaped and configured to inelastically attenuate the specified incident air blast wave energy transmitted through the layer of the first material by at least 6 dB, and for wearing proximate to an exterior portion of a human body. In an embodiment, the layer of a second material includes a layer of a second material shaped and configured to inelastically attenuate the specified incident air blast wave energy transmitted through the layer of the first material by at least 10 dB, and for wearing proximate to an exterior portion of a human body. In an embodiment, the layer of a second material includes a layer of a second material shaped and configured to inelastically attenuate the specified incident air blast wave energy transmitted through the layer of the first material by at least 20 dB, and for wearing proximate to an exterior portion of a human body. In an embodiment, the layer of a second material includes a layer of a second material shaped and configured to inelastically attenuate the specified incident air blast wave energy transmitted through the layer of the first material by at least 30 dB, and for wearing proximate to an exterior portion of a human body.

In an embodiment, the wearable air blast wave energy protection device 701 includes a label (not illustrated) indicating use of the device is limited to single exposure to the specified air blast wave energy 197-I. In an embodiment, the device includes an indicator configured to provide a human-perceivable indication that the device has been exposed to an air blast wave energy, such as the specified incident air blast wave energy. An embodiment of the indicator includes the indicator 191 described in conjunction with FIG. 2.

In an embodiment, the device 701 includes a spall liner shaped (not illustrated) and configured to restrain at least one fragment broken from the layer of the first material 110 by the specified incident air blast wave energy 197-I. For example, the spall liner may be at least substantially similar to the spall liner 140 described in conjunction with FIGS. 5 and 6. In an embodiment, the layer of the first material includes the front surface 112 and the back surface 114, the layer of the second material 720 includes the front surface 722A and the back surface 724B, and the spall liner 140 includes the front surface 142 and the back surface 144. In an embodiment, at least a portion of the back surface of the layer of the first material is proximate to at least a portion of the front surface of the spall liner, and at least a portion of the back surface of the spall liner is proximate to the front surface of the layer of the second material. In an embodiment, at least a portion of the back surface of the layer of the first material is proximate to at least a portion of the front surface of the spall liner, and at least a portion of the back surface of the spall liner is joined or acoustically coupled to the front surface of the layer of the second material. For example, see FIG. 5. In an embodiment, at least a portion of the back surface of the layer of the first material is proximate to at least a portion of the front surface of the layer of the second material, and at least a portion of the back surface of the layer of the second material is proximate to at least a portion of the front surface of the spall liner. For example, see FIG. 6.

In an embodiment, the wearable air blast wave energy protection device 701 includes a layer of ballistic material (not illustrated) shaped and configured to substantially attenuate energy of an object impacting the exterior portion of the human body. For example, the layer of ballistic material may be at least substantially similar to the layer of ballistic material 170 described in conjunction with FIG. 7. In an embodiment, the layer of the first material 110 includes the front surface 112 and the back surface 114, the layer of the second material 720 includes the front surface and the back surface, the layer of ballistic material 170 includes the front surface 172 and the back surface 174. In an embodiment, at least a portion of the back surface of the layer of the ballistic material is proximate to the front surface of the layer of the first material, and at least a portion of the back surface of the layer of the first material is proximate to at least a portion of the front surface of the second material. In an embodiment, at least a portion of the back surface of the layer of the first material is proximate to the front surface of the layer of the ballistic material, and at least a portion of the back surface of the layer of the ballistic material proximate to at least a portion of the front surface of the layer of the second material. In an embodiment, at least a portion of the back surface of the layer of the second material is proximate to at least a portion of the front surface of the layer of the ballistic material. In an embodiment, the wearable air blast wave energy protection device includes a retaining apparatus (not illustrated) configured to hold the proximate layer of a first material and the layer of the second material adjacent to the exterior portion of a human body.

Returning to FIG. 22, FIG. 22 illustrates an embodiment of the wearable air blast wave energy protection device 701. The device includes the layer of the first material 110 shaped and configured to reflect a substantial portion of a specified incident air blast wave energy. The first material has an acoustic impedance substantially mismatched to the acoustic impedance of air. The device includes the layer of the second material 720 shaped and configured to inelastically attenuate the specified incident air blast wave energy transmitted through the layer of the first material by at least 3 dB, and for wearing proximate to an exterior portion of a human body. The second material including at least two attenuating-regions. The at least two attenuating-regions include a first attenuating-region 720A having a first inelastic response to the specified incident air blast wave energy transmitted through the layer of the first material. The at least two attenuating-regions include a second attenuating-region 720B having a second inelastic response to the specified incident air blast wave energy transmitted through the layer of the first material. Another embodiment of the device includes the layer of the first material 110 shaped and configured to reflect a substantial portion of a specified incident air blast wave energy. The first material has an acoustic impedance substantially mismatched to the acoustic impedance of air. The device includes the layer of the second material 720 shaped and configured to inelastically attenuate the specified incident air blast wave energy transmitted through the layer of the first material by at least 10 dB, and for wearing proximate to an exterior portion of a human body. The second material including at least two attenuating-regions. The at least two attenuating-regions include a first attenuating-region 720A having a first inelastic response to the specified incident air blast wave energy transmitted through the layer of the first material. The at least two attenuating-regions include a second attenuating-region 720B having a second inelastic response to the specified incident air blast wave energy transmitted through the layer of the first material.

Figure 24:
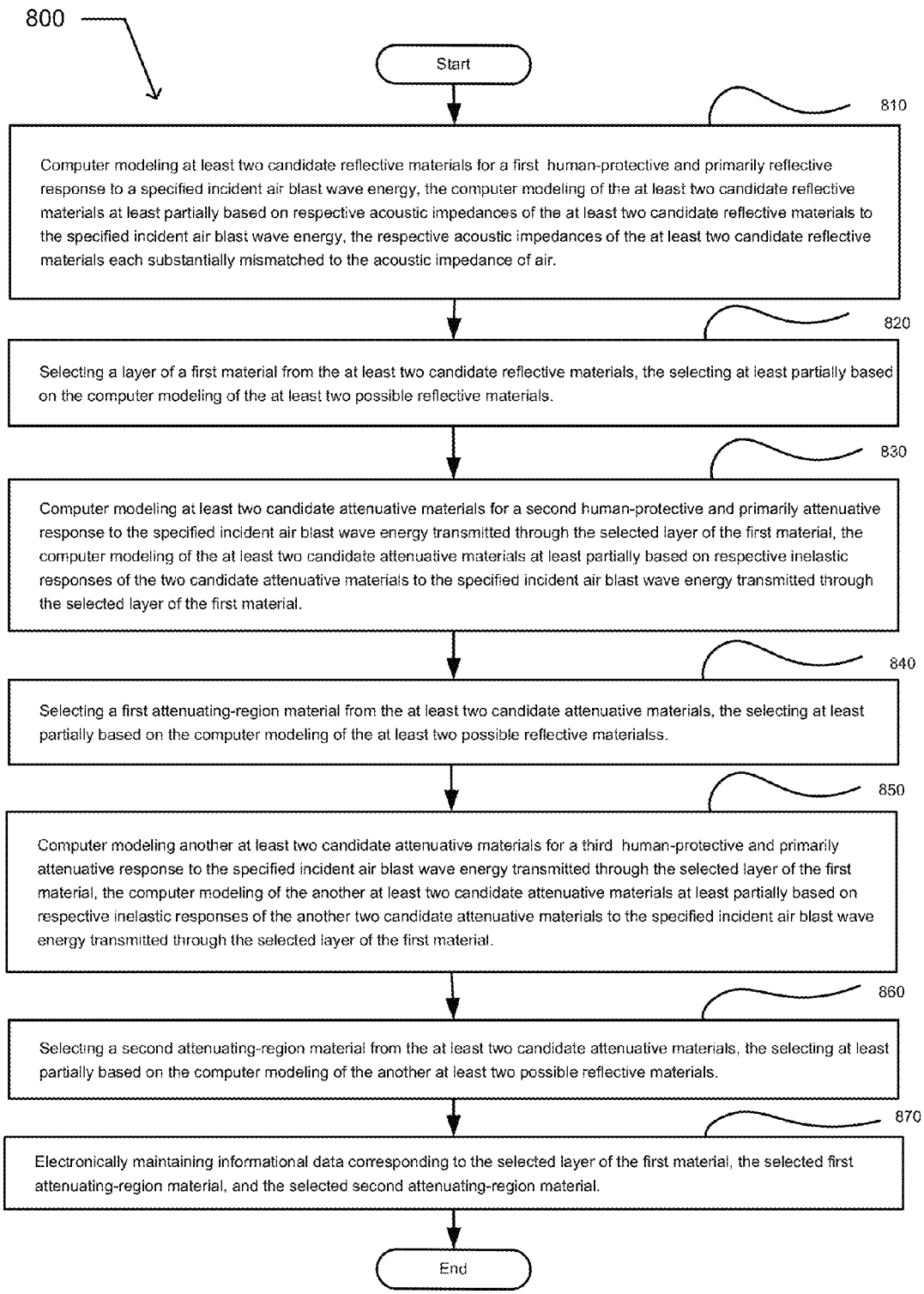
FIG. 24 illustrates an example operational flow.

FIG. 24 illustrates an example operational flow 800. After a start operation, the operational flow includes a reflection modeling operation 810. The reflection modeling operation includes computer modeling at least two candidate reflective materials for a first human-protective and primarily reflective response to a specified incident air blast wave energy. The computer modeling of the at least two candidate reflective materials is at least partially based on respective acoustic impedances of the at least two candidate reflective materials to the specified incident air blast wave energy. The respective acoustic impedances of the at least two candidate reflective materials each are substantially mismatched to the acoustic impedance of air. The air blast wave energy includes an air blast wave energy produced by a high intensity explosive. In an embodiment, the specified incident air blast wave energy includes the air blast wave 195 produced by the blast event 193 creating an energy propagating across space from the blast event and illustrated as the incident air blast wave energy 197-I described in conjunction with FIG. 2. In an embodiment, the computer modeling includes computer modeling at least two candidate reflective materials for a first advantageous human-protective and primarily reflective response to a specified incident air blast wave energy. The operational flow includes a reflective material selecting operation 820. The reflective material selecting operation includes selecting a layer of a first material from the at least two candidate reflective materials. The selecting is at least partially based on the computer modeling of the at least two candidate reflective materials. For example, the selecting a layer of a first material may include selecting the layer of the first material 110 described in conjunction with FIG. 2.

The operational flow 800 includes a first attenuation modeling operation 830. The first attenuation modeling operation includes computer modeling at least two candidate attenuative materials for a second human-protective and primarily attenuative response to the specified incident air blast wave energy transmitted through the selected layer of the first material. The computer modeling of the at least two candidate attenuative materials is at least partially based on respective inelastic responses of the two candidate attenuative materials to the specified incident air blast wave energy transmitted through the selected layer of the first material. For example, the specified incident air blast wave energy transmitted through the layer of the first material may include the specified incident air blast wave energy 197-T through the layer of the first material described in conjunction with FIG. 2. In an embodiment, the first attenuation modeling operation includes computer modeling at least two candidate attenuative materials for a second advantageous human-protective and primarily attenuative response to the specified incident air blast wave energy transmitted through the selected layer of the first material. The operational flow includes a first attenuating-region material selecting operation 840. The first attenuating-region material selecting operation includes selecting a first attenuating-region material from the at least two candidate attenuative materials. The selecting is at least partially based on the computer modeling of the at least two candidate attenuative materials. For example, the selecting the first attenuating-region material may include selecting the first-attenuating-region 720A described in conjunction with FIG. 22.

The operational flow 800 includes a second attenuation modeling operation 850. The second attenuation modeling operation includes computer modeling another at least two candidate attenuative materials for a third human-protective and primarily attenuative response to the specified incident air blast wave energy transmitted through the selected layer of the first material. The computer modeling of the another at least two candidate attenuative materials is at least partially based on respective inelastic responses of the another two candidate attenuative materials to the specified incident air blast wave energy transmitted through the selected layer of the first material. For example, at least one of the another candidate attenuative materials of the second attenuation modeling operation may be at least substantially similar to at least one of the candidate attenuative materials of the first attenuation modeling operation. In an embodiment, the second attenuation modeling operation includes computer modeling the another at least two candidate attenuative materials for a third advantageous human-protective and primarily attenuative response to the specified incident air blast wave energy transmitted through the selected layer of the first material. The operational flow includes a second attenuating-region material selecting operation 860. The second attenuating-region material selecting operation includes selecting a second attenuating-region material from the at least two candidate attenuative materials. The selecting is at least partially based on the computer modeling of the another at least two candidate attenuative materials. For example, the selecting the second attenuating-region material may include selecting the second-attenuating-region 720B described in conjunction with FIG. 22.

The operational flow 800 includes a storage operation 870. The storage operation includes electronically maintaining informational data corresponding to the selected layer of the first material, the selected first attenuating-region material, and the selected second attenuating-region material. The operational flow includes an end operation.

Figure 25:
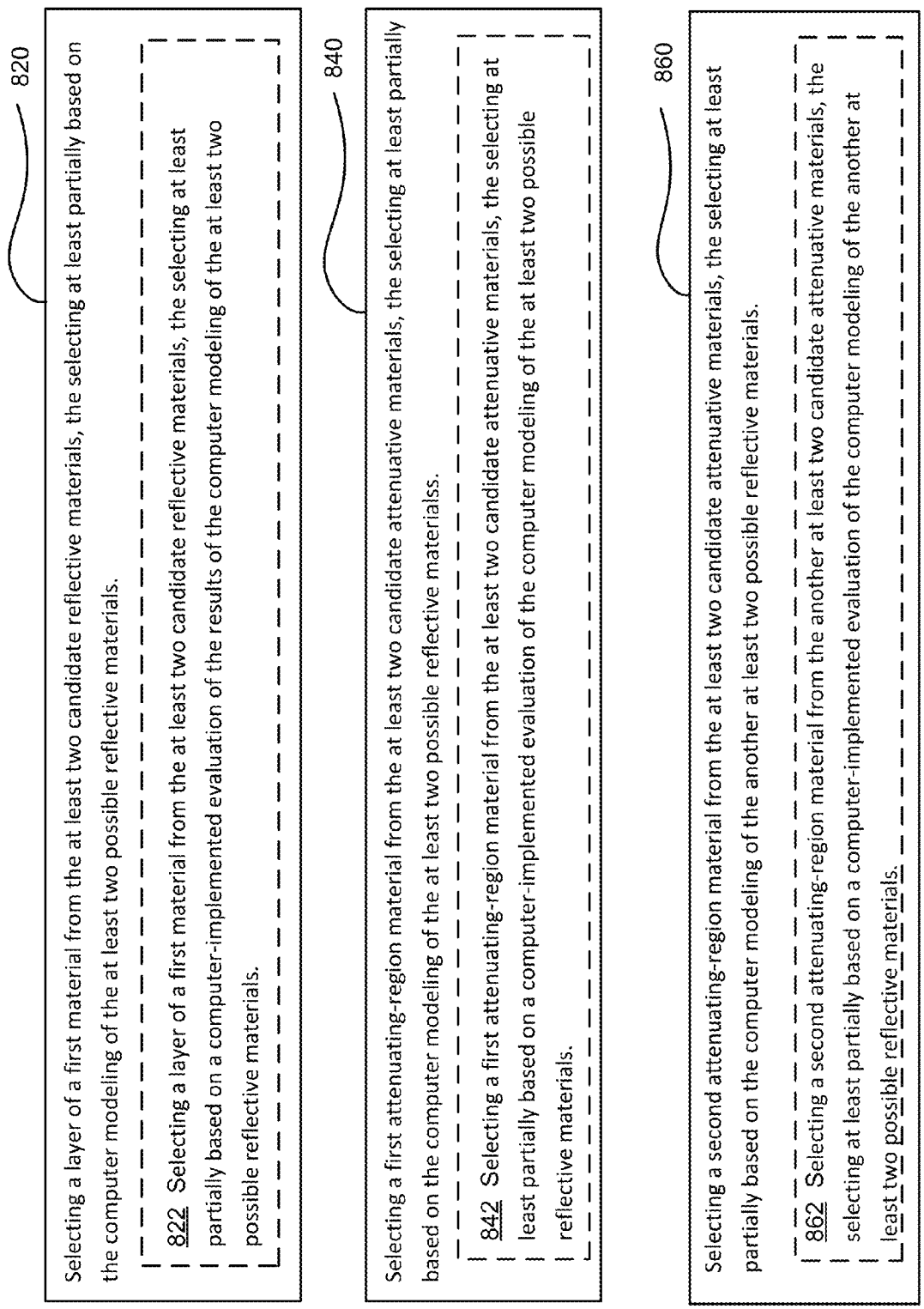
FIG. 25 illustrates alternative embodiments of the operational flow of FIG. 24.

FIG. 25 illustrates alternative embodiments of the operational flow 800 of FIG. 24. In an embodiment, the reflective material selecting operation 820 may include at least one alternative embodiment, such as an operation 822. The operation 822 includes selecting a layer of a first material from the at least two candidate reflective materials. The selecting is at least partially based on a computer-implemented evaluation of the results of the computer modeling of the at least two reflective materials. In an embodiment, the first attenuating-region material selecting operation 840 may include at least one alternative embodiment, such as the operation 842. The operation 842 includes selecting a first attenuating-region material from the at least two candidate attenuative materials. The selecting is at least partially based on a computer-implemented evaluation of the computer modeling of the at least two candidate attenuative materials. In an embodiment, the second attenuating-region material selecting operation 860 may include at least one alternative embodiment, such as the operation 842. The operation 862 includes selecting a second attenuating-region material from the another at least two candidate attenuative materials. The selecting is at least partially based on a computer-implemented evaluation of the computer modeling of the another at least two attenuative materials.

Figure 26:
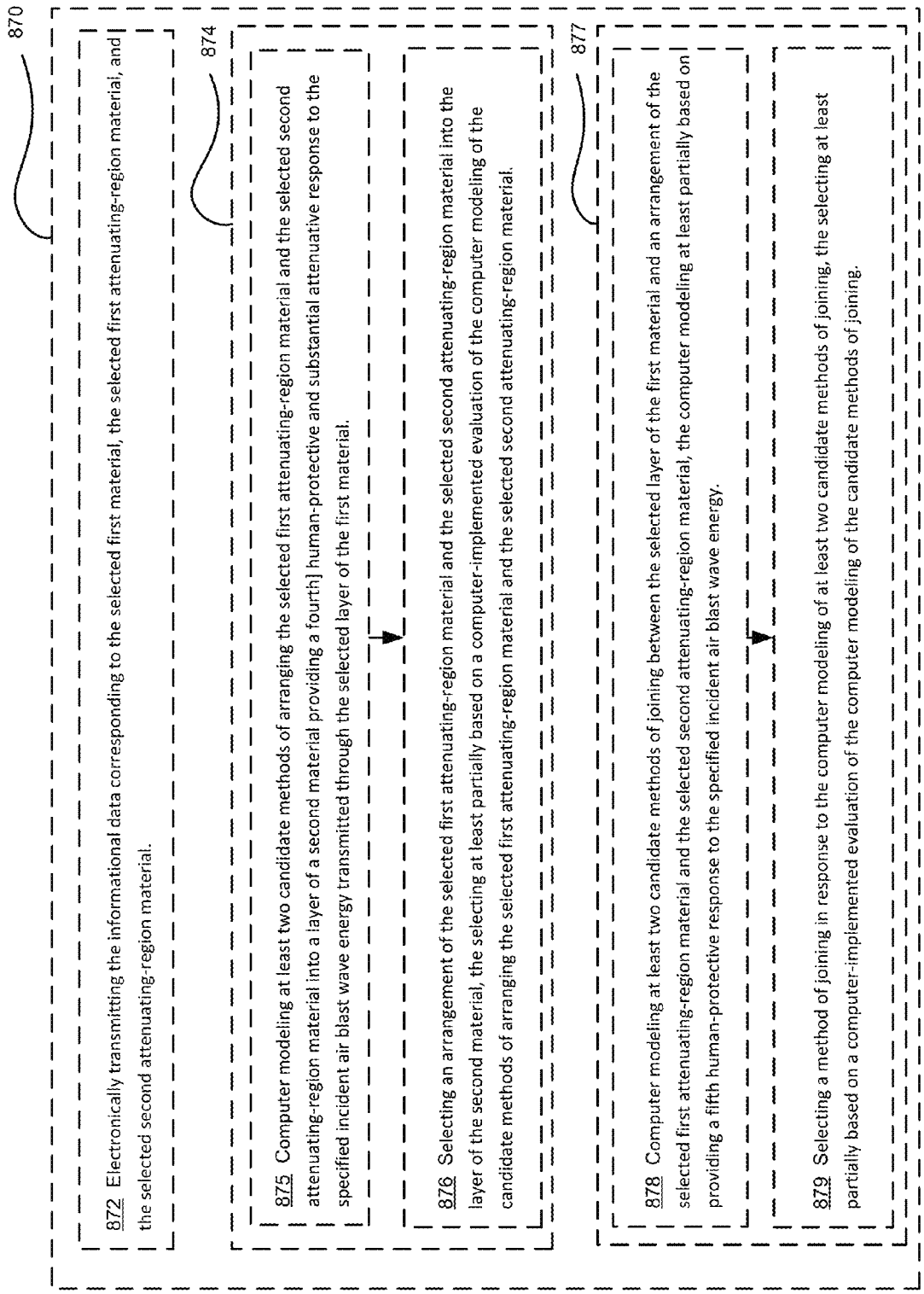
FIG. 26 illustrates alternative embodiments of the operational flow of FIG. 24.

FIG. 26 illustrates alternative embodiments of the operational flow 800 of FIG. 24. The operational flow 800 may include at least one alternative embodiment. The at least one alternative embodiment may include an operation 870. The operation 870 may include an operation 872, an operation 874, or an operation 877. The operation 872 includes electronically transmitting the informational data corresponding to the selected first material, the selected first attenuating-region material, and the selected second attenuating-region material. For example, "electronically transmitting" may include electronically transmitting to person or a machine the informational data corresponding to the selected first material, the selected first attenuating-region material, and the selected second attenuating-region material. For example, "electronically transmitting" may include electronically transmitting via email or an electronic network the informational data corresponding to the selected first material, the selected first attenuating-region material, and the selected second attenuating-region material.

The operation 874 includes an operation 875 and an operation 876. The operation 875 includes computer modeling at least two candidate arrangements of the selected first attenuating-region material and the selected second attenuating-region material into a layer of a second material providing a fourth human-protective and substantial attenuative response to the specified incident air blast wave energy transmitted through the selected layer of the first material. In an embodiment, the fourth human-protective and substantial attenuative response includes a fourth advantageous human-protective and substantial attenuative response to the specified incident air blast wave energy transmitted through the selected layer of the first material. The operation 876 includes selecting an arrangement of the selected first attenuating-region material and the selected second attenuating-region material into the layer of the second material. The selecting is at least partially based on a computer-implemented evaluation of the computer modeling of the candidate arrangements of the selected first attenuating-region material and the selected second attenuating-region material. The operation 877 includes an operation 878 and an operation 879. The operation 878 includes computer modeling at least two candidate methods of joining the selected layer of the first material and the selected arrangement of the selected first attenuating-region material and the selected second attenuating-region material. The computer modeling is at least partially based on providing a fifth human-protective response to the specified incident air blast wave energy. In an embodiment, the fifth human-protective response includes a fifth advantageous human-protective response to the specified incident air blast wave energy. The operation 879 includes selecting a method of joining in response to the computer modeling of at least two candidate methods of joining. The selecting is at least partially based on a computer-implemented evaluation of the computer modeling of the candidate methods of joining.

Figure 27:
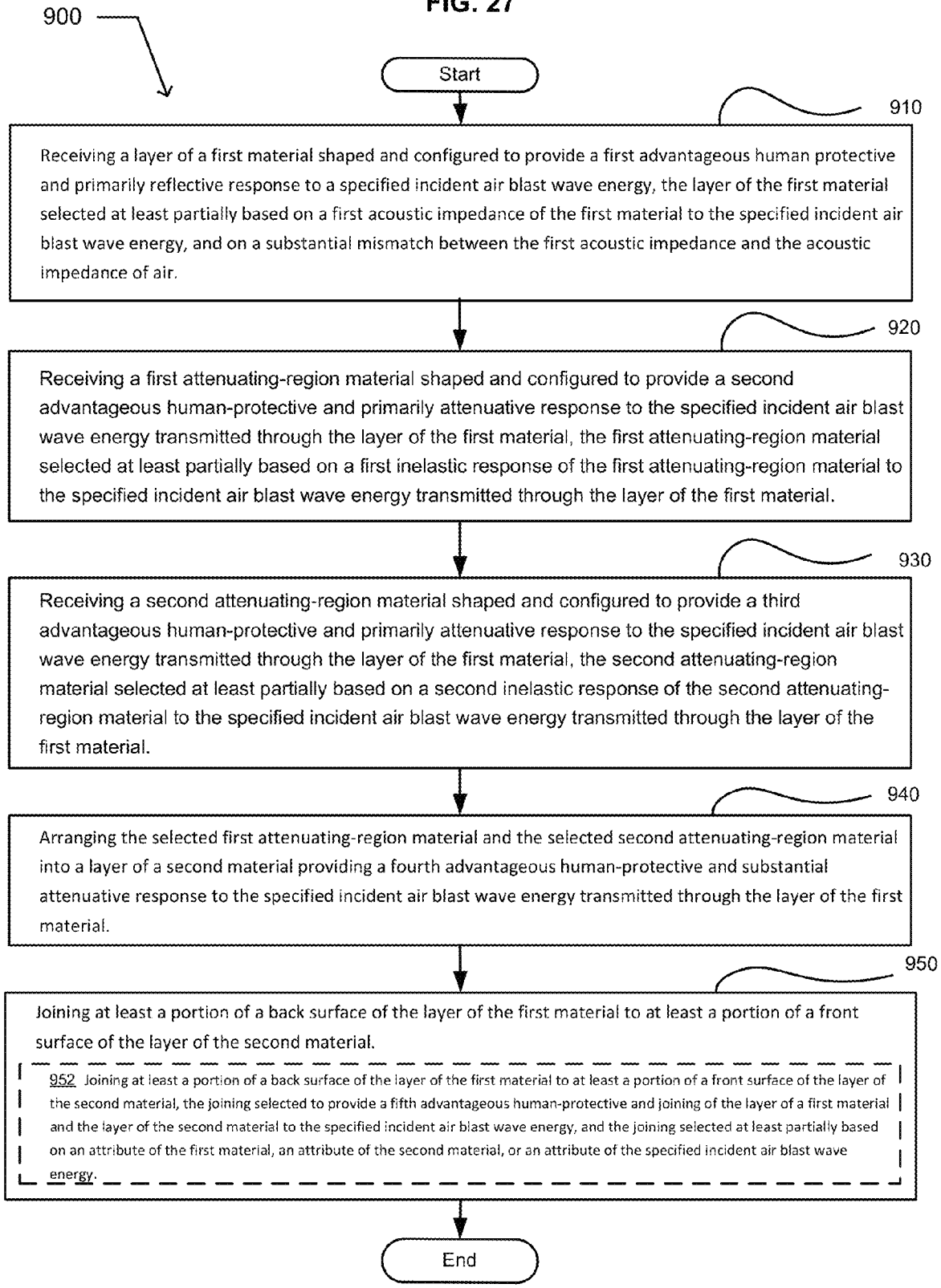
FIG. 27 illustrates an example operational flow.

FIG. 27 illustrates an example operational flow 900 for manufacturing a wearable air blast wave energy protection device. After a start operation, the operational flow includes a reflective material receiving operation 910. The reflective material receiving operation includes receiving a layer of a first material shaped and configured to provide a first advantageous human protective and primarily reflective response to a specified incident air blast wave energy. The layer of the first material selected at least partially based on a first acoustic impedance of the first material to the specified incident air blast wave energy, and on a substantial mismatch between the first acoustic impedance and the acoustic impedance of air. For example, the receiving the layer of first material may include receiving the layer of first material 110 described in conjunction with FIG. 4.

A first attenuating material receiving operation 920 includes receiving a first attenuating-region material shaped and configured to provide a second advantageous human-protective and primarily attenuative response to the specified incident air blast wave energy transmitted through the layer of the first material. The first attenuating-region material selected at least partially based on a first inelastic response of the first attenuating-region material to the specified incident air blast wave energy transmitted through the layer of the first material. For example, the receiving the first attenuating-region material may include receiving the first attenuating-region material 720A described in conjunction with FIG. 22 or the first attenuating-region material 720A.1 described in conjunction with FIG. 23.

A second attenuating material receiving operation 930 includes receiving a second attenuating-region material shaped and configured to provide a third advantageous human-protective and primarily attenuative response to the specified incident air blast wave energy transmitted through the layer of the first material. The second attenuating-region material selected at least partially based on a second inelastic response of the second attenuating-region material to the specified incident air blast wave energy transmitted through the layer of the first material. For example, the receiving the second attenuating-region material may include receiving the second attenuating-region material 720B described in conjunction with FIG. 22 or the second attenuating-region material 720B.1 described in conjunction with FIG. 23.

An arranging operation 940 includes arranging the first attenuating-region material and the second attenuating-region material into a layer of a second material providing a fourth advantageous human-protective and substantial attenuative response to the specified incident air blast wave energy transmitted through the layer of the first material. For example, the arranging may include arranging the first attenuating-region material and the second attenuating-region material into a layer of a second material as described in conjunction with FIG. 22 or 23.

A joining operation 950 includes joining at least a portion of a back surface of the layer of the first material to at least a portion of a front surface of the layer of the second material. In an embodiment, the joining operation may include at least one alternative embodiment, such as an operation 952. In the operation 952, the joining is selected to provide a fifth advantageous human-protective joining of the layer of the first material and the layer of the second material to the specified incident air blast wave energy. The joining is also selected at least partially based on an attribute of the first material, an attribute of the second material, or an attribute of the specified incident air blast wave energy. In an embodiment, the joining operation includes joining at least a portion of a back surface of the layer of the first material to at least a portion of a front surface of the layer of the second material to form the air blast wave energy protection device. In an embodiment, the joining operation includes adhering at least a portion of a back surface of the layer of the first material to at least a portion of a front surface of the layer of the second material. The operational flow includes an end operation.

Figure 28:
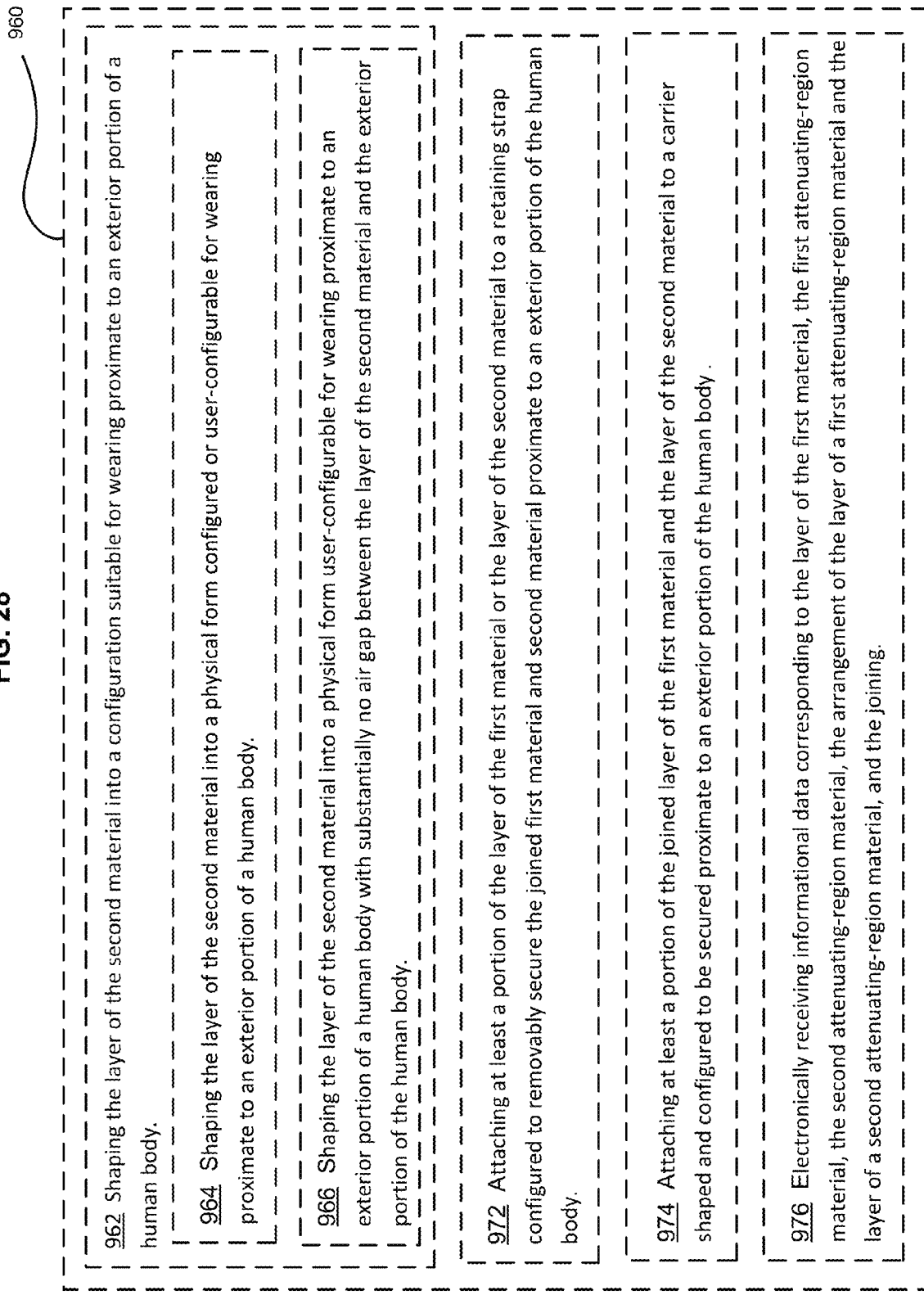
FIG. 28 illustrates an alternative embodiment of the operational flow of FIG. 27.

FIG. 28 illustrates an alternative embodiment of the operational flow 900 of FIG. 27. The operational flow 900 may include at least one alternative embodiment. The at least one alternative embodiment may include an operation 962, an operation 972, an operation 974, or an operation 976. The operation 962 includes shaping the layer of the second material into a configuration suitable for wearing proximate to an exterior portion of a human body. In an embodiment, the operation 962 may include at least one alternative embodiment, such as an operation 964 or an operation 966. The operation 964 includes shaping the layer of the second material into a physical form configured or user-configurable for wearing proximate to an exterior portion of a human body. The operation 966 includes shaping the layer of the second material into a physical form user-configurable for wearing proximate to an exterior portion of a human body with substantially no air gap between the layer of the second material and the exterior portion of the human body.

The operation 972 includes attaching at least a portion of the layer of the first material or the layer of the second material to a retaining strap configured to removably secure the joined first material and second material proximate to an exterior portion of the human body. The operation 974 includes attaching at least a portion of the joined layer of the first material and the layer of the second material to a carrier shaped and configured to be secured proximate to an exterior portion of the human body. The operation 974 includes electronically receiving informational data corresponding to the layer of the first material, the first attenuating-region material, the second attenuating-region material, the arrangement of the layer of a first attenuating-region material and the layer of a second attenuating-region material, and the joining.

Figure 29:
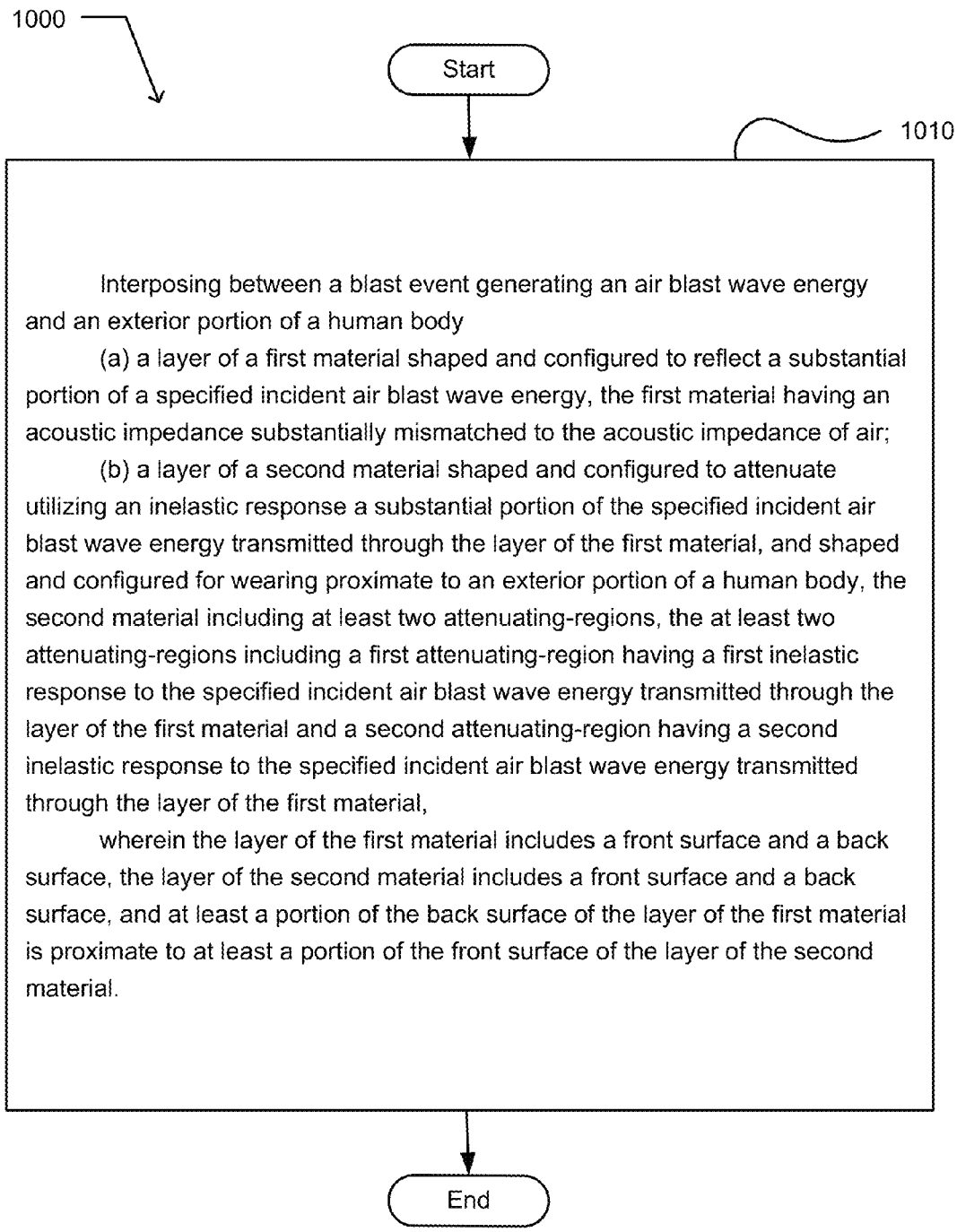
FIG. 29 illustrates an example operational flow 1000.

FIG. 29 illustrates an example operational flow 1000. The operational flow includes a start operation. The operational flow includes an operation 1010. The operation 1010 includes interposing between a blast event generating an air blast wave energy and an exterior portion of a human body a layer of a first material shaped and configured to reflect a substantial portion of a specified incident air blast wave energy. The first material has an acoustic impedance substantially mismatched to the acoustic impedance of air. The operation 1010 also includes interposing between the blast event generating an air blast wave energy and the exterior portion of the human body a layer of a second material shaped and configured to attenuate utilizing an inelastic response a substantial portion of the specified incident air blast wave energy transmitted through the layer of the first material. The layer of the second material is shaped and configured for wearing proximate to the exterior portion of the human body. The second material includes at least two attenuating-regions. The at least two attenuating-regions include a first attenuating-region having a first inelastic response to the specified incident air blast wave energy transmitted through the layer of the first material. The at least two attenuating-regions include a second attenuating-region having a second inelastic response to the specified incident air blast wave energy transmitted through the layer of the first material. The layer of the first material includes a front surface and a back surface, and the layer of the second material includes a front surface and a back surface. At least a portion of the back surface of the layer of the first material is proximate to at least a portion of the front surface of the layer of the second material. The operational flow includes an end operation.

For example, the operational flow 1000 may be implemented by interposing the device 701 described in conjunction with FIG. 22 between the incident air blast wave energy 197-I produced by the blast 193 and the exterior body part portion 106 of the human body 105.

Figure 30:
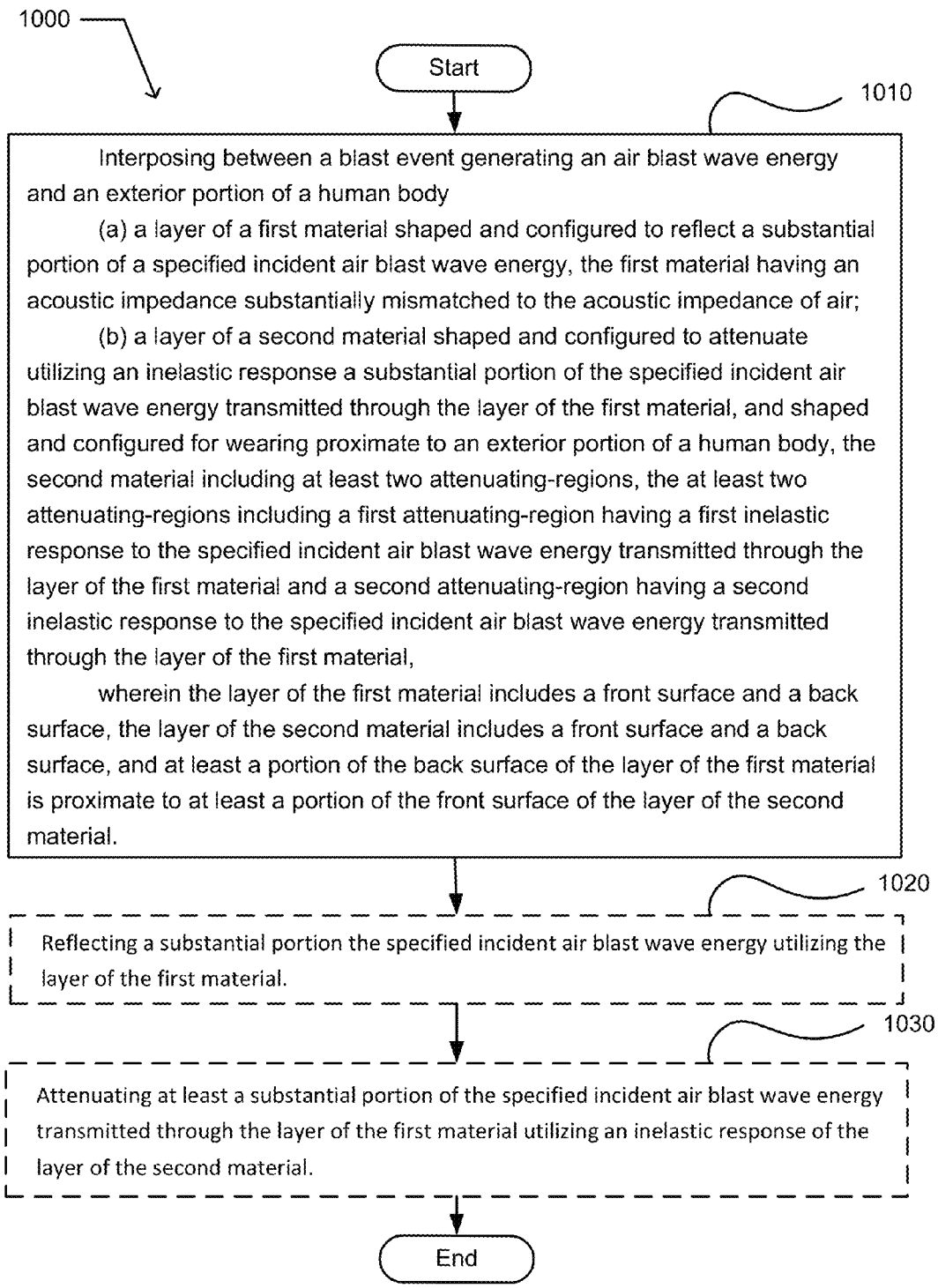
FIG. 30 illustrates alternative embodiments of the operational flow of FIG. 29.

FIG. 30 illustrates alternative embodiments of the operational flow 1000 of FIG. 29. The operational flow may include at least one alternative embodiment. The at least one alternative embodiment may include an operation 1020 or an operation 1030. The operation 1020 includes reflecting a substantial portion the specified incident air blast wave energy utilizing the layer of the first material. The operation 1030 includes attenuating at least a substantial portion of the specified incident air blast wave energy transmitted through the layer of the first material utilizing the inelastic response of the layer of the second material.

Figure 31:
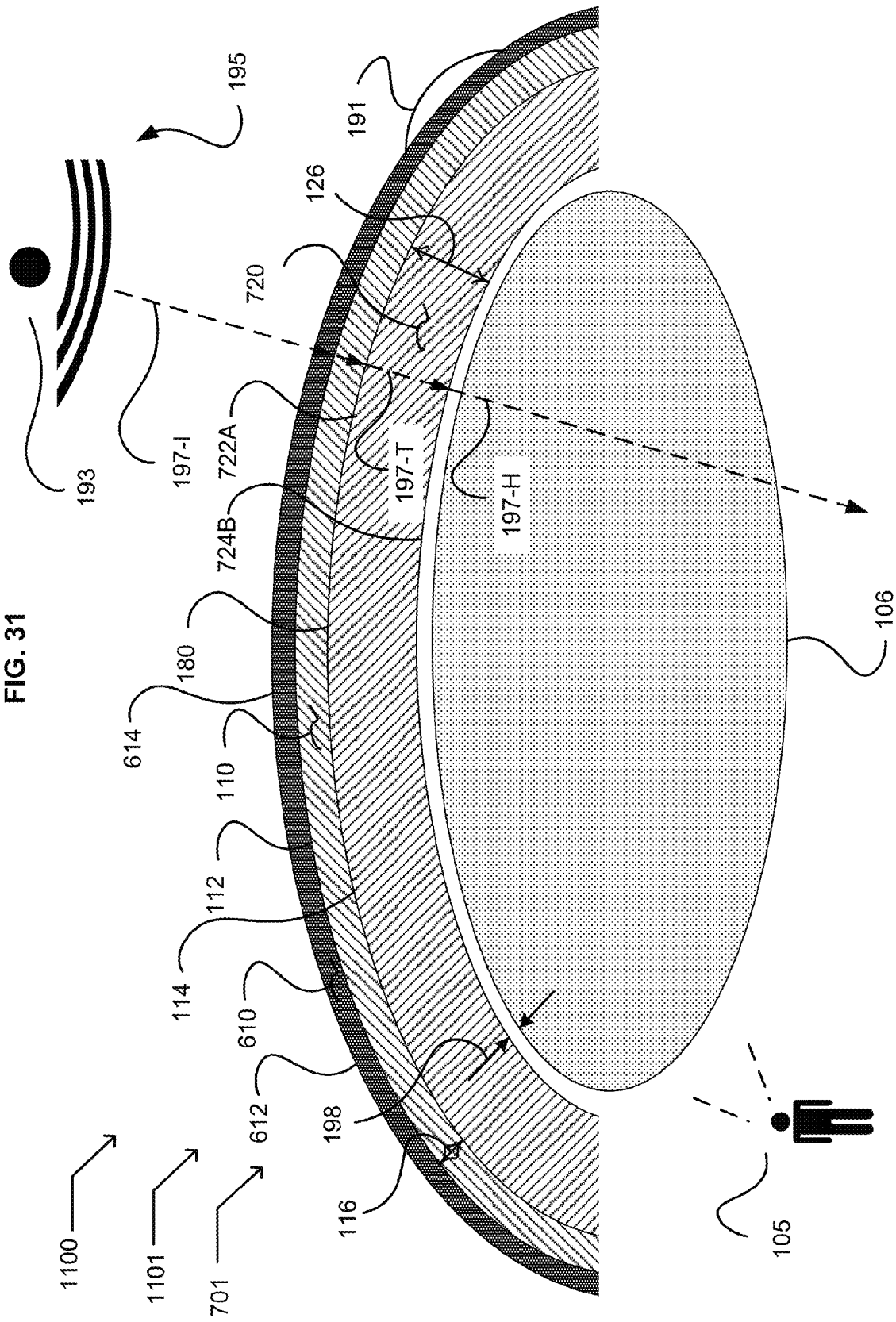
FIG. 31 illustrates an environment that includes an example device.

FIG. 31 illustrates an environment 1100 that includes example device 1101. The device includes the layer of the ballistic material 610 described in conjunction with FIG. 21. The layer of ballistic material is shaped and configured to substantially attenuate energy of an object (not illustrated) impacting the external portion 106 of the human body 105. The device 1101 includes the device 701 described in conjunction with FIG. 22 or FIG. 23. The device 701 includes the layer of the first material 110 shaped and configured to reflect a substantial portion of the specified incident air blast wave energy 197-I. The first material has an acoustic impedance substantially mismatched to the acoustic impedance of air. The device includes the layer of the second material 720 shaped and configured to attenuate a substantial portion of the specified incident air blast wave energy transmitted 197-T through the layer of the first material utilizing an inelastic response. The layer of the second material is also shaped and configured for wearing proximate to the external portion of the human body. The second material includes at least two attenuating-regions. The at least two attenuating-regions include the first attenuating-region 720A (not illustrated) having a first inelastic response to the specified incident air blast wave energy transmitted through the layer of the first material. The at least two attenuating-regions include the second attenuating-region 720B (not illustrated) having a second inelastic response to the specified incident air blast wave energy transmitted through the layer of the first material.

The layer of the ballistic material 610 includes the front surface 612 and the back surface 614. In an embodiment, the front surface may be considered an exterior surface of the ballistic material and the back surface may be considered an interior surface of the ballistic material. The layer of the first material 110 includes the front surface 112 and the back surface 114. The layer of the second material 720 includes the front surface 722 and the back surface 724. In an embodiment of the device 1101, at least a portion of the interior surface of the layer of the ballistic material is proximate to the front surface of the layer of the first material, and at least a portion of the back surface of the layer of the first material is proximate to at least a portion of the front surface of the layer of the second material. In an embodiment of the device, at least a portion of the back surface of the layer of the first material is proximate to the front surface of the layer of the ballistic material, and at least a portion of the back surface of the layer of the ballistic material is proximate to at least a portion of the front surface of the layer of the second material (not illustrated). In an embodiment of the device, at least a portion of the back surface of the layer of the first material is proximate to the front surface of the layer of a second material, and at least a portion of the back surface of the layer of the second material is proximate to at least a portion of the front surface of the layer of the ballistic material (not illustrated).

Figure 32:
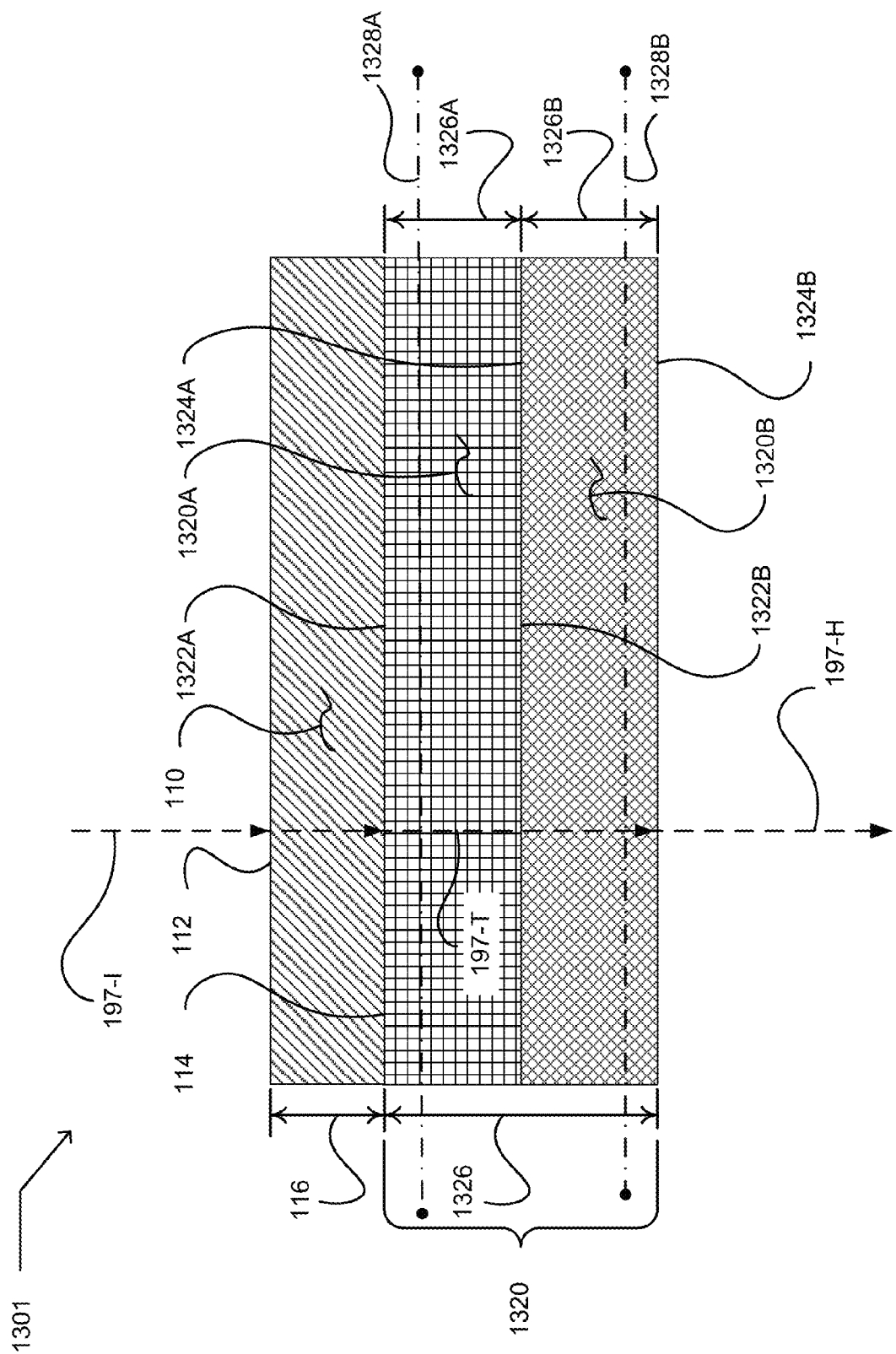
FIG. 32 illustrates a cross-sectional view of an example wearable air blast wave energy protection device.

FIG. 32 illustrates a cross-sectional view of an example wearable air blast wave energy protection device 1301 that may be implemented in the environment 100 described in conjunction with FIG. 2. FIG. 33 illustrates a cross-sectional view of an alternative embodiment of the wearable air blast wave energy protection device 1301, which is denoted as wearable air blast wave energy protection device 1301.1. Continuing with FIG. 32, in an embodiment, the wearable air blast wave energy protection device is wearable in combat situations. The wearable air blast wave energy protection device includes the layer of the first material 110 shaped and configured to reflect a substantial portion of the specified incident air blast wave energy 197-I. The first material has a first acoustic impedance substantially mismatched to the acoustic impedance of air. The wearable air blast wave energy protection device includes a layer of a second material 1320 shaped and configured for wearing proximate to the exterior portion 106 of the human body 105. The layer of the second material has a thickness 1326. The second material includes at least two attenuating-regions. The at least two attenuating-regions include a first attenuating-region 1320A configured to attenuate a first range of overpressures of the specified incident air blast wave energy transmitted 197-T through the layer of the first material 110 utilizing a first inelastic response. In an embodiment, the first attenuating-region has a first crush profile configured to attenuate a first range of overpressures, such as 4-6 bars overpressure. For example, the first crush profile may include the crush plateau zone 230 described in conjunction with FIG. 3, where the crush plateau zone corresponds to between 4-6 bars overpressure on the vertical axis for stress. The first attenuating-region includes a front surface 1322A and a back surface 1324A. The at least two attenuating-regions include a second attenuating-region 1320B configured to attenuate a second range of overpressures of the specified incident air blast wave energy transmitted through the layer of the first material utilizing a second inelastic response. In an embodiment, the second attenuating-region has second crush profile configured to attenuate a second range of overpressures, such as 2-4 bars overpressure. For example, the second crush profile may include the crush plateau zone 230 described in conjunction with FIG. 3, where the crush plateau zone corresponds to between 2-4 bars overpressure on the vertical axis for stress. The second attenuating-region includes a front surface 1322B and a back surface 1324B.

The layer of the first material 110 includes a front surface 112 and a back surface 114. The layer of the second material includes the front surface 1322A and the back surface 1324B. At least a portion of the back surface of the layer of the first material is proximate to at least a portion of the front surface of the layer of the second material.

In an embodiment, the at least two attenuating-regions are respectively formed in sub-layers each having front and back surfaces generally aligned with the interface between the layer of the first material 110 and the layer of the second material 1320 as illustrated by FIG. 32. In an embodiment, the at least two attenuating-regions are respectively formed in layers each having front and back surfaces generally perpendicular to the interface between the layer of the first material 110 and the layer of the second material 1320 as illustrated by FIG. 33.

In an embodiment, the first material 110 includes at least two reflective-regions. The at least two reflective-regions include a first reflective-region having a first acoustic impedance substantially mismatched to the acoustic impedance of air. The at least two reflective-regions include a second reflective-region having a second acoustic impedance substantially less than the first acoustic impedance. For example, FIGS. 42 and 43 below respectively illustrate a first reflective region 2010A and a second reflective region 2010B, and a first reflective-region 2010A.1 and a second reflective-region 2010B.1.

Continuing with FIG. 32, in an embodiment, the second material 1320 includes at least two attenuating-regions. The at least two attenuating-regions include a first attenuating-region 1310A configured to attenuate utilizing a first graduated inelastic response a first range of overpressures of the specified incident air blast wave energy transmitted 197-T through the layer of the first material 110. The at least two attenuating-regions include a second attenuating-region 1310B configured to attenuate a second range of overpressures of the specified incident air blast wave energy transmitted through the layer of the first material utilizing a second inelastic response. In an embodiment of this embodiment, the layer second material includes at least two attenuating-regions. The at least two attenuating-regions include a first attenuating-region 1310A configured to attenuate utilizing a first graduated inelastic response a first range of overpressures of the specified incident air blast wave energy transmitted 197-T through the layer of the first material 110. The at least two attenuating-regions include a second attenuating-region 1310B configured to attenuate utilizing a second graduated inelastic response a second range of overpressures of the specified incident air blast wave energy transmitted through the layer of the first material.

Continuing with FIG. 33, in an embodiment, the second material 1320 includes an aggregation of at least two attenuating-regions. The at least two attenuating-regions include first attenuating-regions 1320A [illustrated as attenuating-regions 1320A.1, 1320A.2, 1320A.3, and 1320A.4] configured to attenuate utilizing a first inelastic response a first range of overpressures of the specified incident air blast wave energy transmitted 197-T through the layer of the first material 110. The at least two attenuating-regions include second attenuating-regions 1320B [illustrated as attenuating-regions 1320B.1, 1320B.2, and 1320B.3] shaped and configured to attenuate utilizing a second inelastic response a second range of overpressures of the specified incident air blast wave energy transmitted through the layer of the first material. For example, the first attenuating-regions and the second attenuating-regions may be arranged like a stack of alternating cards. For example, the first attenuating-regions and the second attenuating-regions may be arranged or aggregated like chocolate chips and raisins in a cookie dough mixture or in a lumpy cake mixture. In an embodiment, the second material includes a second material including an aggregation of approximately equal volumes of at least two attenuating-regions. The at least two attenuating-regions include first attenuating-regions configured to attenuate utilizing a first inelastic response a first range of overpressures of the specified incident air blast wave energy transmitted through the layer of the first material. The at least two attenuating-regions include second attenuating-regions configured to attenuate utilizing a second inelastic response a second range of overpressures of the specified incident air blast wave energy transmitted through the layer of the first material.

Returning to FIG. 32, in an embodiment, the second material 1320 includes at least two attenuating-regions. The at least two attenuating-regions include first attenuating-region 1320A configured to attenuate a first range of overpressures and to substantially increase a duration of the specified incident air blast wave energy transmitted 197-T through the layer of the first material 110 utilizing a first inelastic response. The at least two attenuating-regions includes second attenuating-region 1320B is configured to attenuate a second range of overpressures of the specified incident air blast wave energy transmitted through the layer of the first material utilizing a second inelastic response.

In an embodiment of the second material 1320, the first attenuating-region 1320A is more stiff than the second attenuating-region 1320B. The stiffer first attenuating-region is positioned within the device 1301 to receive the specified incident air blast wave energy transmitted 197-T through the layer of the first material 110 before the softer second attenuating-region. In an embodiment of the second material, the first attenuating-region is more soft than the second attenuating-region 1320B. The softer first attenuating-region is positioned in the device 1301 to receive the specified incident air blast wave energy transmitted 197-T through the layer of the first material 110 before the stiffer second attenuating-region.

In an embodiment, a first attenuating-region 1320A is configured to attenuate overpressures between approximately 0.3 bar and 1 bar of the specified incident air blast wave energy transmitted 197-T through the layer of the first material 110 utilizing a first inelastic response. A second-region 1320B is configured to attenuate overpressures between approximately 0.1 bar and 0.3 bar of the specified incident air blast wave energy transmitted through the layer of the first material utilizing a second inelastic response. In an embodiment, a first attenuating-region is configured to attenuate overpressures between approximately 0.6 bar and approximately 2 bar of the specified incident air blast wave energy transmitted through the layer of the first material utilizing a first inelastic response. A second attenuating-region is configured to attenuate overpressures between approximately 0.2 bar and 0.6 bar of the specified incident air blast wave energy transmitted through the layer of the first material utilizing a second inelastic response. In an embodiment, a first attenuating-region is configured to attenuate overpressures between approximately 1.2 bar and 4 bar of the specified incident air blast wave energy transmitted through the layer of the first material utilizing a first inelastic response. A second attenuating-region is configured to attenuate overpressures between approximately 0.4 bar and 1.2 bar of the specified incident air blast wave energy transmitted through the layer of the first material utilizing a second inelastic response. In an embodiment, a first attenuating-region is configured to attenuate overpressures between approximately 1.8 bar and 6 bar of the specified incident air blast wave energy transmitted through the layer of the first material utilizing a first inelastic response. A second attenuating-region is configured to attenuate overpressures between approximately 0.6 bar and 1.8 bar of the specified incident air blast wave energy transmitted through the layer of the first material utilizing a second inelastic response. In an embodiment, a first attenuating-region is configured to attenuate overpressures between approximately 2.4 bar and 8 bar of the specified incident air blast wave energy transmitted through the layer of the first material utilizing a first inelastic response. A second attenuating-region is configured to attenuate overpressures between approximately 0.8 bar and 2.4 bar of the specified incident air blast wave energy transmitted through the layer of the first material utilizing a second inelastic response. In an embodiment, a first attenuating-region is configured to attenuate overpressures between approximately 3 bar and 10 bar of the specified incident air blast wave energy transmitted through the layer of the first material utilizing a first inelastic response. A second attenuating-region is configured to attenuate overpressures between approximately 1 bar and 3 bar of the specified incident air blast wave energy transmitted through the layer of the first material utilizing a second inelastic response.

In an embodiment, the layer of the second material 1320 includes a layer of a second material shaped and configured for wearing proximate to the exterior portion 106 of the human body 105. The second material including an arrangement of attenuating-regions. A first attenuating-region 1320A of the arrangement of attenuating-regions having (i) a first inelastic response to the specified incident air blast wave energy transmitted 197-T through the layer of the first material 110 and (ii) a first directional orientation to the specified incident air blast wave energy transmitted through the layer of the first material. A second attenuating-region of the arrangement of attenuating-regions having (i) a second inelastic response to the specified incident air blast wave energy transmitted through the layer of the first material and (ii) a second directional orientation to the specified incident air blast wave energy transmitted through the layer of the first material. In an embodiment, a directional orientation of an attenuating-region includes a directional orientation of a major or longest axis of the attenuation region. In an embodiment, the second directional orientation is at least substantially the same as the first directional orientation. For example, FIG. 32 illustrates an embodiment where the layer of the second material 1320 of the device 1301 includes a second directional orientation 1328B of the second attenuating-region 1320B being substantially similar to a first directional orientation 1328A of the first attenuating-region 1320A. In an embodiment, the layer of the second material 1320 of the device 1301 includes a second directional orientation 1328B of the second attenuating-region 1320B substantially dissimilar from a first directional orientation 1328A of the first attenuating-region 1320A (not illustrated).

In an embodiment, the at least two attenuating-regions of the layer of the second material 1320 include a first attenuating-region 1320A having a first yield stress $\sigma_{y1}$ and configured to attenuate a first range of overpressures of the specified incident air blast wave energy transmitted 197-T through the layer of the first 110 material utilizing a first inelastic response. The at least two attenuating-regions include a second attenuating-region having a second yield stress $\sigma_{y2}$ and configured to attenuate a second range of overpressures of the specified incident air blast wave energy transmitted through the layer of the first material utilizing a second inelastic response. In an embodiment, $\sigma_{y1}/\sigma_{y2}$ equals approximately 3. In an embodiment, $\sigma_{y1}/\sigma_{y2}$ equals approximately 6. In an embodiment, $\sigma_{y1}/\sigma_{y2}$ equals approximately 10. In an embodiment, "approximately" describes a range of +/−5%. In an embodiment, "approximately" describes a range of +/−10%. In an embodiment, "approximately" describes a range of +/−15%.

FIG. 33 illustrates the alternative embodiment 1301.1 of the device 1301. The device 1301.1 includes a layer of a second material 1320 that includes an arrangement of at least two segments of attenuating-regions. The at least two segments of attenuating-regions are illustrated as a first attenuating-region segment 1320.1, a second attenuating-region segment 1320.2, and a third attenuating-region segment 1320.3. In an embodiment, an attenuating-region segment of the at least two segments of attenuating-regions may include at least two portions. For example, the first attenuating-region segment 1320.1 includes a first attenuating-region portion 1320A.1 and a second attenuating-region portion 1320B.1. The first attenuating-region portion has (i) a first inelastic response to the specified incident air blast wave energy transmitted 197-T through the layer of the first material 110 and (ii) a first directional orientation 1328A.1 to the specified incident air blast wave energy transmitted through the layer of the first material. The second attenuating-region segment includes (i) a second inelastic response to the specified incident air blast wave energy transmitted through the layer of the first material and (ii) a second directional orientation 1328B.1 to the specified incident air blast wave energy transmitted through the layer of the first material. FIG. 33 illustrates an embodiment where the second directional orientation 1328B.1 being substantially similar to the first directional orientation 1328A.1. In an embodiment, the second directional orientation 1328B.1 being substantially dissimilar from the first directional orientation 1328A.1 (not illustrated). For example, the second directional orientation 1328B.1 may be at least substantially normal to the first directional orientation 1328A.1. In an embodiment of the device 1301 or the device 1301.1, the arrangement of the two segments of attenuating-regions may include an arrangement of shapes not having a substantial directional orientation, for example, such as that illustrated in FIG. 43 for a layer of a first material 2010.

Returning to FIG. 32, in an embodiment of the device 1301, the layer of the second material 1320 includes a layer of a second material configured for wearing proximate to the exterior portion 106 of the human body 105. The second material includes at least three attenuating-regions. The at least three attenuating-regions include a first attenuating-region 1320A configured to attenuate a first range of overpressures of the specified incident air blast wave energy transmitted 197-T through the layer of the first material 110 utilizing a first inelastic response. For example, the first attenuating-region may be configured to attenuate overpressures between approximately 6 and 8 bars. The at least three attenuating-regions include a second attenuating-region 1320B of the at least three attenuating-regions configured to attenuate a second range of overpressures of the specified incident air blast wave energy transmitted through the layer of the first material utilizing a second inelastic response. For example, the second attenuating-region may be configured to attenuate overpressures between approximately 4 and 6 bars. The at least three attenuating-regions include a third attenuating-region (not illustrated) configured to attenuate a third range of overpressures of the specified incident air blast wave energy transmitted through the layer of the first material utilizing a third inelastic response. For example, the third attenuating-region may be configured to attenuate overpressures between approximately 2 and 4 bars. The first attenuating-region 1320A includes a front surface 1322A and a back surface 1324A, the second attenuating-region 1320B includes a front surface 1322B and a back surface 1324B, and the third attenuating-region (not illustrated) includes a front surface (not illustrated) and a back surface (not illustrated). At least a portion of the back surface of the first attenuating-region is proximate to at least a portion of the front surface of the second attenuating-region, and at least a portion of the back surface of the second attenuating-region is proximate to at least a portion of the front surface of the third attenuating-region.

In an embodiment of the layer of the second material 1320 that includes at least three attenuating-regions, the first attenuating-region of the at least three attenuating-regions is configured to attenuate a first range of overpressures between approximately 0.3 bar and 1 bar of the specified incident air blast wave energy transmitted 197-T through the layer of the first material 110 utilizing a first inelastic response. The second attenuating-region of the at least three attenuating-regions is configured to attenuate a second range of overpressures between approximately 0.2 bar and 0.6 bar. The third attenuating-region of the at least three attenuating-regions is configured to attenuate a third range of overpressures between approximately 0.1 bar and 0.3 bar. In an embodiment of the layer of the second material 1320 that includes at least three attenuating-regions, the first attenuating-region of the at least three attenuating-regions is configured to attenuate a first range of overpressures between approximately 0.6 bar and 2 bar of the specified incident air blast wave energy transmitted through the layer of the first material utilizing a first inelastic response. The second attenuating-region is configured to attenuate a second range of overpressures between approximately 0.4 bar and 1.2 bar. The third attenuating-region is configured to attenuate a third range of overpressures between approximately 0.2 bar and 0.6 bar. In an embodiment of the layer of the second material 1320 that includes at least three attenuating-regions, the first attenuating-region of the at least three attenuating-regions is configured to attenuate a first range of overpressures between approximately 1.2 bar and 4.0 bar of the specified incident air blast wave energy transmitted through the layer of the first material utilizing a first inelastic response. The second attenuating-region is configured to attenuate a second range of overpressures between approximately 0.8 bar and 2.4 bar. The third attenuating-region is configured to attenuate a third range of overpressures between approximately 0.4 bar and 1.2 bar. In an embodiment of the layer of the second material 1320 that includes at least three attenuating-regions, the first attenuating-region of the at least three attenuating-regions is configured to attenuate a first range of overpressures between approximately 1.8 bar and 6 bar of the specified incident air blast wave energy transmitted through the layer of the first material utilizing a first inelastic response. The second attenuating-region is configured to attenuate a second range of overpressures between approximately 1.2 bar and 4.2 bar. The third attenuating-region is configured to attenuate a third range of overpressures between approximately 0.6 bar and 1.8 bar. In an embodiment of the layer of the second material 1320 that includes at least three attenuating-regions, the first attenuating-region of the at least three attenuating-regions is configured to attenuate a first range of overpressures between approximately 2.4 bar and 8.0 bar of the specified incident air blast wave energy transmitted through the layer of the first material utilizing a first inelastic response. The second attenuating-region is configured to attenuate a second range of overpressures between approximately 1.6 bar and 4.8. The third attenuating-region is configured to attenuate a third range of overpressures between approximately 0.8 bar and 2.4 bar. In an embodiment of the layer of the second material 1320 that includes at least three attenuating-regions, the first attenuating-region of the at least three attenuating-regions is configured to attenuate a first range of overpressures between approximately 3 bar and 10 bar of the specified incident air blast wave energy transmitted through the layer of the first material utilizing a first inelastic response. The second attenuating-region is configured to attenuate a second range of overpressures between approximately 2 bar and 6 bar. The third attenuating-region is configured to attenuate a third range of overpressures between approximately 1 bar and 3 bar.

In an embodiment of the layer of the second material 1320 that includes at least three attenuating-regions, the at least three attenuating-regions include a first attenuating-region having a first yield stress $\sigma_{y1}$ and configured to attenuate a first range of overpressures of the specified incident air blast wave energy transmitted through the layer of the first material utilizing a first inelastic response. The at least three attenuating-regions include a second attenuating-region having a second yield stress $\sigma_{y2}$ and configured to attenuate a second range of overpressures of the specified incident air blast wave energy transmitted through the layer of the first material utilizing a second inelastic response. The at least three attenuating-regions include a third attenuating-region having a third yield stress $\sigma_{y31}$ and configured to attenuate a third range of overpressures of the specified incident air blast wave energy transmitted through the layer of the first material utilizing a third inelastic response. In an embodiment of the at least three attenuating-regions, $\sigma_{y1} > \sigma_{y2} > \sigma_{y3}$. In an embodiment of the at least three attenuating-regions, $\sigma_{y1} > 2\sigma_{y2}$, and $\sigma_{y2} > 2\sigma_{y3}$. In an embodiment of the at least three attenuating-regions, $\sigma_{y1} > 3\sigma_{y2}$, and $\sigma_{y2} > 3\sigma_{y3}$. In an embodiment of the at least three attenuating-regions, $\sigma_{y1} > 4\sigma_{y2}$, and $\sigma_{y2} > 4\sigma_{y3}$.

In an embodiment, the layer of the second material 1320 includes a layer of a second material shaped and configured (i) for wearing proximate to the exterior portion 106 of the human body 105 and (ii) for a single exposure to the specified incident air blast wave energy transmitted 197-T through the layer of the first material 110. The second material includes attenuating-regions, illustrated as the first attenuating-region 1320A and the second attenuating-region 1320B.

In an embodiment, the device 1301 includes a label (not illustrated) indicating use of the device is limited to a single exposure to the specified incident air blast wave energy 197-I. In an embodiment, the device includes an indicator configured to provide a human-perceivable indication that the device has been exposed to an air blast wave energy, such as the specified incident air blast wave energy 197-I. An embodiment of the indicator includes the indicator 191 described in conjunction with FIG. 4.

In an embodiment, the device 1301 includes a spall liner shaped and configured to restrain at least one fragment broken from the layer of the first material 110 by the specified incident air blast wave energy 197-I. For example, the spall liner may be at least substantially similar to the spall liner 140 described in conjunction with FIGS. 5 and 6. In an embodiment, the layer of the first material 110 includes the front surface 112 and the back surface 114, the layer of the second material 1320 includes the front surface 1322A and the back surface 1324B, and the spall liner 140 includes the front surface 142 and the back surface 144. In an embodiment, at least a portion of the back surface of the layer of the first material is proximate to at least a portion of the front surface of the spall liner, and at least a portion of the back surface of the spall liner is proximate to the front surface of the layer of the second material. In an embodiment, at least a portion of the back surface of the layer of the first material is proximate to at least a portion of the front surface of the layer of the second material, and at least a portion of the back surface of the layer of the second material is proximate to at least a portion of the front surface of the spall liner.

In an embodiment of the device 1301, the layer of the first material 110 includes the front surface 112 and the back surface 114, and the layer of the second material 1320 includes a front surface 1322A and the back surface 1324B. At least a portion of the back surface of the layer of the first material is joined to at least a portion of the front surface of the layer of the second material. In an embodiment of the device, at least a portion of the back surface of the layer of the first material is joined to at least a portion of the front surface of the layer of the second material. The joined layer of the first material and the layer of the second material forming an at least substantially stiff assembly. In an embodiment of the device, at least a portion of the back surface of the layer of the first material is joined to at least a portion of the front surface of the layer of the second material. The joined layer of the first material and the layer of the second material forming an at least substantially flexible assembly. In an embodiment of the device, at least a portion of the back surface of the layer of the first material is acoustically coupled to at least a portion of the front surface of the layer of the second material. In an embodiment of the device, at least a portion of the back surface of the layer of the first material is proximate to at least a portion of the front surface of the layer of the second material. The proximate first material and the second material are shaped and configured such that the device is wearable proximate to the exterior portion of the human body without a significant continuous air path between a portion of the front surface of the first material and the exterior portion of the human body.

In an embodiment, the device 1301 includes a layer of a ballistic material shaped and configured to substantially attenuate energy of an object (not illustrated) impacting the exterior portion 106 of the human body 105. For example, the layer of ballistic material may be at least substantially similar to the layer of ballistic material 170 described in conjunction with FIG. 7. In an embodiment, the layer of the first material 110 includes the front surface 112 and the back surface 114, the layer of the second material 1320 includes the front surface 1322A and the back surface 1324B, and the layer of ballistic material 170 includes the front surface 172 and the back surface 174. In an embodiment, at least a portion of the back surface of the layer of the ballistic material is proximate to the front surface of the layer of the first material, and at least a portion of the back surface of the layer of the first material is proximate to at least a portion of the front surface of the second material. In an embodiment, at least a portion of the back surface of the layer of the first material is proximate to the front surface of the layer of the ballistic material, and at least a portion of the back surface of the layer of the ballistic material proximate to at least a portion of the front surface of the layer of the second material. In an embodiment, at least a portion of the back surface of the layer of the second material is proximate to at least a portion of the front surface of the layer of the ballistic material. In an embodiment, the device includes a retaining apparatus (not illustrated) configured to hold the proximate layer of a first material and the layer of the second material adjacent to the exterior portion of a human body.

FIG. 32 and FIG. 33 illustrate an alternative embodiment of the wearable air blast wave energy protection device 1301. The device includes a layer of a first material 110 shaped and configured to reflect a substantial portion of a specified incident air blast wave energy 197-I. The first material having a first acoustic impedance substantially mismatched to the acoustic impedance of air. The device includes a layer of a second material shaped and configured for wearing proximate to an exterior portion of a human body. The second material including at least two attenuating-regions. The at least two attenuating-regions include a first attenuating-region [1320A of FIG. 32 or 1320A.1 of FIG. 33] configured to attenuate overpressures between approximately 1.2 bar and 4 bar of the specified incident air blast wave energy transmitted 197-T through the layer of the first material utilizing a first inelastic response. The at least two attenuating-regions include a second attenuating-region [1320B of FIG. 32 or 1320B.1 of FIG. 33] configured to attenuate overpressures between approximately 0.4 bar and 1.2 bar of the specified incident air blast wave energy transmitted through the layer of the first material utilizing a second inelastic response. The layer of the first material includes a front surface and a back surface, and the layer of the second material includes a front surface and a back surface. At least a portion of the back surface of the layer of the first material is proximate to at least a portion of the front surface of the layer of the second material.

FIG. 32 and FIG. 33 illustrate another alternative embodiment of the wearable air blast wave energy protection device 1301. The device includes a layer of a first material 110 shaped and configured to reflect a substantial portion of a specified incident air blast wave energy 197-I. The first material having a first acoustic impedance substantially mismatched to the acoustic impedance of air. The device includes a layer of a second material shaped and configured for wearing proximate to an exterior portion of a human body. The second material including at least two attenuating-regions. The at least two attenuating-regions include a first attenuating-region [1320A of FIG. 32 or 1320A.1 of FIG. 33] configured to attenuate overpressures between approximately 1.8 bar and 6 bar of the specified incident air blast wave energy transmitted 197-T through the layer of the first material utilizing a first inelastic response. The at least two attenuating-regions include a second attenuating-region [1320B of FIG. 32 or 1320B.1 of FIG. 33] configured to attenuate overpressures between approximately 0.6 bar and 1.8 bar of the specified incident air blast wave energy transmitted through the layer of the first material utilizing a second inelastic response. The layer of the first material includes a front surface and a back surface, and the layer of the second material includes a front surface and a back surface. At least a portion of the back surface of the layer of the first material is proximate to at least a portion of the front surface of the layer of the second material.

FIG. 34 illustrates an example operational flow 1400. After a start operation, the operational flow includes a reflection modeling operation 1410. The reflection modeling operation includes computer modeling at least two candidate reflective materials for a first human-protective and primarily reflective response to a specified incident air blast wave energy. The computer modeling of the at least two candidate reflective materials is at least partially based on respective acoustic impedances of the at least two candidate reflective materials to the specified incident air blast wave energy. The respective acoustic impedances of the at least two candidate reflective materials are each substantially mismatched to the acoustic impedance of air. For example, the specified incident air blast wave energy may include the air blast wave 195 produced by the blast event 193 creating an energy propagating across space from the blast event and illustrated as the incident air blast wave energy 197-I described in conjunction with FIG. 2. For example, the computer modeling may include computer modeling at least two candidate reflective materials for a first advantageous human-protective and primarily reflective response to a specified incident air blast wave energy. The operational flow includes a reflective material selecting operation 1420. The reflective material selecting operation includes selecting a layer of a first material from the at least two candidate reflective materials. The selecting is at least partially based on the computer modeling of the at least two candidate reflective materials. For example, the selecting a layer of a first material may include selecting the layer of the first material 110 described in conjunction with FIG. 2.

The operational flow 1400 includes a first attenuation modeling operation 1430. The first attenuation modeling operation includes computer modeling at least two candidate attenuative materials for a second human-protective and primarily attenuative response to the specified incident air blast wave energy transmitted through the selected layer of the first material. The computer modeling of the at least two candidate attenuative materials is at least partially based on respective inelastic responses of the two candidate attenuative materials to a first range of overpressures of the specified incident air blast wave energy transmitted through the selected layer of the first material. For example, the specified incident air blast wave energy transmitted through the layer of the first material may include the specified incident air blast wave energy transmitted 197-T through the layer of the first material described in conjunction with FIG. 2. For example, the first attenuation modeling operation may include computer modeling at least two candidate attenuative materials for a second advantageous human-protective and primarily attenuative response to the specified incident air blast wave energy transmitted through the selected layer of the first material. The operational flow includes a first attenuating-region material selecting operation 1440. The first attenuating-region material selecting operation includes selecting a first attenuating-region material from the at least two candidate attenuative materials. The selecting is at least partially based on the computer modeling of the at least two candidate attenuative materials to the first range of overpressures. For example, the selecting the first attenuating-region material may include selecting the first-attenuating-region 1320A described in conjunction with FIG. 32.

The operational flow 1400 includes a second attenuation modeling operation 1450. The second attenuation modeling operation includes computer modeling another at least two candidate attenuative materials for a third human-protective and primarily attenuative response to the specified incident air blast wave energy transmitted through the selected layer of the first material. The computer modeling of the another at least two candidate attenuative materials is at least partially based on respective inelastic responses of the another two candidate attenuative materials to a second range of overpressures of the specified incident air blast wave energy transmitted through the selected layer of the first material. For example, at least one of the another candidate attenuative materials of the second attenuation modeling operation may be at least substantially similar to at least one of the candidate attenuative materials of the first attenuation modeling operation. In an embodiment, the second attenuation modeling operation includes computer modeling the another at least two candidate attenuative materials for a third advantageous human-protective and primarily attenuative response to the specified incident air blast wave energy transmitted through the selected layer of the first material. The operational flow includes a second attenuating-region material selecting operation 1460. The second attenuating-region material selecting operation includes selecting a second attenuating-region material from the at least two candidate attenuative materials. The selecting is at least partially based on the computer modeling of the another at least two candidate attenuative materials to the second range of overpressures. For example, the selecting the second attenuating-region material may include selecting the second-attenuating-region 1320B described in conjunction with FIG. 32.

The operational flow 1400 includes a storage operation 1470. The storage operation includes electronically maintaining informational data corresponding to the selected layer of the first material, the selected first attenuating-region material, and the selected second attenuating-region material. The operational flow includes an end operation.

FIG. 35 illustrates alternative embodiments of the operational flow 1400 of FIG. 34. In an embodiment, the reflective material selecting operation 1420 may include at least one alternative embodiment, such as an operation 1422. The operation 1422 includes selecting a layer of a first material from the at least two candidate reflective materials. The selecting is at least partially based on a computer-implemented evaluation of the results of the computer modeling of the at least two candidate reflective materials. In an embodiment, the first attenuating-region material selecting operation 1440 may include at least one alternative embodiment, such as the operation 1442. The operation 1442 includes selecting a first attenuating-region material from the at least two candidate attenuative materials. The selecting is at least partially based on a computer-implemented evaluation of the computer modeling of the at least two candidate reflective materials to the first range of overpressures. In an embodiment, the second attenuating-region material selecting operation 1460 may include at least one alternative embodiment, such as the operation 1462. The operation 1462 includes selecting a second attenuating-region material from the another at least two candidate attenuative materials. The selecting is at least partially based on a computer-implemented evaluation of the computer modeling of the another at least two candidate reflective materials to the second range of overpressures. In an embodiment, the storage operation 1470 may include at least one alternative embodiment, such as the operation 1472. The operation 1472 includes electronically transmitting the informational data corresponding to the selected first material, the selected first attenuating-region material, and the selected second attenuating-region material. In an embodiment, the operation 1472 includes electronically transmitting the informational data to person or a machine. In an embodiment, the operation 1470 includes electronically transmitting the informational data via email or a network, such as the Internet.

FIG. 36 illustrates alternative embodiments of the operational flow 1400 of FIG. 34. In an embodiment, the operational flow may include at least one alternative embodiment. The at least one alternative embodiment may include an operation 1480, or an operation 1490. The operation 1480 includes an operation 1482 and an operation 1484.

The operation 1482 includes computer modeling at least two candidate arrangements of the selected first attenuating-region material and the selected second attenuating-region material into a layer of a second material providing a fourth human-protective and substantial attenuative response to the specified incident air blast wave energy transmitted through the layer of the first material. In an embodiment, the providing a fourth human-protective and substantial attenuative response includes providing a fourth advantageous human-protective and substantial attenuative response. The operation 1484 includes selecting an arrangement of the selected first attenuating-region material and the selected second attenuating-region material into the layer of the second material. The selecting is at least partially based on a computer-implemented evaluation of the computer modeling of the candidate arrangements of the selected first attenuating-region material and the selected second attenuating-region material.

The operation 1490 includes an operation 1492 and an operation 1494. The operation 1492 includes computer modeling at least two candidate methods of joining the selected layer of the first material and the selected arrangement of the selected first attenuating-region material and the selected second attenuating-region material. The computer modeling is at least partially based on providing a fifth human-protective response to the specified incident air blast wave energy. In an embodiment, the computer modeling includes computer modeling is at least partially based on providing a fifth advantageous human-protective response. The operation 1494 includes selecting a method of joining in response to the computer modeling of at least two candidate methods of joining. The selecting is at least partially based on a computer-implemented evaluation of the computer modeling of the candidate methods of joining.

FIG. 37 illustrates an example operational flow 1500 for manufacturing a wearable air blast wave energy protection device. After a start operation, the operational flow includes a reflective material receiving operation 1510. The reflective material receiving operation includes receiving a layer of a first material shaped and configured to provide a first advantageous human protective and primarily reflective response to a specified incident air blast wave energy. The layer of the first material selected at least partially based on a first acoustic impedance of the first material to the specified incident air blast wave energy, and on a substantial mismatch between the first acoustic impedance and the acoustic impedance of air. For example, the receiving the layer of first material may include receiving the layer of first material 110 described in conjunction with FIG. 4.

A first attenuating material receiving operation 1520 includes receiving a first attenuating-region material shaped and configured to provide a second advantageous human-protective and primarily attenuative response to the specified incident air blast wave energy transmitted through the layer of the first material. The first attenuating-region material selected at least partially based on a first inelastic response of the first attenuating-region material to a first range of overpressures of the specified incident air blast wave energy transmitted through the layer of the first material. For example, the receiving the first attenuating-region material may include receiving the first attenuating-region material 1320A described in conjunction with FIG. 32 or the first attenuating-region material 1320A.1 described in conjunction with FIG. 33.

A second attenuating material receiving operation 1530 includes receiving a second attenuating-region material shaped and configured to provide a third advantageous human-protective and primarily attenuative response to the specified incident air blast wave energy transmitted through the layer of the first material. The second attenuating-region material selected at least partially based on a second inelastic response of the second attenuating-region material to a second range of overpressures of the specified incident air blast wave energy transmitted through the layer of the first material. For example, the receiving the second attenuating-region material may include receiving the second attenuating-region material 1320B described in conjunction with FIG. 32 or the second attenuating-region material 1320B.1 described in conjunction with FIG. 33.

An arranging operation 1540 includes arranging the first attenuating-region material and the second attenuating-region material into a layer of a second material providing a fourth advantageous human-protective and substantial attenuative response to the specified incident air blast wave energy transmitted through the layer of the first material. For example, the arranging may include arranging the first attenuating-region material and the second attenuating-region material into a layer of a second material as described in conjunction with FIG. 32 or 33.

A joining operation 1550 includes joining at least a portion of a back surface of the layer of the first material to at least a portion of a front surface of the layer of the second material. In an embodiment, the joining operation may include at least one alternative embodiment, such as the operation 1552. The operation 1552 includes joining at least a portion of a back surface of the layer of the first material to at least a portion of a front surface of the layer of the second material. The joining selected to provide a fifth advantageous human-protective joining of the layer of the first material and the layer of the second material to the specified incident air blast wave energy. The joining selected at least partially based on an attribute of the first material, an attribute of the second material, or an attribute of the specified incident air blast wave energy. In an embodiment, the joining operation includes joining at least a portion of a back surface of the layer of the first material to at least a portion of a front surface of the layer of the second material to form the air blast wave energy protection device. In an embodiment, the joining operation includes adhering at least a portion of a back surface of the layer of the first material to at least a portion of a front surface of the layer of the second material. The operational flow includes an end operation.

FIG. 38 illustrates an alternative embodiment of the operational flow 1500 of FIG. 37. The operational flow may include at least one alternative embodiment, illustrated as an operation 1560. The operation 1560 may include an operation 1562, an operation 1572, an operation 1574, or an operation 1576. The operation 1562 includes shaping the layer of the second material into a configuration suitable for wearing proximate to an exterior portion of a human body. The operation 1562 may include at least one alternative embodiment, such as an operation 1564 or an operation 1566. The operation 1564 includes shaping the layer of the second material into a physical form configured or user-configurable for wearing proximate to an exterior portion of a human body. In an embodiment, the operation 1566 includes shaping the layer of the second material into a physical form user-configurable for wearing proximate to an exterior portion of a human body with substantially no air gap between the layer of the second material and the exterior portion of the human body.

The operation 1572 includes attaching at least a portion of the layer of the first material or the layer of the second material to a retaining strap configured to removably secure the joined first material and second material proximate to an exterior portion of the human body. The operation 1574 includes attaching at least a portion of the joined layer of the first material and the layer of the second material to a carrier shaped and configured to be secured proximate to an exterior portion of the human body. The operation 1576 includes electronically receiving informational data corresponding to the layer of the first material, the first attenuating-region material, the second attenuating-region material, the arrangement of the first attenuating-region material and the second attenuating-region material into the layer of the second material, and the joining.

Figure 39:
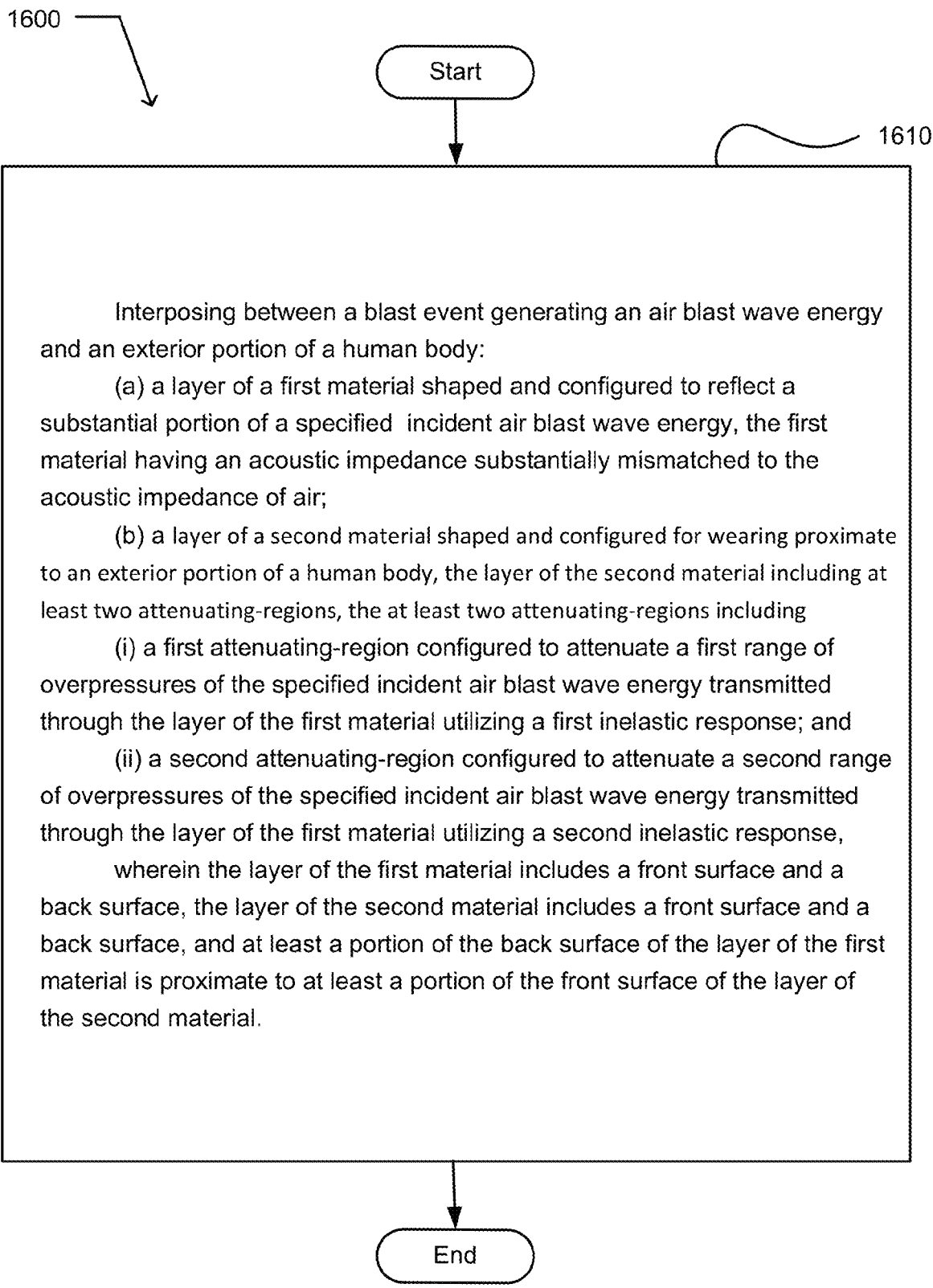
FIG. 39 illustrates an example operational flow.

FIG. 39 illustrates an example operational flow 1600. The operational flow includes a start operation. The operational flow includes an operation 1610. The operation 1610 includes interposing between a blast event generating an air blast wave energy and an exterior portion of a human body a layer of a first material shaped and configured to reflect a substantial portion of a specified incident air blast wave energy. The first material has an acoustic impedance substantially mismatched to the acoustic impedance of air. The operation 1610 also includes interposing a layer of a second material shaped and configured for wearing proximate to an exterior portion of a human body. The second material includes at least two attenuating-regions. The at least two attenuating-regions include a first attenuating-region configured to attenuate a first range of overpressures of the specified incident air blast wave energy transmitted through the layer of the first material utilizing a first inelastic response. The at least two attenuating-regions include a second attenuating-region is configured to attenuate a second range of overpressures of the specified incident air blast wave energy transmitted through the layer of the first material utilizing a second inelastic response. The layer of the first material includes a front surface and a back surface, and the layer of the second material includes a front surface and a back surface. At least a portion of the back surface of the layer of the first material is proximate to at least a portion of the front surface of the layer of the second material. The operational flow includes an end operation.

For example, the operational flow 1600 may be implemented by interposing the device 1301 described in conjunction with FIG. 32 between the incident air blast wave energy 197-I produced by the blast 193 and the exterior body part portion 106 of the human body 105.

Figure 40:
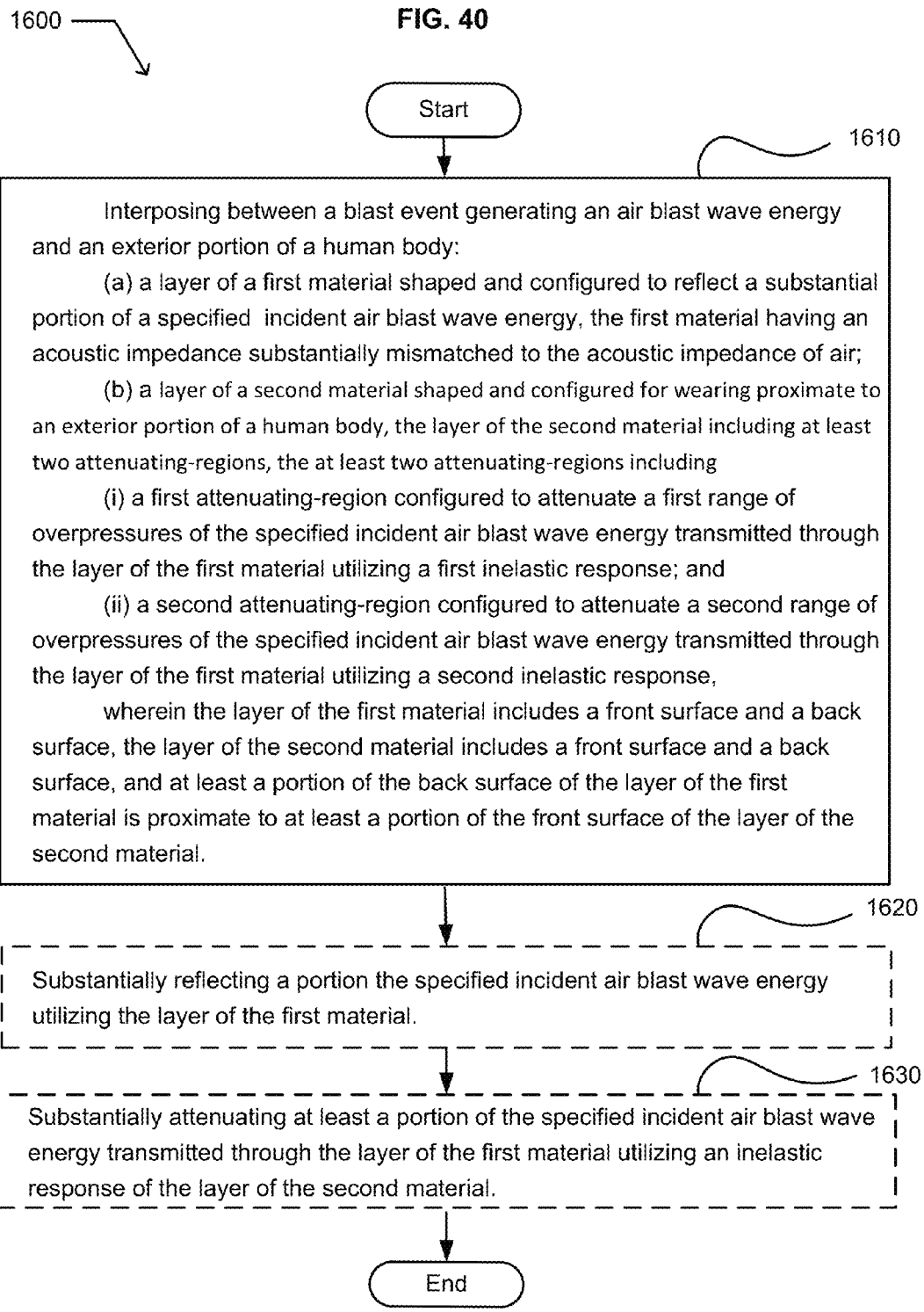
FIG. 40 illustrates alternative embodiments of the operational flow of FIG. 39.

FIG. 40 illustrates alternative embodiments of the operational flow 1600 of FIG. 39. The operational flow may include at least one alternative embodiment. The at least one alternative embodiment may include an operation 1620 or an operation 1630. The operation 1620 includes substantially reflecting a portion the specified incident air blast wave energy utilizing the layer of the first material. The operation 1630 includes substantially attenuating at least a portion of the specified incident air blast wave energy transmitted through the layer of the first material utilizing the inelastic response of the layer of the second material.

Figure 41:
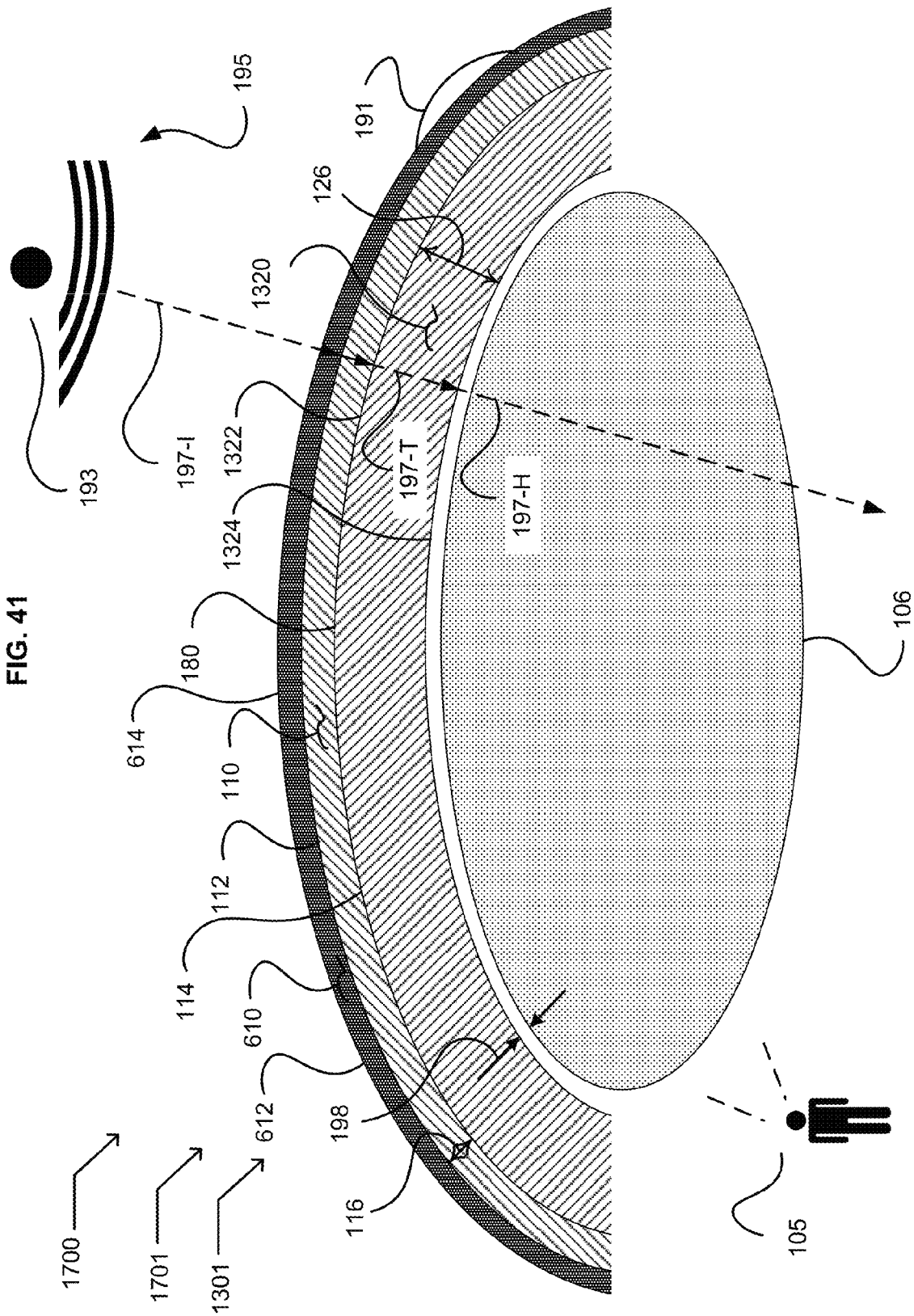
FIG. 41 illustrates an environment that includes an example device.

FIG. 41 illustrates an environment 1700 that includes an example device 1701. The device includes the layer of the ballistic material 610 described in conjunction with FIG. 21. The layer of ballistic material is shaped and configured to substantially attenuate energy of an object (not illustrated) impacting the external portion 106 of the human body 105. The device 1701 includes the device 1301 described in conjunction with FIG. 32 or 1301.1 described in conjunction with FIG. 33. The device 1701 includes the layer of a first material 110 shaped and configured to reflect a substantial portion of a specified incident air blast wave energy 197-T. The layer of the first material has an acoustic impedance substantially mismatched to the acoustic impedance of air. The device includes the layer of the second material 1320 shaped and configured for wearing proximate to the exterior portion of the human body. The second material includes at least two attenuating-regions. The at least two attenuating-regions include a first attenuating-region 1320A (not illustrated by FIG. 41) configured to attenuate a first range of overpressures of the specified incident air blast wave energy transmitted 197-T through the layer of the first material utilizing a first inelastic response. The at least two attenuating-regions include a second attenuating-region 1320B (not illustrated by FIG. 41) configured to attenuate a second range of overpressures of the specified incident air blast wave energy transmitted through the layer of the first material utilizing a second inelastic response.

The layer of the ballistic material 610 includes the front surface 612 and the back surface 614. In an embodiment, the front surface may be considered an exterior surface of a ballistic material and the back surface may be considered an interior surface of the ballistic material. The layer of the first material 110 includes the front surface 112 and the back surface 114. The layer of the second material 1320 includes the front surface 1322 and the back surface 1324. In an embodiment, at least a portion of the back surface of the layer of the ballistic material is proximate to the front surface of the layer of the first material, and at least a portion of the back surface of the layer of the first material is proximate to at least a portion of the front surface of the layer of the second material. In an embodiment of the device, at least a portion of the back surface of the layer of the first material is proximate to the front surface of the layer of the ballistic material, and at least a portion of the back surface of the layer of the ballistic material is proximate to at least a portion of the front surface of the layer of the second material (not illustrated). In an embodiment of the device, at least a portion of the back surface of the layer of the first material is proximate to the front surface of the layer of a second material, and at least a portion of the back surface of the layer of the second material is proximate to at least a portion of the front surface of the layer of the ballistic material (not illustrated).

Figure 42:
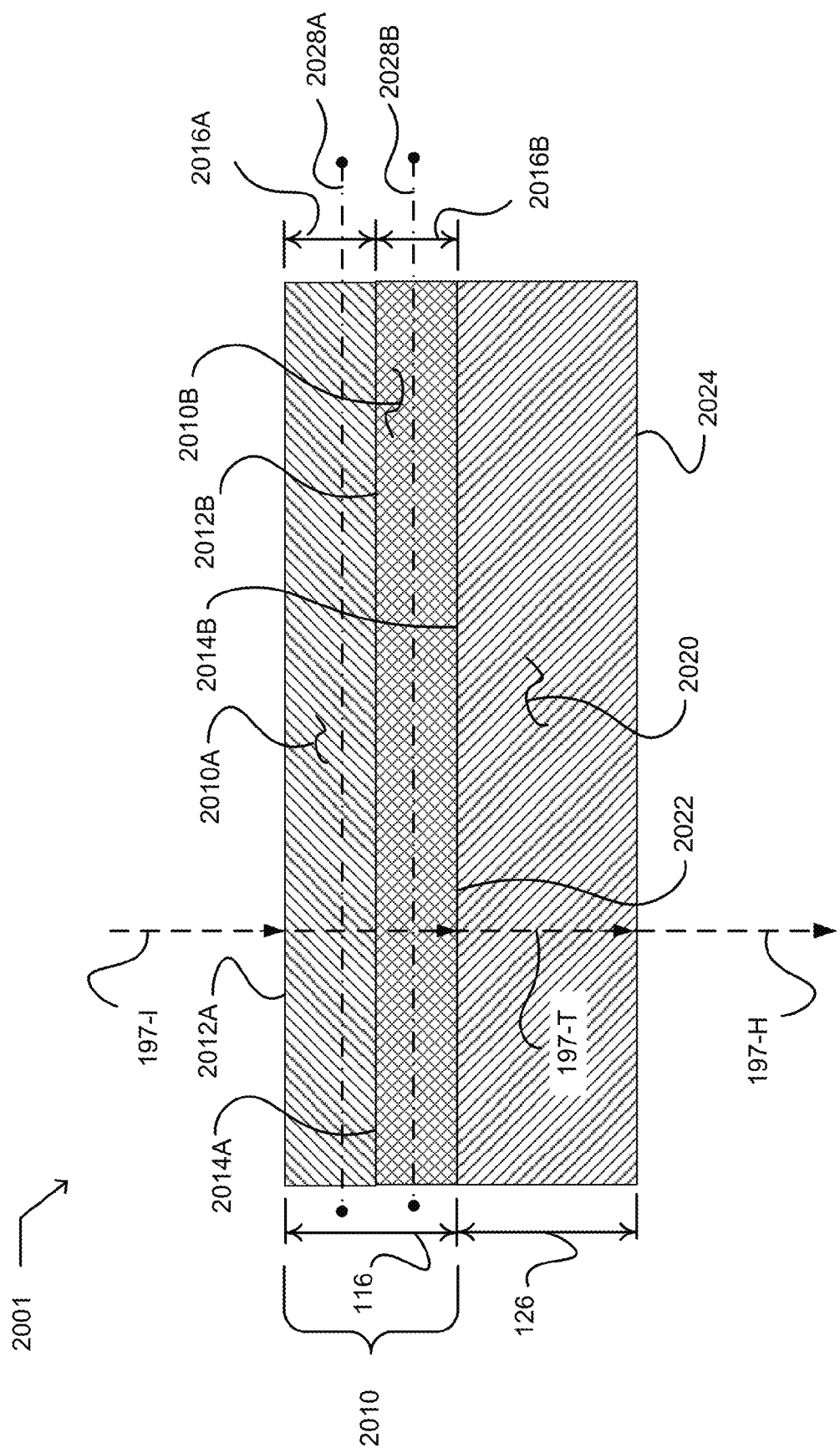
FIG. 42 illustrates a cross-sectional view of an example wearable air blast wave energy protection device.

FIG. 42 illustrates a cross-sectional view of an example wearable air blast wave energy protection device 2001 that may be implemented in the environment 100 described in conjunction with FIG. 2. FIG. 43 illustrates a cross-sectional view of an alternative embodiment of the wearable air blast wave energy protection device 2001, which is denoted as wearable air blast wave energy protection device 2001.1. Continuing with FIG. 42, in an embodiment, the wearable air blast wave energy protection device is wearable in combat situations. The device includes a layer of a first material 2010 shaped and configured to reflect a substantial portion of the specified incident air blast wave energy 197-I. The layer of the first material has a thickness 116. The first material includes at least two reflective-regions. The at least two reflective-regions include a first reflective-region 2010A having a first acoustic impedance $Z_1$ mismatched to the acoustic impedance of air $Z_A$. In an embodiment, the first reflective region has a thickness 2016A. The at least two reflective-regions include a second reflective-region 2010B a second acoustic impedance $Z_2$ less than the first acoustic impedance $Z_1$. In an embodiment, the second reflective-region has a thickness 2016B. The device includes a layer of a second material 2020 shaped and configured to attenuate a substantial portion of the specified incident air blast wave energy transmitted 197-T through the layer of the first material utilizing an inelastic response. The layer of the second material is shaped and configured for wearing proximate to the exterior portion 106 of the human body 105. For example, the layer of the second material may be at least substantially similar to the layer of the second material 120 described in conjunction with FIG. 2.

The first reflective-region 2010A includes a front surface 2012A and a back surface 2014A. The second reflective-region includes a front surface 2012B and a back surface 2014B. The layer of the first material 2010 includes the front surface 2012A of the first reflective-region and a back surface 2014B of the second reflective-region. The layer of the second material 2020 includes a front surface 2022 and a back surface 2024. At least a portion of the back surface of the layer of the first material is proximate to at least a portion of the front surface of the layer of the second material.

In an embodiment, $Z_1/Z_2$ equals approximately 2. In an embodiment, $Z_1/Z_2$ equals approximately 3. In an embodiment, $Z_1/Z_2$ equals approximately 5. In an embodiment, $Z_1/Z_2$ equals approximately 10. In an embodiment, $Z_1/Z_2$ equals approximately 30.

In an embodiment, the at least two reflective regions of the first material 2010 include a first reflective-region having a first acoustic impedance $Z_1$ substantially mismatched to the acoustic impedance of air $Z_A$. The at least two reflective-regions include a second reflective-region having a second acoustic impedance $Z_2$ substantially less than the first acoustic impedance $Z_1$ and substantially mismatched to the acoustic impedance of air $Z_A$.

In an embodiment, the at least two reflective-regions of the first material 2010 include a first reflective-region 2010A having a first acoustic impedance $Z_1$ mismatched to the acoustic impedance of air $Z_A$ and a first directional orientation 2028A to the specified incident air blast wave energy 197-I. The at least two reflective-regions of the first material include a second reflective-region 2010B having a second acoustic impedance $Z_2$ less than the first acoustic impedance $Z_1$ and a second directional orientation 2028B to the specified incident air blast wave energy. In an embodiment, the second directional orientation is substantially similar to the first directional orientation. In an embodiment, the second directional orientation is substantially dissimilar from the first directional orientation.

In an embodiment, the layer of first material 2010 includes a layer of a first material shaped and configured to reflect a substantial portion of a specified incident air blast wave energy 197-I. The first material includes an arrangement of at least two reflective-regions. For example, the at least two reflective-regions may include the first reflective-region 2010A and the second reflective-region 2010B may be arranged into at least substantially parallel sub-layers that are generally oriented normal to an anticipated path of the specified incident air blast wave energy as illustrated by FIG. 42. For example, the at least two reflective-regions may include the first reflective-region 2010A and the second reflective-region 2010B placed into an arrangement of pairs of regions ([2010A.1,2010B.1] [2010A.2,2010B.2] [2010A.3, 2010B.3]), each region not having a substantial directional orientation as illustrated by FIG. 43. For example, the at least two reflective-regions may include the first reflective-region 2010A and the second reflective-region 2010B arranged into at least substantially parallel regions that are generally oriented parallel to an anticipated path of the specified incident air blast wave energy, such as for example illustrated for the attenuating-regions 1320 as illustrated by FIG. 33. For example, the at least two reflective-regions may include the first reflective-region 2010A and the second reflective-region 2010B arranged into regions that are generally oriented at an angle to an anticipated path of the specified incident air blast wave energy (not illustrated).

Returning to FIG. 42, in an embodiment, the layer of the first material 2010 includes a layer of a first material shaped and configured to reflect a substantial portion of a specified incident air blast wave energy 197-I. The first material includes at least two reflective-regions. A first reflective-region 2010A of the at least two reflective-regions has a first acoustic impedance substantially mismatched to the acoustic impedance of air and a first directional orientation 2028A to the specified incident air blast wave energy. A second reflective-region 2010B the at least two reflective-regions has a second acoustic impedance substantially less than the first acoustic impedance and a second directional orientation 2028B to the specified incident air blast wave energy.

In an embodiment, the at least two reflective-regions are respectively formed in sub-layers each having front and back surfaces generally aligned with the interface between the layer of the first material 2010 and the layer of the second material 2020 as illustrated by FIG. 42. In an embodiment, the at least two reflective-regions are respectively formed in layers each having front and back surfaces generally perpendicular to the interface between the layer of the first material 2010 and the layer of the second material 2020 (not illustrated).

In an embodiment, the layer of the first material 2010 includes a layer of a first material shaped and configured to reflect a substantial portion of a shock front 22 of a specified incident air blast wave energy 197-I. The shock front is described in conjunction with FIG. 1. In an embodiment, the layer of the first material 2010 of the device 2001 includes a layer of a first material shaped and configured to reflect at least 99% of a specified incident air blast wave energy 197-I. In an embodiment, the layer of the first material is shaped and configured to reflect at least 99% of a shock front of a specified incident air blast wave energy. In an embodiment, the layer of the first material is shaped and configured to reflect at least 90% of a specified incident air blast wave energy. In an embodiment, the layer of the first material is shaped and configured to reflect at least 80% of a shock front of a specified incident air blast wave energy. In an embodiment, the layer of the first material is shaped and configured to reflect at least 90% of a specified incident air blast wave energy. In an embodiment, the layer of the first material is shaped and configured to reflect at least 80% of a shock front of a specified incident air blast wave energy. In an embodiment, the layer of the first material is shaped and configured to reflect at least 60% of a specified incident air blast wave energy. In an embodiment, the layer of the first material is shaped and configured to reflect at least 60% of a shock front of a specified incident air blast wave energy. In an embodiment, the layer of the first material is shaped and configured to reflect at least 40% of a specified incident air blast wave energy. In an embodiment, the layer of the first material is shaped and configured to reflect at least 40% of a shock front of a specified incident air blast wave energy. In an embodiment, the layer of the first material is shaped and configured to reflect at least 25% of a specified incident air blast wave energy. In an embodiment, the layer of the first material is shaped and configured to reflect at least 25% of a shock front of a specified incident air blast wave energy. In an embodiment, the layer of the first material is shaped and configured to reflect at least 15% of a specified incident air blast wave energy. In an embodiment, the layer of the first material is shaped and configured to reflect at least 15% of a shock front of a specified incident air blast wave energy. In an embodiment, the layer of the first material is shaped and configured to reflect at least 10% of a specified incident air blast wave energy. In an embodiment, the layer of the first material is shaped and configured to reflect at least 10% of a shock front of a specified incident air blast wave energy. In an embodiment, the layer of the first material is shaped and configured to reflect at least 5% of a specified incident air blast wave energy. In an embodiment, the layer of the first material is shaped and configured to reflect at least 5% of a shock front of a specified incident air blast wave energy. In an embodiment, the layer of the first material is shaped and configured to reflect at least 3% of a specified incident air blast wave energy. In an embodiment, the layer of the first material is shaped and configured to reflect at least 3% of a shock front of a specified incident air blast wave energy.

In an embodiment, the layer of the first material 2010 has a thickness 116 of less than about 3 millimeters (mm). In an embodiment, the layer of the first material has a thickness 116 of less than about 2 mm. In an embodiment, the layer of the first material has a thickness 116 of less than about 1 mm.

In an embodiment, the layer of the first material 2010 includes a layer of a first material shaped and configured to reflect a substantial portion of a specified incident air blast wave energy 197-I. The first material includes at least three reflective-regions. The at least three reflective regions include a first reflective-region 2010A having a first acoustic impedance $Z_1$ mismatched to the acoustic impedance of air $Z_A$. The at least three reflective regions include a second reflective-region 2010B having a second acoustic impedance $Z_2$ less than the first acoustic impedance $Z_1$. The at least three reflective regions include a third reflective-region (not illustrated) having a third acoustic impedance $Z_3$ greater than the second acoustic impedance $Z_2$. In an embodiment, the third reflective-region includes third reflective-region having a third acoustic impedance $Z_3$ greater than the second acoustic impedance $Z_2$ and mismatched to the acoustic impedance of air $Z_A$.

In an embodiment, layer of the first material 2010 includes a layer of a first material shaped and configured to reflect a substantial portion of a specified incident air blast wave energy 197-I. The first material includes at least four reflective-regions. The at least four reflective-regions include a first reflective-region 2010A having a first acoustic impedance $Z_1$ greater than the acoustic impedance of air $Z_A$. The at least four reflective-regions include a second reflective-region 2010B having a second acoustic impedance $Z_2$. The at least four reflective-regions include a third reflective-region (not illustrated) having a third acoustic impedance $Z_3$. The at least four reflective-regions include a fourth reflective-region (not illustrated) having a third acoustic impedance $Z_4$. In an embodiment, $Z_1 > Z_2$, $Z_3 > Z_2$, and $Z_3 > Z_4$.

In an embodiment, layer of the first material 2010 includes a layer of a first material shaped and configured to reflect a substantial portion of a specified incident air blast wave energy 197-I. The first material includes at least six reflective-regions. The at least six reflective-regions include a first reflective-region 2010A having a first acoustic impedance $Z_1$ greater than the acoustic impedance of air $Z_A$. The at least six reflective-regions include a second reflective-region 2010B having a second acoustic impedance $Z_2$. The at least six reflective-regions include a third reflective-region (not illustrated) having a third acoustic impedance $Z_3$. The at least six reflective-regions include a fourth reflective-region having a fourth acoustic impedance $Z_4$. The at least six reflective-regions include a fifth reflective-region (not illustrated) having a fifth acoustic impedance $Z_5$. The at least six reflective-regions include a sixth reflective-region (not illustrated) having a sixth acoustic impedance $Z_6$. In an embodiment, $Z_1 > Z_2$, $Z_3 > Z_2$, $Z_3 > Z_4$, $Z_5 > Z_4$, and $Z_5 > Z_6$.

FIG. 43 illustrates an embodiment of the layer of the first material 2010. The layer of the first material is shaped and configured to reflect a substantial portion of a specified incident air blast wave energy 197-I. The first material includes an aggregation of at least two reflective-regions. The aggregation of at least two reflective-regions include first reflective-regions 2010A having a first acoustic impedance $Z_1$ mismatched to the acoustic impedance of air $Z_A$. The aggregation of at least two reflective-regions include second reflective-regions 2010B each having a second acoustic impedance $Z_2$ less than the first acoustic impedance $Z_1$. In an embodiment, the aggregation of at least two reflective-regions includes an aggregation of approximately equal volumes of at least two reflective-regions.

In an embodiment, the layer of the second material 2020 includes a layer of a second material shaped and configured for wearing proximate to the exterior portion 106 of the human body 105. The second material includes at least two attenuating-regions (not illustrated). The at least two attenuating-regions include a first attenuating-region (not illustrated) having a first inelastic response to the specified incident air blast wave energy transmitted 197-T through the layer of the first material 2010. The at least two attenuating-regions include a second attenuating-region (not illustrated) having a second inelastic response to the specified incident air blast wave energy transmitted through the layer of the first material. For example, the first attenuating-region and the second attenuating-region may be at least substantially similar to the first attenuating-region 720A and the second attenuating-region 720B described in conjunction with FIGS. 22 and 23. For example, the first attenuating-region and the second attenuating-region may be at least substantially similar to the first attenuating-region 1320A and the second attenuating-region 1320B described in conjunction with FIGS. 32 and 33. In an embodiment, the layer of the second material includes a layer of a second material shaped and configured for wearing proximate to the exterior portion of the human body. The second material includes at least two attenuating-regions. The at least two attenuating-regions include a first attenuating-region is shaped and configured to attenuate a first range of overpressures of the specified incident air blast wave energy transmitted through the layer of the first material utilizing a first inelastic response. The at least two attenuating-regions include a second attenuating-region is shaped and configured to attenuate a second range of overpressures of the specified incident air blast wave energy transmitted through the layer of the first material utilizing a second inelastic response. For example, the first attenuating-region and the second attenuating-region may be at least substantially similar to the first attenuating-region 720A and the second attenuating-region 720B described in conjunction with FIGS. 22 and 23. For example, the first attenuating-region and the second attenuating-region may be at least substantially similar to the first attenuating-region 1320A and the second attenuating-region 1320B described in conjunction with FIGS. 32 and 33.

In an embodiment, the device 2001 includes a spall liner (not illustrated) shaped and configured to restrain at least one fragment broken from the layer of the first material 2010 by the specified incident air blast wave energy 197-I. For example, the spall liner may be at least substantially similar to the spall liner 140 described in conjunction with FIGS. 5 and 6. In an embodiment, the layer of the first material 2010 includes the front surface 2012A and the back surface 2014B, the layer of the second material 2020 includes the front surface 2022 and the back surface 2024B, and the spall liner 140 includes the front surface 142 and the back surface 144. In an embodiment, at least a portion of the back surface of the layer of the first material is proximate to at least a portion of the front surface of the spall liner, and at least a portion of the back surface of the spall liner is proximate to the front surface of the layer of the second material. In an embodiment, at least a portion of the back surface of the layer of the first material is proximate to at least a portion of the front surface of the layer of the second material, and at least a portion of the back surface of the layer of the second material is proximate to at least a portion of the front surface of the spall liner.

In an embodiment, the device 2001 includes a layer of a ballistic material (not illustrated) shaped and configured to substantially attenuate energy of an object impacting the exterior portion 106 of the human body 105. For example, the layer of ballistic material may be at least substantially similar to the layer of ballistic material 170 described in conjunction with FIG. 7. In an embodiment, the layer of the first material 2010 includes the front surface 2012A and the back surface 2014B, the layer of the second material 2020 includes the front surface 2022 and the back surface 2024, and the layer of ballistic material 170 includes the front surface 172 and the back surface 174. In an embodiment, at least a portion of the back surface of the layer of the ballistic material is proximate to the front surface of the layer of the first material, and at least a portion of the back surface of the layer of the first material is proximate to at least a portion of the front surface of the second material. In an embodiment, at least a portion of the back surface of the layer of the first material is proximate to the front surface of the layer of the ballistic material, and at least a portion of the back surface of the layer of the ballistic material proximate to at least a portion of the front surface of the layer of the second material. In an embodiment, at least a portion of the back surface of the layer of the second material is proximate to at least a portion of the front surface of the layer of the ballistic material. In an embodiment, the device includes a retaining apparatus (not illustrated) configured to hold the proximate layer of a first material and the layer of the second material adjacent to the exterior portion of a human body.

Returning to FIG. 42. FIG. 42 illustrates an embodiment of the wearable air blast wave energy protection device 2001. The device includes a layer of a first material 2010 shaped and configured to reflect a substantial portion of a specified incident air blast wave energy 197-I. The first material including at least two reflective-regions. The at least two reflective-regions include a first reflective-region 2010A having a first acoustic impedance $Z_1$ mismatched to the acoustic impedance of air $Z_A$. The at least two reflective-regions include a second reflective-region 2010B having a second acoustic impedance $Z_2$ less than the first acoustic impedance $Z_1$. The device includes a layer of a second material 2020 shaped and configured to attenuate a substantial portion of the specified incident air blast wave energy 197-T transmitted through the layer of the first material utilizing an inelastic response, and shaped and configured for wearing proximate to an exterior portion of a human body. The layer of the first material includes a front surface 2012A and a back surface 2014B, and the layer of the second material includes a front surface 2022 and a back surface 2024. At least a portion of the back surface of the layer of the first material is proximate to at least a portion of the front surface of the layer of the second material. $Z_1/Z_2$ equals approximately 3. FIG. 43 illustrates an alternative embodiment of this embodiment. In the alternative embodiment, the first reflective region includes first reflective regions 2010A.1 et seq. In the alternative embodiment, the second reflective region includes second reflective regions 2010B.1 et seq.

Returning to FIG. 42, FIG. 42 illustrates an embodiment of the wearable air blast wave energy protection device 2001. The device includes a layer of a first material 2010 shaped and configured to reflect a substantial portion of a specified incident air blast wave energy 197-I. The first material including at least two reflective-regions. The at least two reflective-regions include a first reflective-region 2010A having a first acoustic impedance $Z_1$ mismatched to the acoustic impedance of air $Z_A$. The at least two reflective-regions include a second reflective-region 2010B having a second acoustic impedance $Z_2$ less than the first acoustic impedance $Z_1$. The device includes a layer of a second material 2020 shaped and configured to attenuate a substantial portion of the specified incident air blast wave energy 197-T transmitted through the layer of the first material utilizing an inelastic response, and shaped and configured for wearing proximate to an exterior portion of a human body. The layer of the first material includes a front surface 2012A and a back surface 2014B, and the layer of the second material includes a front surface 2022 and a back surface 2024. At least a portion of the back surface of the layer of the first material is proximate to at least a portion of the front surface of the layer of the second material. $Z_1/Z_2$ equals approximately 10. FIG. 43 illustrates an alternative embodiment of this embodiment. In the alternative embodiment, the first reflective region includes first reflective regions 2010A.1 et seq. In the alternative embodiment, the second reflective region includes second reflective regions 2010B.1 et seq.

Figure 44:
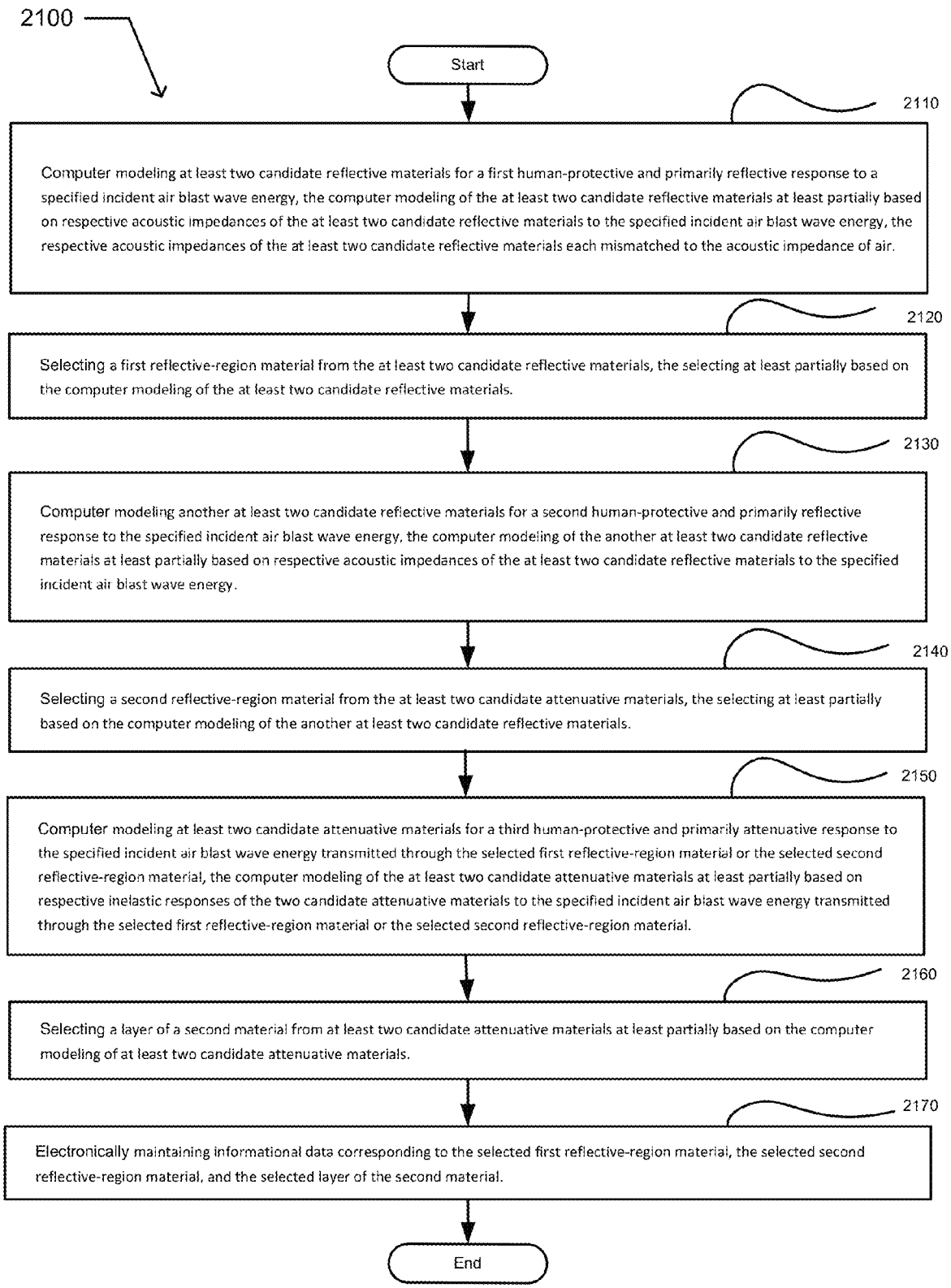
FIG. 44 illustrates an example operational flow 2100.

FIG. 44 illustrates an example operational flow 2100. After a start operation, the operational flow includes a first reflection modeling operation 2110. The first reflection modeling operation includes computer modeling at least two candidate reflective materials for a first human-protective and primarily reflective response to a specified incident air blast wave energy. The computer modeling of the at least two candidate reflective materials is at least partially based on respective acoustic impedances of the at least two candidate reflective materials to the specified incident air blast wave energy. The respective acoustic impedances of the at least two candidate reflective materials each are substantially mismatched to the acoustic impedance of air. In an embodiment, the first reflection modeling operation includes computer modeling at least two candidate reflective materials for a first advantageous human-protective and primarily reflective response to a specified incident air blast wave energy. In an embodiment, the specified incident air blast wave energy includes the air blast wave 195 produced by the blast event 193 creating an energy propagating across space from the blast event and illustrated as the incident air blast wave energy 197-I described in conjunction with FIG. 2. The operational flow includes a first reflective material selecting operation 2120. The first reflective material selecting operation includes selecting a first reflective-region material from the at least two candidate reflective materials. The selecting is at least partially based on the computer modeling of the at least two candidate reflective materials. For example, the selecting a first reflective-region material may include selecting the first reflective-region material 2010A described in conjunction with FIG. 42.

The operational flow 2100 includes a second reflection modeling operation 2130. The second reflection modeling operation includes computer modeling another at least two candidate reflective materials for a second human-protective and primarily reflective response to the specified incident air blast wave energy. The computer modeling of the another at least two candidate reflective materials is at least partially based on respective acoustic impedances of the at least two candidate reflective materials to the specified incident air blast wave energy. In an embodiment, the second reflection modeling operation includes computer modeling another at least two candidate reflective materials for a second advantageous human-protective and primarily reflective response to a specified incident air blast wave energy. The operational flow includes a second reflective material selection operation 2140. The second reflective material selection operation includes selecting a second reflective-region material from the at least two candidate attenuative materials. The selecting is at least partially based on the computer modeling of the another at least two candidate reflective materials. For example, the selecting a second reflective-region material may include selecting the second reflective-region material 2010B described in conjunction with FIG. 42.

The operational flow 2100 includes an attenuation modeling operation 2150. The attenuation modeling operation includes computer modeling at least two candidate attenuative materials for a third human-protective and primarily attenuative response to the specified incident air blast wave energy transmitted through the selected first reflective-region material and the selected second reflective-region material. The computer modeling of the at least two candidate attenuative materials is at least partially based on respective inelastic responses of the two candidate attenuative materials to the specified incident air blast wave energy transmitted through the selected first reflective-region material or the selected second reflective-region material. The operational flow includes an attenuative material selecting operation 2160. The attenuative material selecting operation includes selecting a layer of a second material from at least two candidate attenuative materials at least partially based on the computer modeling of at least two candidate attenuative materials. For example, the selecting a layer of a second material may include selecting the layer of the second material 2020 described in conjunction with FIG. 42.

The operational flow 2100 includes a storage operation 2170. The storage operation includes electronically maintaining informational data corresponding to the selected first reflective-region material, the selected second reflective-region material, and the selected layer of the second material. The operational flow includes an end operation.

Figure 45:
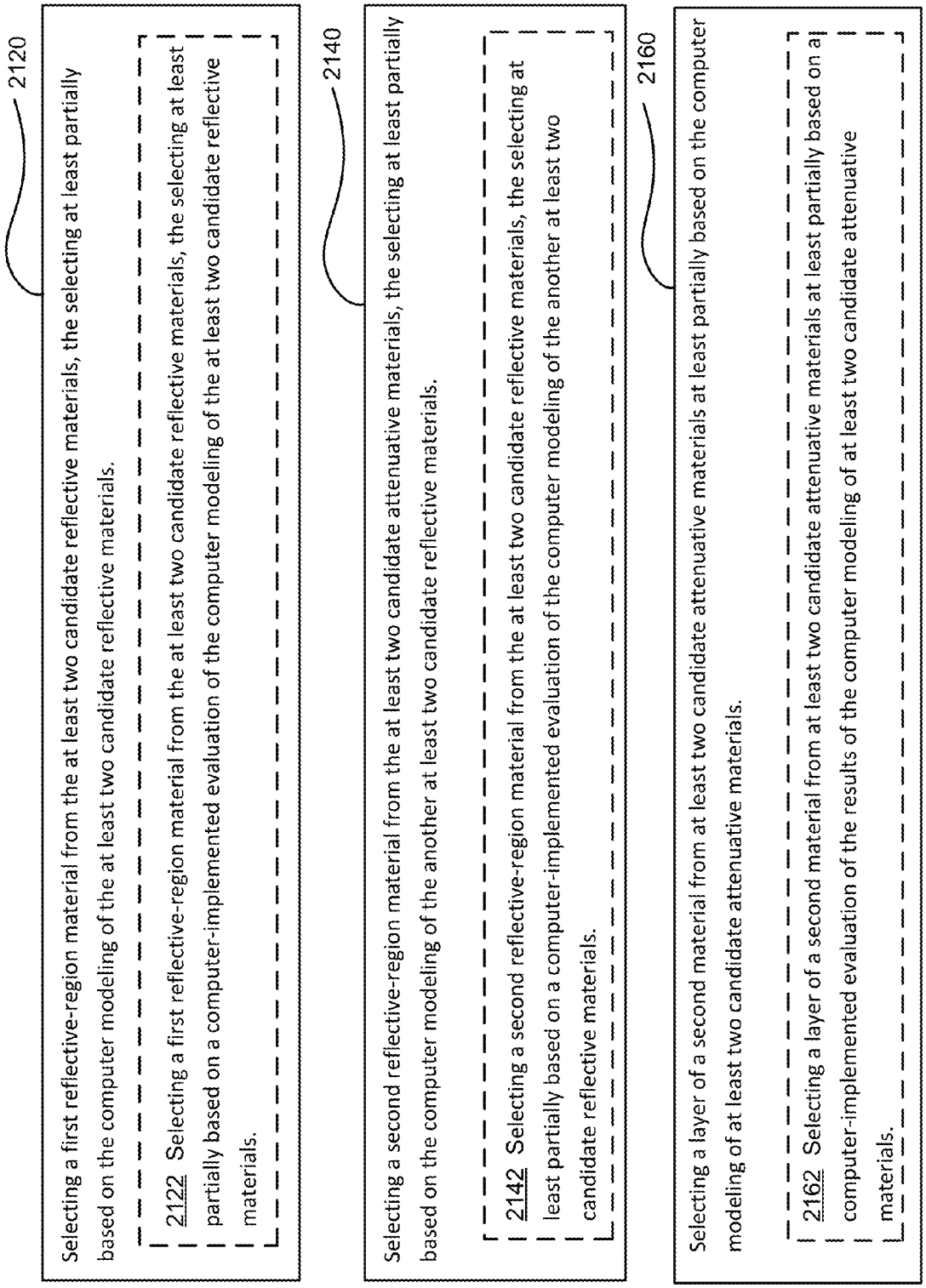
FIG. 45 illustrates alternative embodiments of the operational flow of FIG. 44.

FIG. 45 illustrates alternative embodiments of the operational flow 2100 of FIG. 44. In an embodiment, the first reflective material selecting operation 2120 may include at least one alternative embodiment, such as an operation 2122. The operation 2122 includes selecting a first reflective-region material from the at least two candidate reflective materials. The selecting is at least partially based on a computer-implemented evaluation of the computer modeling of the at least two candidate reflective materials. The second reflective material selecting operation 2140 includes at least one alternative embodiment, such as an operation 2142. The operation 2142 includes selecting a second reflective-region material from the at least two candidate reflective materials. The selecting is at least partially based on a computer-implemented evaluation of the computer modeling of the another at least two candidate reflective materials. The attenuative material selecting operation 2160 may include at least one alternative embodiment, such as the operation 2162. The operation 2162 includes selecting a layer of a second material from at least two candidate attenuative materials at least partially based on a computer-implemented evaluation of the results of the computer modeling of at least two candidate attenuative materials.

Figure 46:
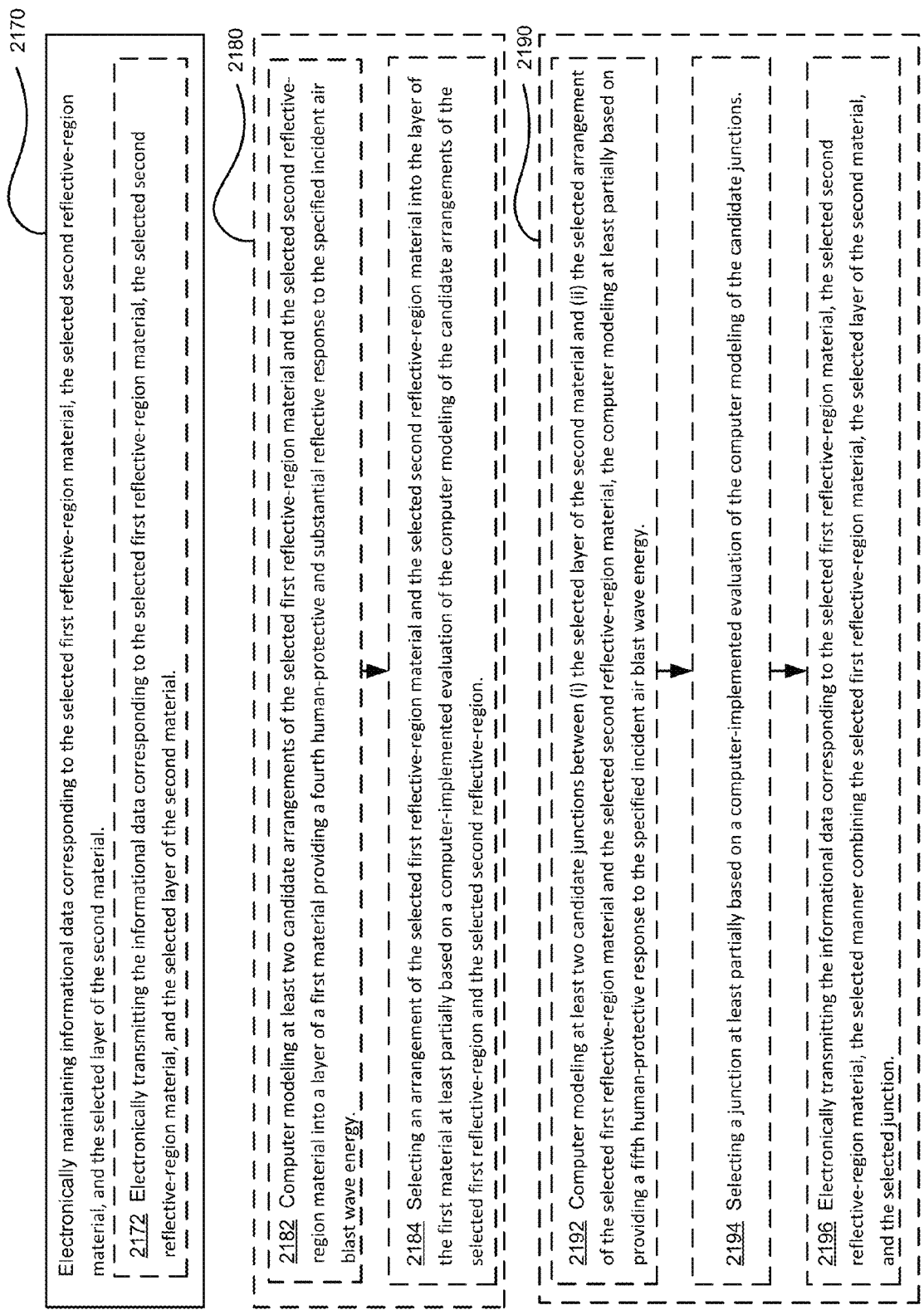
FIG. 46 illustrates alternative embodiments of the operational flow of FIG. 44.

FIG. 46 illustrates alternative embodiments of the operational flow 2100 of FIG. 44. The storage operation 2170 may include at least one alternative embodiment, such as the operation 2172. The operation 2172 includes electronically transmitting the informational data corresponding to the selected first reflective-region material, the selected second reflective-region material, and the selected layer of the second material. An alternative embodiment of the operational flow may include an operation 2180. The operation 2180 includes an operation 2182 and an operation 2184. The operation 2182 includes computer modeling at least two candidate arrangements of the selected first reflective-region material and the selected second reflective-region material into a layer of a first material providing a fourth human-protective and substantial reflective response to the specified incident air blast wave energy transmitted through the layer of the first material. The operation 2184 includes selecting an arrangement of the selected first reflective-region material and the selected second reflective-region material into the layer of the first material at least partially based on a computer-implemented evaluation of the computer modeling of the candidate arrangements of the selected first reflective-region and the selected second reflective-region. An alternative embodiment of the operational flow may include an operation 2190. The operation 2190 includes an operation 2192, an operation 2194, and an operation 2196. The operation 2192 includes computer modeling at least two candidate junctions between (i) the selected layer of the second material and (ii) the selected arrangement of the selected first reflective-region material and the selected second reflective-region material. The computer modeling is at least partially based on providing a fifth human-protective response to the specified incident air blast wave energy. For example, the computer modeling may include computer modeling that is at least partially based on providing a fifth advantageous human-protective response to the specified incident air blast wave energy. The operation 2194 includes selecting a junction at least partially based on a computer-implemented evaluation of the computer modeling of the candidate junctions. The operation 2196 includes electronically transmitting the informational data corresponding to the selected first reflective-region material, the selected second reflective-region material, the selected manner combining the selected first reflective-region material, the selected layer of the second material, and the selected junction.

Figure 47:
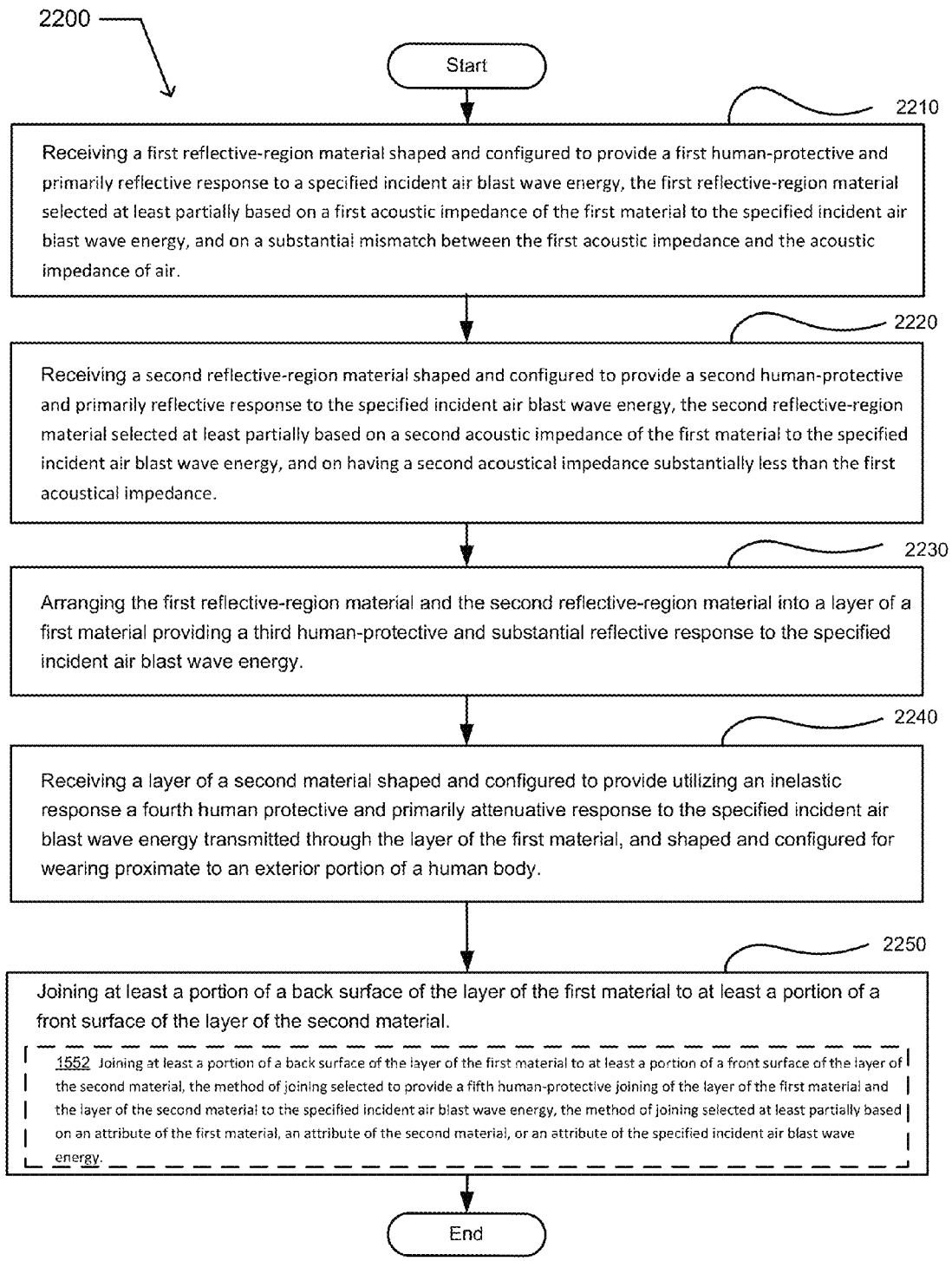
FIG. 47 illustrates an example operational flow.

FIG. 47 illustrates an example operational flow 2200 for manufacturing a wearable air blast wave energy protection device. After a start operation, the operational flow includes a first reflective material receiving operation 2210. The first reflective material receiving operation includes receiving a first reflective-region material shaped and configured to provide a first human-protective and primarily reflective response to a specified incident air blast wave energy. The first reflective-region material selected at least partially based on a first acoustic impedance of the first material to the specified incident air blast wave energy, and on a substantial mismatch between the first acoustic impedance and the acoustic impedance of air. For example, the receiving the first reflective-region material may include receiving the first reflective-region material 2010A described in conjunction with FIG. 42. The second reflective material receiving operation 2220 includes receiving a second reflective-region material shaped and configured to provide a second human-protective and primarily reflective response to the specified incident air blast wave energy. The second reflective-region material selected at least partially based on a second acoustic impedance of the first material to the specified incident air blast wave energy, and on having a second acoustic impedance substantially less than the first acoustic impedance. For example, the receiving the second reflective-region material may include receiving the second reflective-region material 2010B described in conjunction with FIG. 42. An arranging operation 2230 includes arranging the first reflective-region material and the second reflective-region material into a layer of a first material providing a third human-protective and substantial reflective response to the specified incident air blast wave energy. For example, the arranging may include arranging the first reflective material 2010A and the second reflective material 2010B into the layer of the first material described in conjunction with FIG. 42 or 43.

An attenuative material receiving operation 2240 includes receiving a layer of a second material shaped and configured to provide utilizing an inelastic response a fourth human protective and primarily attenuative response to the specified incident air blast wave energy transmitted through the layer of the first material. The layer of a second material is shaped and configured for wearing proximate to an exterior portion of a human body. For example, the attenuative material receiving operation may include receiving the layer of the second material 2020 described in conjunction with FIG. 42. A joining operation 2250 includes joining at least a portion of a back surface of the layer of the first material to at least a portion of a front surface of the layer of the second material. For example, the joining operation 2250 may include at least one additional embodiment, such as the operation 2252. The operation 2252 includes joining at least a portion of a back surface of the layer of the first material to at least a portion of a front surface of the layer of the second material. The joining is selected to provide a fifth human-protective joining of the layer of the first material and the layer of the second material to the specified incident air blast wave energy. The joining is selected at least partially based on an attribute of the first material, an attribute of the second material, or an attribute of the specified incident air blast wave energy.

Figure 48:
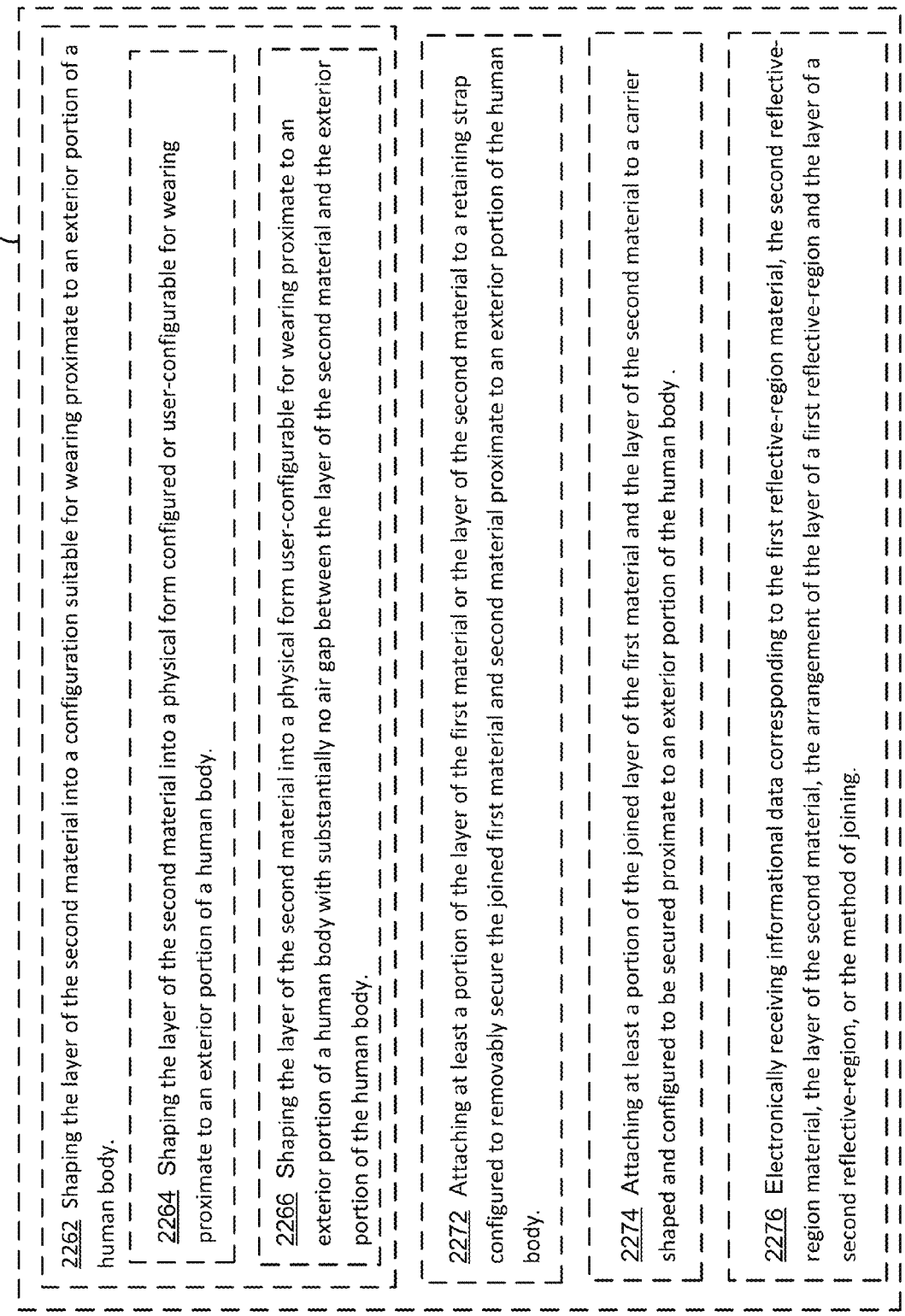
FIG. 48 illustrates an alternative embodiment of the operational flow of FIG. 47.

FIG. 48 illustrates an alternative embodiment of the operational flow 2200 of FIG. 47. The operational flow may include at least one alternative embodiment, illustrated as an operation 2260. The operation 2260 may include an operation 2262, an operation 2272, an operation 2274, or an operation 2276. The operation 2262 includes shaping the layer of the second material into a configuration suitable for wearing proximate to an exterior portion of a human body. The operation 2262 may include at least one alternative embodiment, such as an operation 2264 or an operation 2266. The operation 2264 includes shaping the layer of the second material into a physical form configured or user-configurable for wearing proximate to an exterior portion of a human body. The operation 2266 includes shaping the layer of the second material into a physical form user-configurable for wearing proximate to an exterior portion of a human body with substantially no air gap between the layer of the second material and the exterior portion of the human body.

The operation 2272 includes attaching at least a portion of the layer of the first material or the layer of the second material to a retaining strap configured to removably secure the layer of the second material proximate to an exterior portion of the human body. The operation 2274 includes attaching at least a portion of the joined layer of the first material and the layer of the second material to a carrier shaped and configured to be secured proximate to an exterior portion of the human body. The operation 2276 includes electronically receiving informational data corresponding to the first reflective-region material, the second reflective-region material, the layer of the second material, the arrangement of the layer of a first reflective-region and the layer of a second reflective-region, or the joining.

Figure 49:
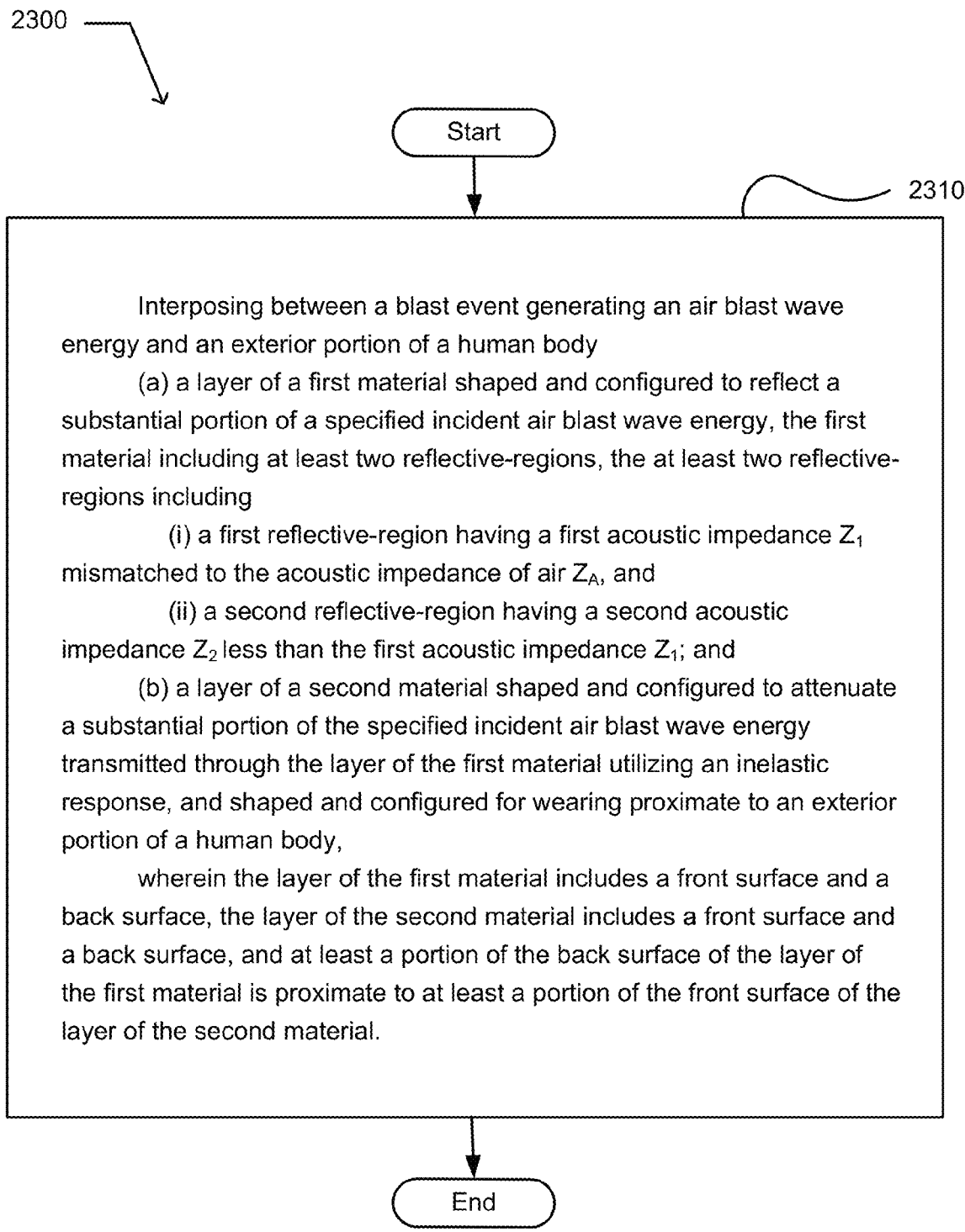
FIG. 49 illustrates an example operational flow.

FIG. 49 illustrates an example operational flow 2300. The operational flow includes a start operation. The operational flow includes an operation 2310. The operation 2310 includes interposing between a blast event generating an air blast wave energy and an exterior portion of a human body a layer of a first material shaped and configured to reflect a substantial portion of a specified incident air blast wave energy. The first material includes at least two reflective-regions. The at least two reflective-regions include a first reflective-region having a first acoustic impedance $Z_1$ mismatched to the acoustic impedance of air $Z_A$. The at least two reflective-regions include a second reflective-region having a second acoustic impedance $Z_2$ less than the first acoustic impedance $Z_1$. The first material includes a first reflective-region having a first acoustic impedance substantially mismatched to the acoustic impedance of air. The first material includes a second reflective-region having a second acoustic impedance substantially less than the first acoustic impedance.

The operation 2310 also includes interposing a layer of a second material shaped and configured to attenuate a substantial portion of the specified incident air blast wave energy transmitted through the layer of the first material utilizing an inelastic response. The layer of a second material is shaped and configured for wearing proximate to an exterior portion of a human body. The layer of the first material includes a front surface and a back surface, and the layer of the second material includes a front surface and a back surface. At least a portion of the back surface of the layer of the first material is proximate to at least a portion of the front surface of the layer of the second material. The operational flow includes an end operation. For example, the operational flow 2300 may be implemented by interposing the device 2001 described in conjunction with FIG. 42 between the incident air blast wave energy 197-I produced by the blast 193 and the exterior body part portion 106 of the human body 105.

Figure 50:
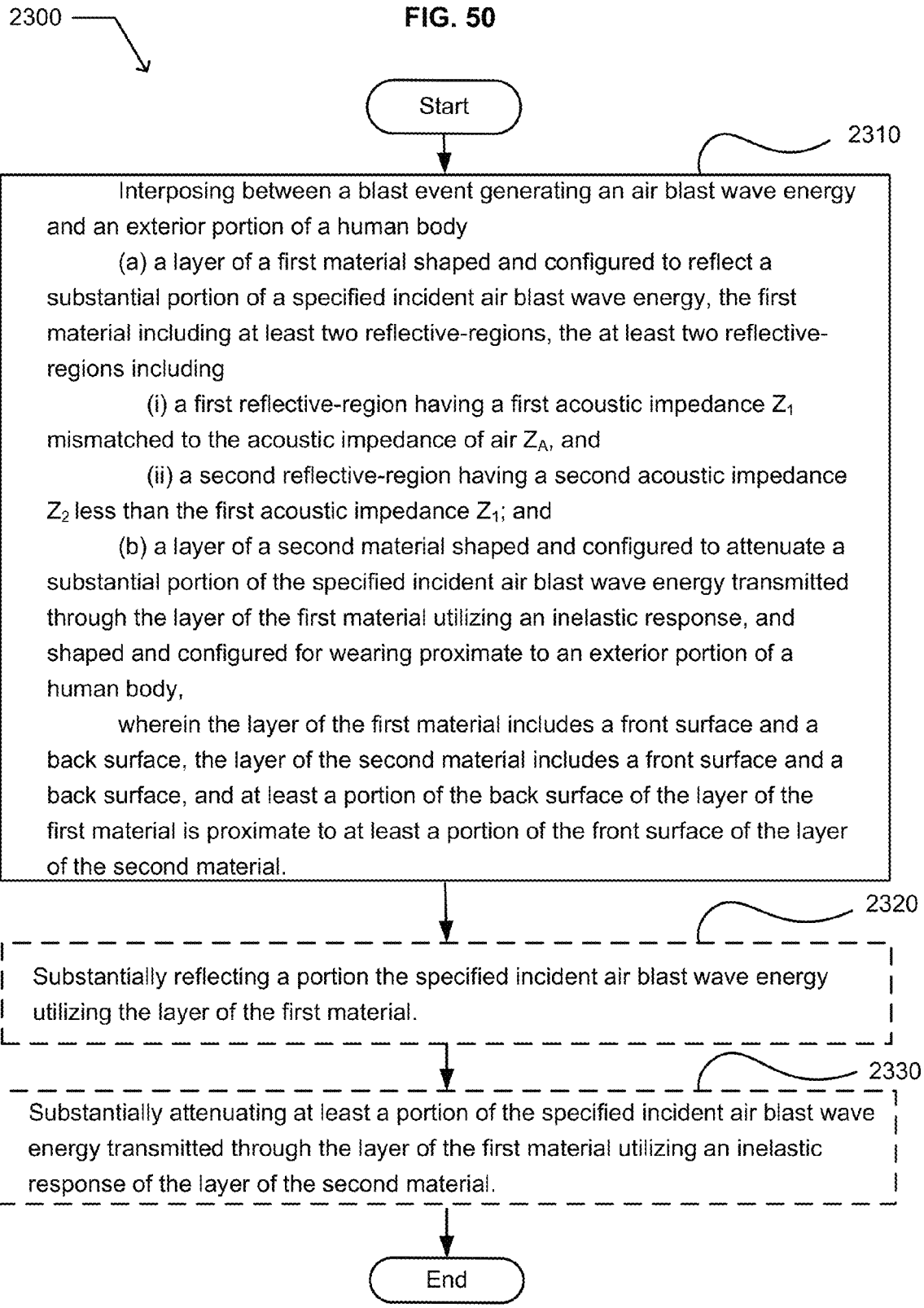
FIG. 50 illustrates alternative embodiments of the operational flow of FIG. 49.

FIG. 50 illustrates alternative embodiments of the operational flow 2300 of FIG. 49. The operational flow may include at least one alternative embodiment. The at least one alternative embodiment may include an operation 2320 or an operation 2330. The operation 2320 includes substantially reflecting a portion the specified incident air blast wave energy utilizing the layer of the first material. The operation 2330 includes substantially attenuating at least a portion of the specified incident air blast wave energy transmitted through the layer of the first material utilizing an inelastic response of the layer of the second material.

Figure 51:
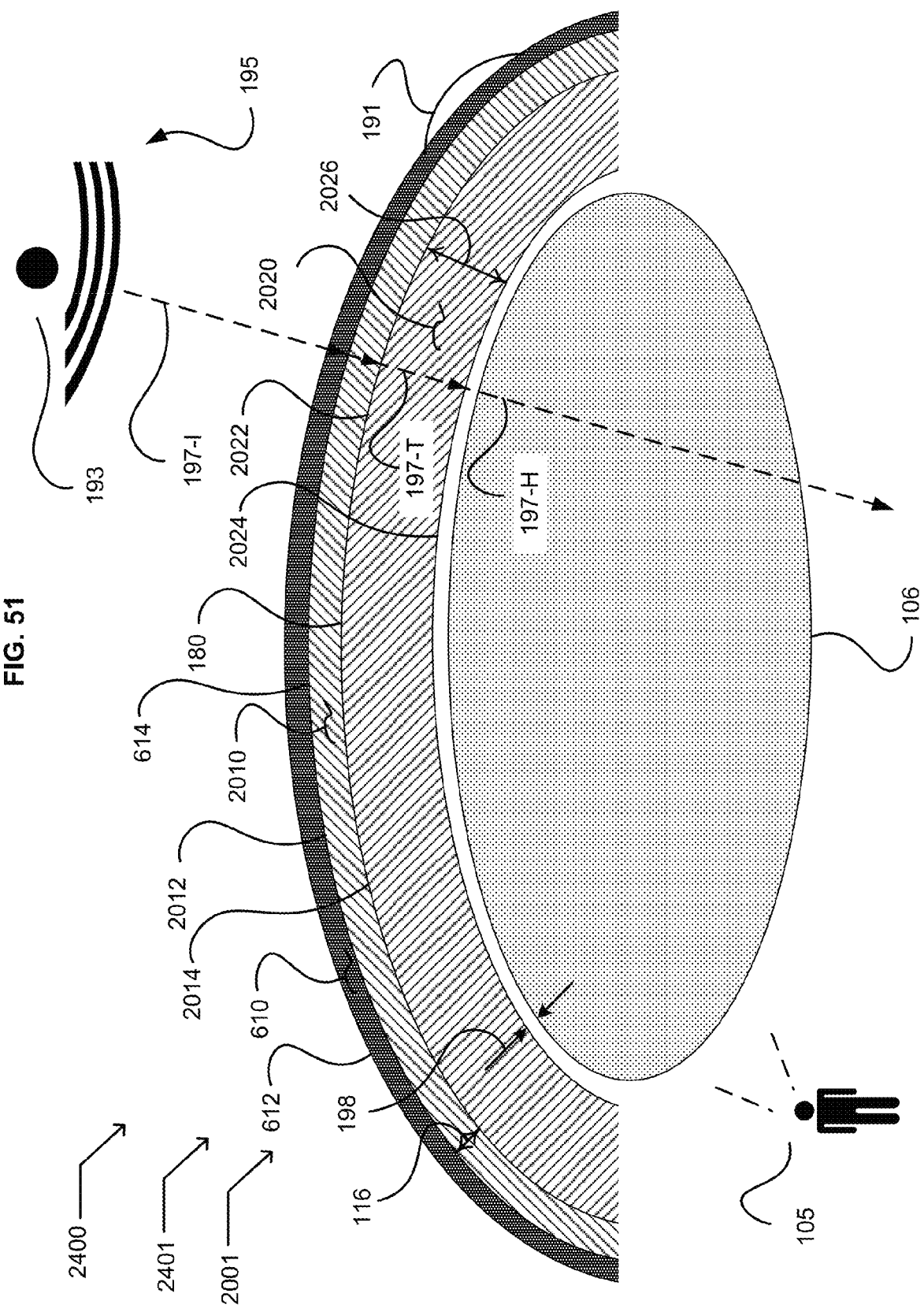
FIG. 51 illustrates an environment that includes example device.

FIG. 51 illustrates an environment 2400 that includes example device 2401. The device includes the layer of the ballistic material 610 described in conjunction with FIG. 21. The layer of ballistic material is shaped and configured to substantially attenuate energy of an object (not illustrated) impacting the external portion 106 of the human body 105. The device 2401 includes the device 2001 described in conjunction with FIG. 42 or 2001.1 described in conjunction with FIG. 43. The device 2401 includes the layer of the first material 2010 shaped and configured to reflect a substantial portion of a specified incident air blast wave energy 197-T. The first material includes at least two reflective-regions. The at least two reflective-regions include a first reflective-region 2010A (not illustrated by FIG. 51) having a first acoustic impedance $Z_1$ mismatched to the acoustic impedance of air $Z_A$. The at least two reflective-regions include a second reflective-region 2010B (not illustrated by FIG. 51) having a second acoustic impedance $Z_2$ less than the first acoustic impedance $Z_1$. The device includes the layer of the second material 2020 shaped and configured to attenuate a substantial portion of the specified incident air blast wave energy transmitted 197-T through the layer of the first material utilizing an inelastic response. The layer of the second material is shaped and configured for wearing proximate to the exterior portion 106 of the human body 105.

The layer of the ballistic material 610 includes the front surface 612 and the back surface 614. In an embodiment, the front surface may be considered an exterior surface of the ballistic material and the back surface may be considered an interior surface of the ballistic material. The layer of the first material 2010 includes the front surface 2012 and the back surface 2014. The layer of the second material 2020 includes the front surface 2022 and the back surface 2024. In an embodiment, at least a portion of the interior surface of the layer of the ballistic material is proximate to the front surface of the layer of the first material, and at least a portion of the back surface of the layer of the first material is proximate to at least a portion of the front surface of the layer of the second material. In an embodiment of the device, at least a portion of the back surface of the layer of the first material is proximate to the front surface of the layer of the ballistic material, and at least a portion of the back surface of the layer of the ballistic material is proximate to at least a portion of the front surface of the layer of the second material (not illustrated). In an embodiment of the device, at least a portion of the back surface of the layer of the first material is proximate to the front surface of the layer of a second material, and at least a portion of the back surface of the layer of the second material is proximate to at least a portion of the front surface of the layer of the ballistic material (not illustrated).

All references cited herein are hereby incorporated by reference in their entirety or to the extent their subject matter is not otherwise inconsistent herewith.

In some embodiments, "configured" includes at least one of designed, set up, shaped, implemented, constructed, or adapted for at least one of a particular purpose, application, or function.

It will be understood that, in general, terms used herein, and especially in the appended claims, are generally intended as "open" terms (e.g., the term "including" should be interpreted as "including but not limited to," the term "having" should be interpreted as "having at least," the term "includes" should be interpreted as "includes but is not limited to," etc.). It will be further understood that if a specific number of an introduced claim recitation is intended, such an intent will be explicitly recited in the claim, and in the absence of such recitation no such intent is present. For example, as an aid to understanding, the following appended claims may contain usage of introductory phrases such as "at least one" or "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a receiver" should typically be interpreted to mean "at least one receiver"); the same holds true for the use of definite articles used to introduce claim recitations. In addition, even if a specific number of an introduced claim recitation is explicitly recited, it will be recognized that such recitation should typically be interpreted to mean at least the recited number (e.g., the bare recitation of "at least two chambers," or "a plurality of chambers," without other modifiers, typically means at least two chambers).

In those instances where a phrase such as "at least one of A, B, and C," "at least one of A, B, or C," or "an [item] selected from the group consisting of A, B, and C," is used, in general such a construction is intended to be disjunctive (e.g., any of these phrases would include but not be limited to systems that have A alone, B alone, C alone, A and B together, A and C together, B and C together, or A, B, and C together, and may further include more than one of A, B, or C, such as $A_1$, $A_2$, and C together, A, $B_1$, $B_2$, $C_1$, and $C_2$ together, or $B_1$ and $B_2$ together). It will be further understood that virtually any disjunctive word or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The herein described aspects depict different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality. Any two components capable of being so associated can also be viewed as being "operably couplable" to each other to achieve the desired functionality. Specific examples of operably couplable include but are not limited to physically mateable or physically interacting components or wirelessly interactable or wirelessly interacting components.

With respect to the appended claims the recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Use of "Start," "End," "Stop," or the like blocks in the block diagrams is not intended to indicate a limitation on the beginning or end of any operations or functions in the diagram. Such flowcharts or diagrams may be incorporated into other flowcharts or diagrams where additional functions are performed before or after the functions shown in the diagrams of this application. Furthermore, terms like "responsive to," "related to," or other past-tense adjectives are generally not intended to exclude such variants, unless context dictates otherwise.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of manufacturing a wearable air blast wave energy protection device, the method comprising:
   (a) receiving a layer of a first material selected to provide a first reflective response to a specified incident air blast wave energy, the first material selected at least partially based on a first acoustic impedance of the first material to the specified incident air blast wave energy, and on a substantial mismatch between the first acoustic impedance and the acoustic impedance of air;
   (b) receiving a layer of a second material selected to provide a second attenuative response to the specified incident air blast wave energy transmitted through the first material, the second material selected at least partially based on an inelastic response of the second material to the specified incident air blast wave energy transmitted through the layer of the first material; and
   (c) joining at least a portion of the first material and at least a portion of the second material.

2. The method of claim 1, wherein the joining includes:
   joining at least a portion of the first material and at least a portion of the second material, the joining selected at least partially based on an attribute of the layer of the first material, an attribute of the layer of the second material, or an attribute of the specified incident air blast wave energy transmitted through the layer of the first material.

3. The method of claim 1, further comprising:
   shaping the layer of the second material into a configuration suitable for wearing proximate to an exterior portion of a human body.

4. The method of claim 1, further comprising:
   shaping the joined layer of the first material and the layer of the second material into a layered physical form configured or user-configurable for wearing proximate to an exterior portion of a human body.

5. The method of claim 1, further comprising:
   shaping the joined layer of the first material and the layer of the second material into a physical form configured or user-configurable for wearing proximate to an exterior portion of a human body with the second layer proximate to an exterior portion of a human body.

6. The method of claim 1, further comprising:
   coupling at least a portion of the layer of the first material or the layer of the second material to a retaining strap, the retaining strap configured to removably secure the joined layer of the first material and layer of the second material proximate to an exterior portion of a human body.

7. The method of claim 1, further comprising:
   attaching the joined layer of the first material and the layer of the second material to a carrier shaped and configured to be secured proximate to an exterior portion of a human body.

8. A method of manufacturing a wearable air blast wave energy protection device, the method comprising:
   (a) receiving a first reflective-region material shaped and configured to provide a first human-protective and primarily reflective response to a specified incident air blast wave energy, the first reflective-region material selected at least partially based on a first acoustic impedance of the first material to the specified incident air blast wave energy, and on a substantial mismatch between the first acoustic impedance and the acoustic impedance of air;
   (b) receiving a second reflective-region material shaped and configured to provide a second human-protective and primarily reflective response to the specified incident air blast wave energy, the second reflective-region material selected at least partially based on a second acoustic impedance of the first material to the specified incident air blast wave energy, and on having a second acoustic impedance substantially less than the first acoustic impedance;
   (c) arranging the first reflective-region material and the second reflective-region material into a layer of a first material providing a third human-protective and substantial reflective response to the specified incident air blast wave energy;
   (d) receiving a layer of a second material shaped and configured to provide utilizing an inelastic response a fourth human protective and primarily attenuative response to the specified incident air blast wave energy transmitted through the layer of the first material, and shaped and configured for wearing proximate to an exterior portion of a human body; and (e) joining at least a portion of a back surface of the layer of the first material to at least a portion of a front surface of the layer of the second material.

9. The method of claim 8, wherein the joining includes:

joining at least a portion of a back surface of the layer of the first material to at least a portion of a front surface of the layer of the second material, the joining selected to provide a fifth human-protective joining of the layer of the first material and the layer of the second material to the specified incident air blast wave energy, the joining selected at least partially based on an attribute of the first material, an attribute of the second material, or an attribute of the specified incident air blast wave energy.

* * * * *